(12) United States Patent
Vora et al.

(10) Patent No.: US 10,259,907 B2
(45) Date of Patent: Apr. 16, 2019

(54) BLOCK COPOLYMERS WITH SURFACE-ACTIVE JUNCTION GROUPS, COMPOSITIONS AND PROCESSES THEREOF

(71) Applicants: International Business Machines Corporation, Armonk, NY (US); AZ Electronic Materials (Luxembourg) S.a.r.L., Luxembourg (LU)

(72) Inventors: Ankit Vora, San Jose, CA (US); Eri Hirahara, Westfield, NJ (US); Joy Cheng, San Jose, CA (US); Durairaj Baskaran, Bridgewater, NJ (US); Orest Polishchuk, Bayonne, NJ (US); Melia Tjio, San Jose, CA (US); Margareta Paunescu, Clinton, NJ (US); Daniel Sanders, San Jose, CA (US); Guanyang Lin, Whitehouse Station, NJ (US)

(73) Assignees: AZ Electronic Materials (Luxembourg) S.à r.l., Luxembourg (LU); IBM Corporation, Armonk, NY (US)

( * ) Notice: Subject to any disclaimer, the term of this patent is extended or adjusted under 35 U.S.C. 154(b) by 555 days.

(21) Appl. No.: 14/628,002

(22) Filed: Feb. 20, 2015

(65) Prior Publication Data
US 2016/0244557 A1 Aug. 25, 2016

(51) Int. Cl.
| | |
|---|---|
| C08G 63/08 | (2006.01) |
| C08G 64/02 | (2006.01) |
| C08G 63/64 | (2006.01) |
| C08J 7/04 | (2006.01) |
| C09D 167/04 | (2006.01) |

(Continued)

(52) U.S. Cl.
CPC ...... *C08G 64/0208* (2013.01); *C08F 293/005* (2013.01); *C08G 63/08* (2013.01); *C08G 63/64* (2013.01); *C08J 7/047* (2013.01); *C09D 167/04* (2013.01); *C09D 169/00* (2013.01); *C09D 169/005* (2013.01); *G03F 7/0002* (2013.01); *B82Y 30/00* (2013.01); *C08F 2438/01* (2013.01); *C08J 2367/00* (2013.01); *C08J 2367/04* (2013.01); *C08J 2369/00* (2013.01)

(58) Field of Classification Search
CPC ........ C08G 63/08; C08G 63/66; C08G 63/64; C08G 63/664; C08G 63/682; C08G 64/0208; C09D 169/005; C09D 167/04; G03F 7/0002
See application file for complete search history.

(56) References Cited

U.S. PATENT DOCUMENTS

| | | |
|---|---|---|
| 5,380,779 A | 1/1995 | D'Haese |
| 5,780,098 A | 7/1998 | Battles |

(Continued)

FOREIGN PATENT DOCUMENTS

| | | |
|---|---|---|
| WO | 00/42084 A1 | 7/2000 |
| WO | 2016-132247 A1 | 8/2016 |

OTHER PUBLICATIONS

Notification of Transmittal of the International Search Report and the Written Opinion of the International Searching Authority, or the Declaration (Form PCT/ISA/220), the International Search Report (Form PCT/ISA/210), and the Written Opinion of the International Searching Authority (Form PCT/ISA/237) for PCT/EP2016/053415 dated May 18, 2016, which corresponds to U.S. Appl. No. 14/628,002. Chuan Jie Cheng et al., "Facile synthesis of gemini surface-active ATRP initiator and its use in soap-free AGET ATP mini-emulsion polymerization", Chemical Papers vol. 67 No. 3, pp. 336-pp. 341 (2013).
Jinbing Shu et al., ""One pot" synthesis of fluorinated block copolymers using a surface-active ATRP initiator under emulsion polymerization conditions", Polymeri Bulletin vol. 67, pp. 1185-pp. 1200 (2011).

(Continued)

*Primary Examiner* — Peter D. Mulcahy
(74) *Attorney, Agent, or Firm* — Mitchell Brustein

(57) ABSTRACT

The present invention relates to a novel block copolymer of structure 1,

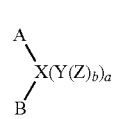

(1)

wherein, A- is a block polymer chain, B is a block polymer chain,
wherein, A- and B- are chemically different, covalently connected polymer chains, which are phase separable and the moiety $X(Y(Z)_b)_a$ is a junction group, which comprises a surface active pendant moiety $Y(Z)_b$ wherein:
a is an integer from 1 to 4 denoting the number of surface active pendant moieties $Y(Z)_b$ on X,
b is an integer from 1 to 5 denoting the number of Z moieties on the linking moiety Y,
X is a linking group between the A polymer block, the B polymer block and the moiety Y,
Y is a linking group or a direct valence bond between X and Z; and
Z is a moiety independently selected from, a fluorine containing moiety, a $Si_1$-$Si_8$ siloxane containing moiety or a hydrocarbon moiety with at least 18 carbons, and further wherein the junction group $X(Y(Z)_b)_a$ has a surface energy less than that that of the block A and less than that of the block B. The invention also relates to a composition comprising the novel copolymer and its use in direct self-assembly processes.

12 Claims, 12 Drawing Sheets

(51) Int. Cl.
*C09D 169/00* (2006.01)
*C08F 293/00* (2006.01)
*G03F 7/00* (2006.01)
*B82Y 30/00* (2011.01)

(56) References Cited

U.S. PATENT DOCUMENTS

| | | | |
|---|---|---|---|
| 7,521,090 | B1 | 4/2009 | Cheng et al. |
| 8,133,534 | B2 | 3/2012 | Stoykovich et al. |
| 8,491,965 | B2 | 7/2013 | Cheng et al. |
| 8,513,359 | B2 | 8/2013 | Millward |
| 8,623,458 | B2 | 1/2014 | Cheng et al. |
| 8,641,914 | B2 | 2/2014 | Regner |
| 8,642,086 | B2 | 2/2014 | Coady et al. |
| 2009/0092803 | A1 | 4/2009 | Bita et al. |
| 2009/0308837 | A1 | 12/2009 | Albrecht et al. |
| 2012/0202017 | A1 | 8/2012 | Nealey et al. |
| 2012/0238652 | A1* | 9/2012 | Uehara ............ C08J 3/005 521/62 |
| 2013/0140272 | A1 | 6/2013 | Koole et al. |
| 2013/0266780 | A1 | 10/2013 | Ellison et al. |
| 2013/0306594 | A1 | 11/2013 | Hustad et al. |
| 2013/0344242 | A1 | 12/2013 | Willson et al. |
| 2014/0061155 | A1 | 3/2014 | Gu et al. |
| 2014/0116980 | A1 | 5/2014 | Wuister |
| 2014/0346141 | A1 | 11/2014 | Brizard et al. |
| 2014/0363572 | A1* | 12/2014 | Moll ............... B01D 67/0006 427/244 |
| 2014/0377465 | A1 | 12/2014 | Trefonas et al. |
| 2014/0377518 | A1 | 12/2014 | Trefonas et al. |
| 2014/0378592 | A1 | 12/2014 | Trefonas et al. |

OTHER PUBLICATIONS

Yue Sun et al., "Synthensis and characterization of a new fluorinated macroinitiator and its diblock copolymer by AGET ATRP", Journal of Fluorine Chemistry vol. 132, pp. 9-pp. 14 (2011).
Christopher M. Bates et al., "Polarity-Switching Top Coats Enable Orientation of Sub-10-nm Block Copolymer Domains", Science vol. 338, pp. 775-pp. 779 (2012).
Joan K. Bosworth et al., "Control of Self-Assembly of Lithographically Patternable Block Copolymer Films", ACSNANO vol. 2 No. 7, pp. 1396-pp. 1402 (2008).
Chong Cheng et al., "Well-Defined Diblock Macromonomer with a Norborneno Group at Block Junction: Anionic Living Link Synthesis and Ring-Opening Metathesis Polymerization", Macromolecules vol. 43, pp. 3153-pp. 3155 (2010).
Yanfeng Chu et al., "Synthesis and Characterization of Biodegradeable Amphiphilic ABC Y-Shaped Miktoarm Terpolymer by Click Chemistry for Drug Delivery", J. of Polymer Science Part A: Polymer Cheminstry vol. 52, pp. 3346-pp. 3355 (2014).
Nathan D. Contreila et al., "Synthesis of Polysterene-block-Poly(methyl methacrylate) with Fluorene at the Junction: Sequential Anionic and Controlled Radical Polymerization from a Single Carbon", Macromol. Chem. Phys. vol. 210, pp. 2167-pp. 2173 (2009).

Julia D. Cushen et al., "Thin Film Self-Assembly of Poly(trimethylsilylstyrene-b-D,L-lactide) with Sub-10 nm Domains", Macromolecules vol. 45, pp. 8722-pp. 8728 (2012).
Steven M. George, "Atomic Layer Deposition: An Overview", Chem. Rev. vol. 110, pp. 111-pp. 131 (2010).
Raita Gosoki et al., "Precise synthesis of poly(methacrylate)-based miktoarm star polymers by a new stepwise iterative methodology using a formyl-functionalized 1,1-diphenylethylene derivative", Polymer vol. 54, pp. 2049-pp. 2057 (2013).
Tomoya Higashihara et al., "Synthesis of Well-Defined Star-Branched Polymers by Using Chain-End-Functionalized Polystyrenes with a Definite Number of 1,3-Butadienyl Groups and Its Derivatized Functions", Macromolecules vol. 36, pp. 6730-pp. 6738 (2003).
Akira Hirao et al., "Synthesis of Novel Well-Defined Chain-End- and In-Chain-Functionalized Polystyrenes with One, Two, Three, and Four Perfluorooctyl Groups and Their Surface Characterization", Macromolecules vol. 35, pp. 7642-pp. 7651 (2002).
Shengxiang Ji et al., "Generalization of the Use of Random Copolymers to Control the Wetting Behavior of Block Copolymer Films", Macromolecules vol. 41, pp. 9098-pp. 9103 (2008).
Werner Kern et al., "Deposition Technologies and Applications: Introduction and Overview", Handbook of Thin-Film Deposition Processes and Techniques, Principles, Methods, Equipment and Applications, Second Edition, Edited by Krishna Seshan, Chapter 1, pp. 11-pp. 43 (2002).
Zhiqun Lin et al., "A Rapid Route to Arrays of Nanostructures in Thin Films", Adv. Mater. vol. 14 No. 19, pp. 1373-pp. 1376 (2002).
Bo Ni et al., ""Clicking" fluorinated polyhedral oligomeric silsesquioxane onto polymers: a modular approach toward shape amphiphiles with fluorous molecular clusters", Polym. Chem vol. 5, pp. 3588-pp. 3697 (2014).
Siti Aisyah B. Shamsudin et al., "Influence of Temperature and Type of Solvents on the Microdomain Orientation of PS-b-P2VP Ultrathin Films by Solvent Annealing", Macromol. Symp. vol. 327, pp. 72-pp. 79 (2013).
Stella Sioula et al., "Synthesis of Model 3-Miktoarm Star Terpolymers of Styrene, Isoprene, and Methyl Methacrylate", Macromolecules vol. 30, pp. 1518-pp. 1520 (1997).
Adam P. Smith et al., Synthesis of Bipyridine-Centered Diblock Copolymers, Macromolecules vol. 36, pp. 2654-2660 (2003).
Jeong Gon Son et al., "High-Aspect-Ratio Perpendicular Orientation of PS-b-PDMS Think Fillms under Solvent Annealing", ACS Macro Lett. vol. 1, pp. 1279-pp. 1284 (2012).
Kenji Sugiyama et al., "Precise Synthesis and Surface Characterization of Well-Defined Chain-End-Functionalized Polystyrenes with Two, Four, Eight, Sixteeh and Thirty-Two Perfluorooctyl Groups", Macromol. Symp. vol. 217, pp. 1-pp. 15 (2004).
Xiaofeng Wang et al., "Fabrication of Fullerene-Containing Hybrid Vesicles via Supramolecular Self-Assembly of a Well-Defined Amphiphilic Block Copolymer Incorporated with a Single $C_{60}$ Moiety at the Diblock Junction Point", Macromol. Rapid Commun. vol. 29, pp. 340-pp. 346 (2008).
Lian Zhang et al., "Synthesis, Characterization and Self-Assembly of Novel Amphiphilic Block Copolymers with a Polyhedral Oligomeric Silsesquioxanes Moiety Attached at the Junction of the Two Blocks", Macromol. Rapid Commun. vol. 30, pp. 1015-pp. 1020 (2009).

* cited by examiner

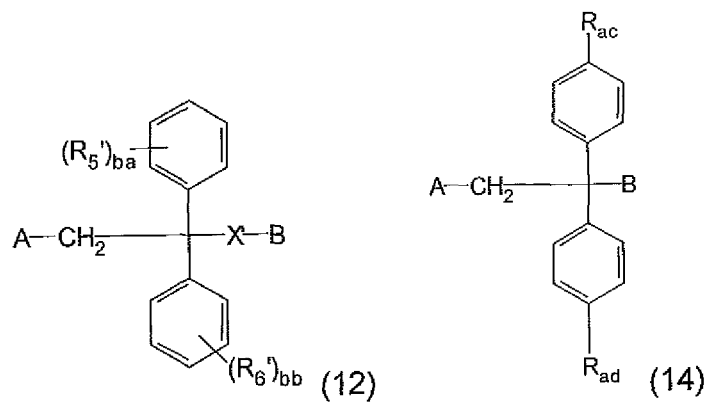
Figure 2
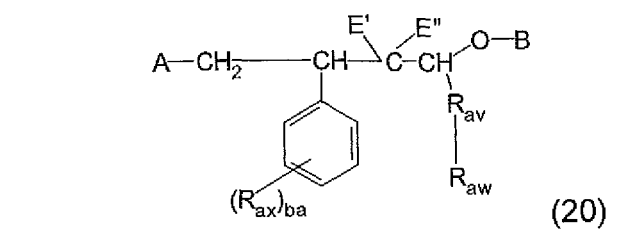
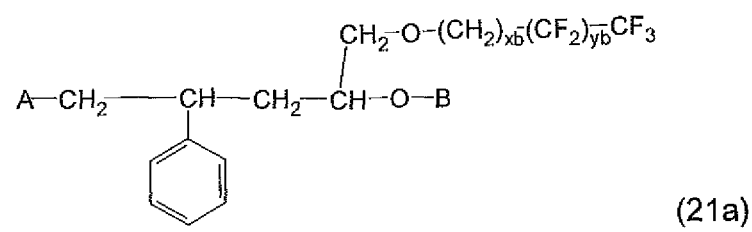
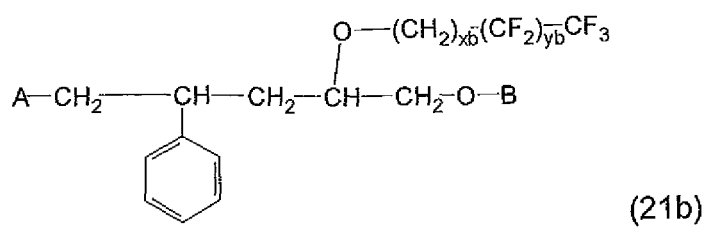
Figure 3

(a)
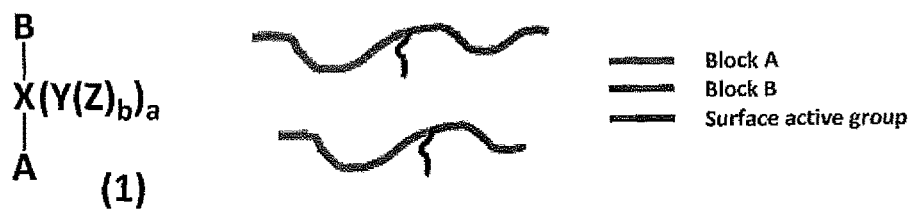
(b)
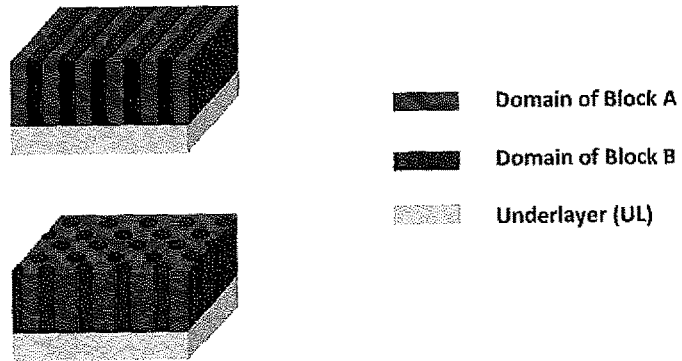
Figure 4

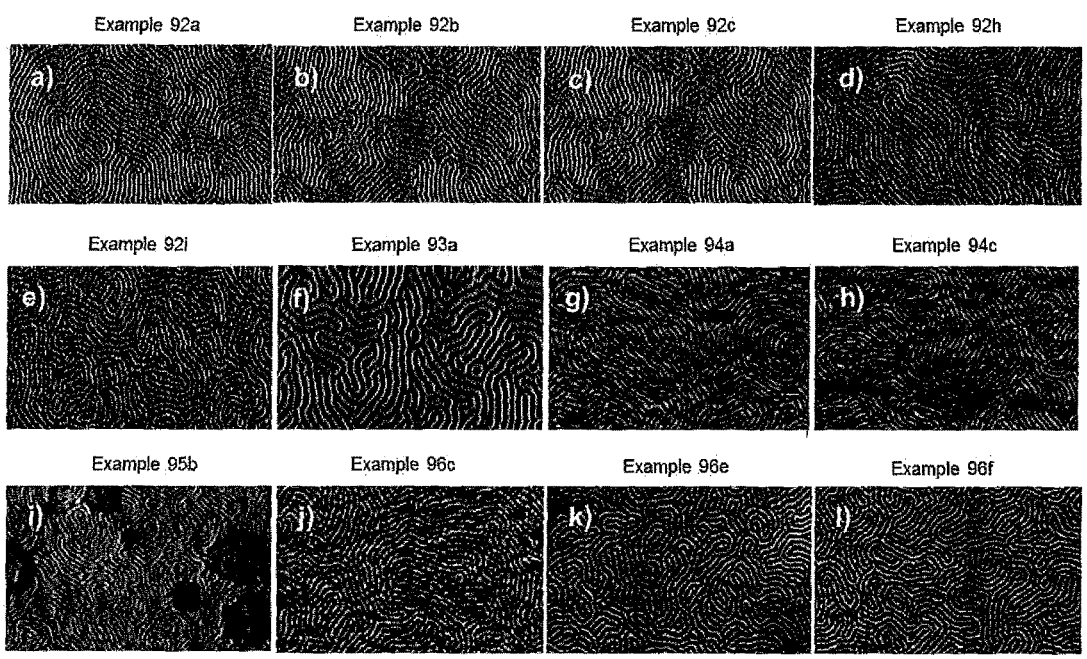
Figure 7 - Examples 92a-96f

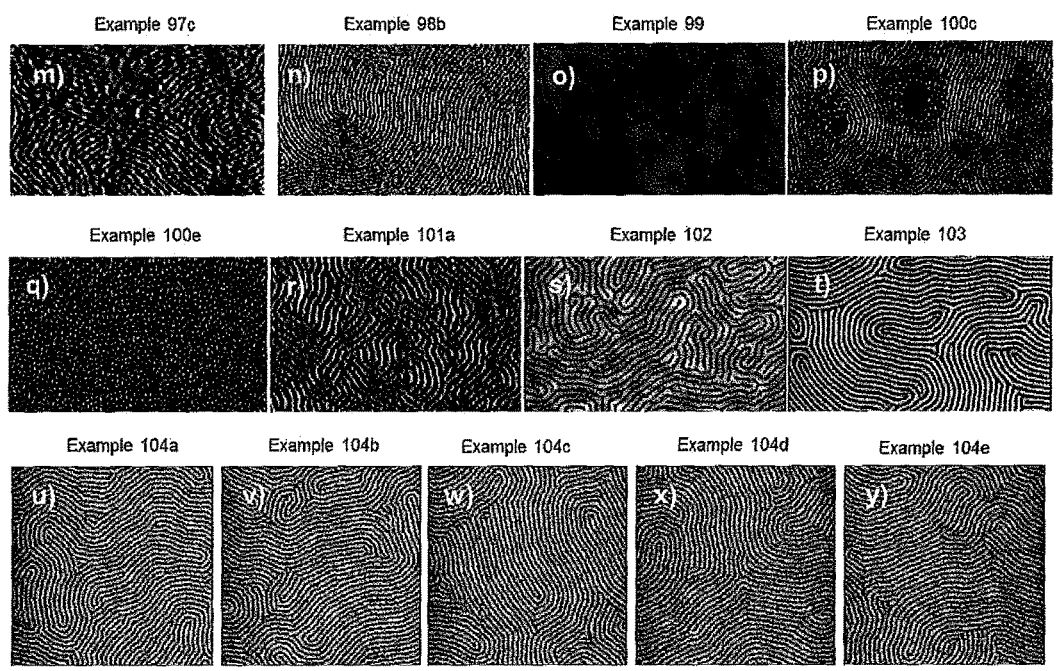
Figure 7 - Examples 97c-104e

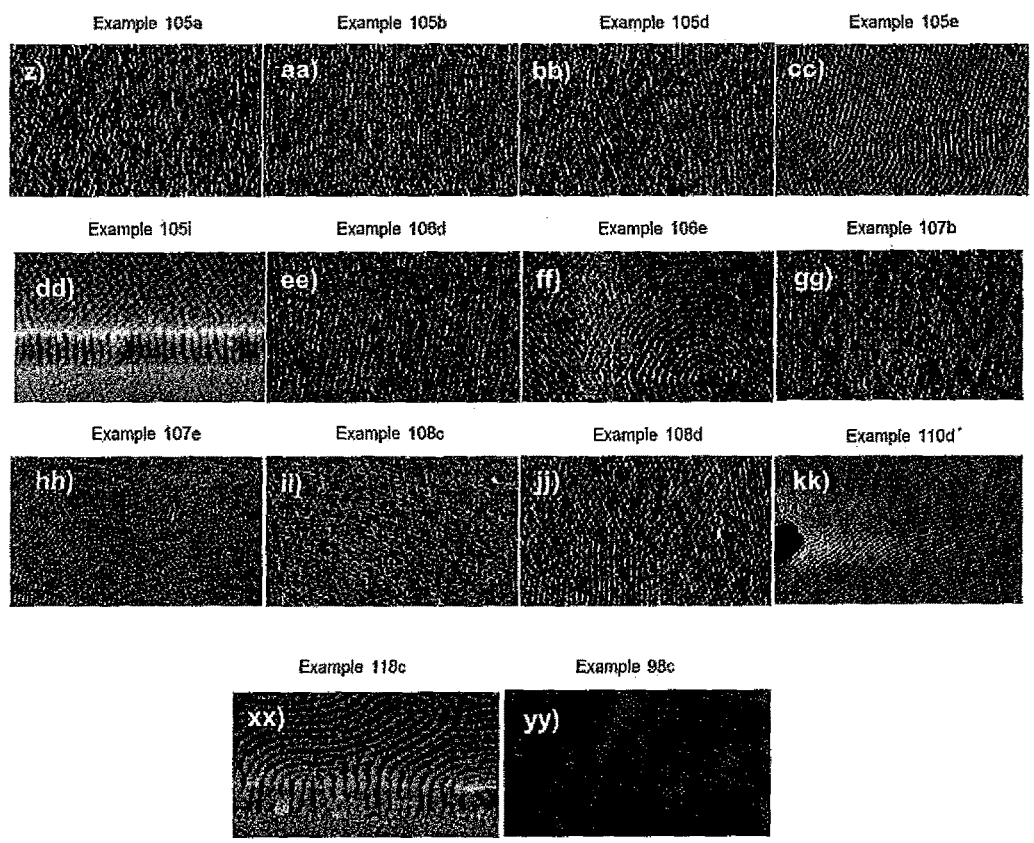
Figure 7 - Examples 105a-98c

BLOCK COPOLYMERS WITH SURFACE-ACTIVE JUNCTION GROUPS, COMPOSITIONS AND PROCESSES THEREOF

The invention relates to a novel block copolymer comprising a junction group between two blocks to which is attached at least one pendant group having a low surface energy, novel compositions comprising the novel block copolymer and processes using the novel composition for producing perpendicular domains (e.g. lamellae, cylinders etc.) formed by self-assembly (SA) or directed self-assembly (DSA) of the novel block copolymers (BCPs). The processes are useful for fabrication of electronic devices.

In conventional lithography approaches, ultraviolet (UV) radiation may be used to expose through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist such that the exposed regions are removed with a developer solution or by conventional IC plasma processing. Conversely, in negative photoresists, UV radiation transmitted through a mask causes the regions exposed to radiation to become less removable with a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. Directed self-assembly is a promising approach which has been of interest in overcoming some of the drawback of conventional lithography as outlined above.

Specifically, directed self-assembly of block copolymers is a method useful for generating very small patterned features for the manufacture of microelectronic devices in which the critical dimensions (CD) of features usually on the order of nano scale ranging in feature size from 10 nm to 50 nm can be achieved. Achieving feature sizes below 10 nm using conventional approaches for directed self-assembly of block copolymers is challenging. Directed self-assembly methods such as those based on graphoepitaxy and chemical epitaxy of block copolymers are desirable for extending the resolution capabilities of lithographic technology.

These techniques can be employed to either enhance conventional lithographic techniques by enabling the generation of pattern with higher resolution and/or improving CD control for EUV, e-beam, deep UV or immersion lithography. The directed self-assembly block copolymer comprises a block of etch resistant polymeric unit and a block of highly etchable polymeric unit, which when coated, aligned and etched on a substrate give regions of high resolution patterns.

Known examples of block copolymers suitable for directed self-assembly are ones capable of microphase separation and comprising a block rich in carbon (such as styrene or containing some other element like Si, Ge, and Ti) which is resistant to plasma etch, and a block which is highly plasma etchable or removable, which can provide a high resolution pattern definition. Examples of highly etchable blocks can comprise monomers which are rich in oxygen and which do not contain refractory elements, and are capable of forming blocks which are highly etchable, such as methyl methacrylate. The plasma etch gases used in the etching process of defining the self-assembly pattern typically are those used in processes to make integrated circuits (IC). In this manner very fine patterns can be created on typical IC substrates compared to conventional lithographic techniques, thus achieving pattern multiplication.

In the graphoepitaxy directed self-assembly method, the block copolymers self-organizes on a substrate that is pre-patterned with conventional lithography (Ultraviolet, Deep UV, and e-beam, Extreme UV (EUV) exposure source) to form topographical features such as a line/space (L/S) or contact hole (CH) pattern. In an example of L/S directed self-assembly array, the block copolymer can form self-aligned lamellar regions with a sub-lithographic pitch in the trenches between sidewalls of pre-pattern, thus enhancing pattern resolution by subdividing the space in the trench between the topographical lines into finer patterns. Similarly, features such as contact holes can be made denser by using graphoepitaxy in which a suitable block copolymer arranges itself by directed self-assembly within an array of pre-patterned holes or pre-patterned posts defined by conventional lithography, thus forming a denser array of regions of etchable and etch resistant domains which when etched give rise to a denser array of contact holes. In addition, block copolymers can form a single and smaller etchable domain at the center of prepattern hole with proper dimension and provide potential shrink and rectification of the hole in prepattern. Consequently, graphoepitaxy has the potential to offer both pattern rectification and pattern multiplication.

In chemical epitaxy DSA methods, the self-assembly of the block copolymer occurs on a surface that has regions of differing chemical affinity but no or very slight topography to guide the self-assembly process. For example, the chemical prepattern could be fabricated using lithography (UV, Deep UV, e-beam, EUV) and nanofabrication process to create surfaces of different chemical affinity in a line and space (L/S) pattern. These areas may present little to no topographical difference, but do present a surface chemical pattern to direct self-assembly of block copolymer domains. This technique allows precise placement of these block copolymer domains of higher spatial frequency than the spatial frequency of the prepattern. The aligned block copolymer domains can be subsequently pattern transferred into an underlying substrate after plasma or wet etch processing. In addition, Chemical epitaxy has the advantage that the block copolymer self-assembly can rectify variations in the surface chemistry, dimensions, and roughness of the underlying chemical pattern to yield improved line-edge roughness and CD control in the final self-assembled block copolymer domain pattern. Other types of patterns such as contact holes (CH) arrays could also be generated or rectified using chemoepitaxy.

The ability of a BCP to phase separate depends on the Flory Huggins interaction parameter ($\chi$). PS-b-PMMA (poly (styrene-block-methyl methacrylate) is the most promising candidate for directed self-assembly (DSA) applications. However, the minimum half-pitch of PS-b-PMMA is limited to about 10 nm because of lower interaction parameter ($\chi$) between PS and PMMA. To enable further feature miniaturization, a block copolymer with a larger interaction parameter between two blocks (higher chi) is highly desirable.

For lithography applications, orientation of the block copolymer domains perpendicular to the substrate is desirable. For a conventional block copolymer such as PS-b-PMMA in which both blocks have similar surface energies at the BCP-air interface, this can be achieved by coating and thermally annealing the block copolymer on a layer of non-preferential or neutral material that is grafted or cross-linked at the polymer-substrate interface. Due to larger difference in the interaction parameter between the domains of higher-χ block copolymers, it is important to control both BCP-air and BCP-substrate interactions. Many orientation control strategies for generating perpendicularly oriented BCP domains have been implemented with higher-χ BCPs. For example, solvent vapor annealing has been used for orientation control of polystyrene-b-polyethylene oxide (PS-b-PEO), polystyrene-b-polydimethylsiloxane (PS-b-PDMS), polystyrene-b-poly(2-vinyl pyridine) (PS-b-P2VP), polylactide-b-poly(trimethylsilylstyrene) PLA-b-PTMSS and PαMS-b-PHOST. Introducing a solvent vapor chamber and kinetics of solvent vapor annealing may complicate DSA processing. Alternatively, the combination of neutral underlayers and topcoat materials has been applied to PS-b-P2VP, PS-b-PTMSS and PLA-b-PTMSS to achieve perpendicular orientation of the polymer domains. However, the additional topcoat materials may increase the process cost and complexity. Thus, there exists a need to have a topcoat free higher-χ BCP system using simple thermal annealing on a range of preferential and non-preferential substrates.

The present invention relates to novel block copolymers with one or more low-surface energy groups at the junction of the two blocks. The invention further relates to a composition comprising the novel block copolymer, and also relates to novel processes comprising coating the film comprising the novel block copolymer, where the process allows for the perpendicular orientation of BCP domains in thin films (5-100 nm) by simple thermal annealing over proper underlayer.

Structures of block copolymers with a surface active junction group having structures (6)-(11) and wherein the junction group is comprised of an oxyalkylenecarbonylalkylene moiety.

FIG. 2

Structures of block copolymers with surface active junction group having structure (12) and (14) derived from a 1,1-diphenylethylene (DPE) derivative.

FIG. 3

Structures of block copolymer with surface active junction group having structures (20), (21a) (21b) wherein the junction group is derived from an aryl substituted alkyleneoxy moiety.

FIG. 4 a) Schematic depiction of block copolymer of structure (1) and b) schematic depiction of self-assembly of polymer domains.

FIG. 5

Schematic depiction of directed self-assembly (DSA) of the novel block copolymer of structure (1) a) shows graphoepitaxy DSA where most of the novel block copolymer is confined within the recessed region in the topographical prepattern, b) shows coating of this novel block copolymer over and within shallow, periodic topographical prepattern where the domains of this block copolymer are aligned to the topographical prepattern c) shows chemoepitaxial DSA where a film of this novel block copolymer is coated over the chemical prepattern comprised of preferential and non-preferential regions.

FIG. 6

FIGS. 6a-6m are atomic force microscopy (AFM) and scanning electron micrograph (SEM) images at different magnifications of the self-assembled block copolymer film formed with Examples C7-C35 (comparative examples).

FIG. 7

FIGS. 7a-7yy are AFM and SEM images at different magnifications of the self-assembled block copolymer film formed with Examples 97-118. Each image is labelled with the corresponding Example number.

FIG. 8

Graphical representation for relationship of pitch v/s blends of Example 21 and 23.

FIG. 9

Figure 1:
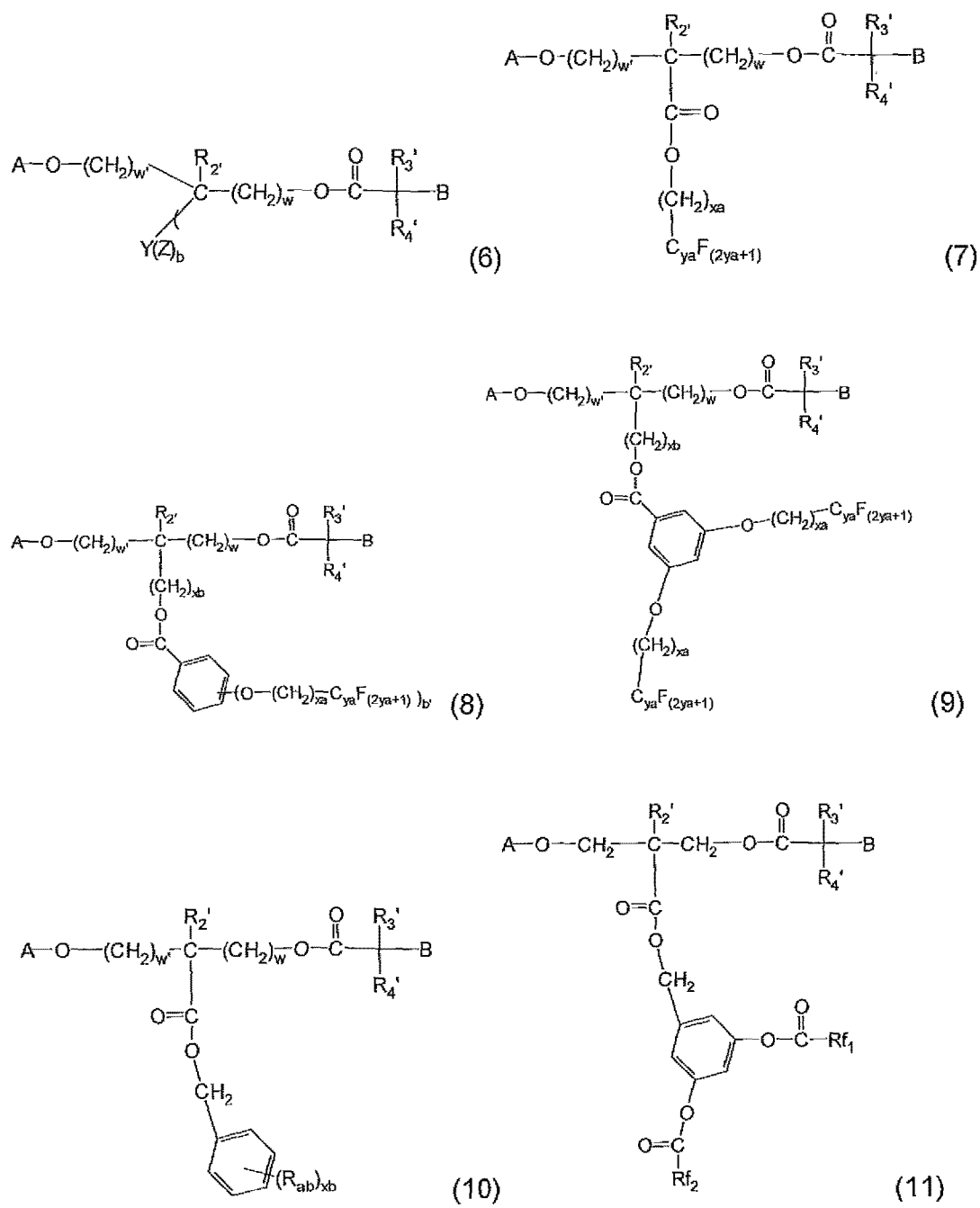
FIG. 1
Figure 9:
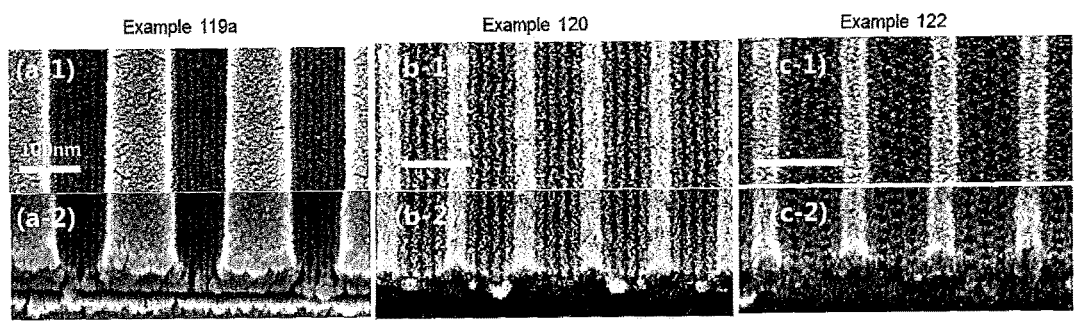

Graphoepitaxy directed self-assembly (DSA) figures of Example 119a (FIG. 9a1, 9a2); Example 120 (FIGS. 9b-1, 9b-2), and Example 122 (FIGS. 9c-1, 9c-2).

FIG. 10

Figure 10:
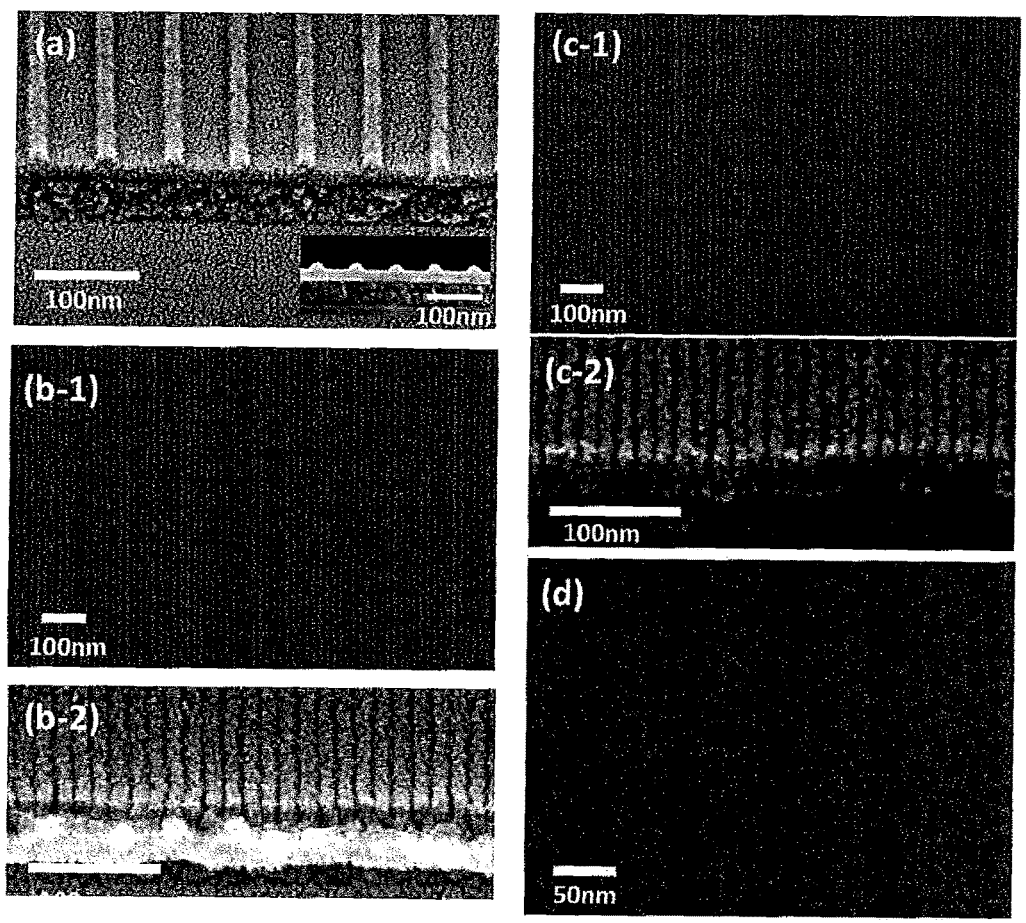

Prepattern SEM and overcoating DSA figures of AZ® Electronic Materials AZEMBLY™ NLD-089)/SiARC A940 Prepattern (FIG. 10a) Example 123 (FIGS. 10b-1 and 10b-2), Example 124 (FIGS. 10c-1, and 10c-2), and Example 125 (FIG. 10d).

FIG. 11

Figure 11:
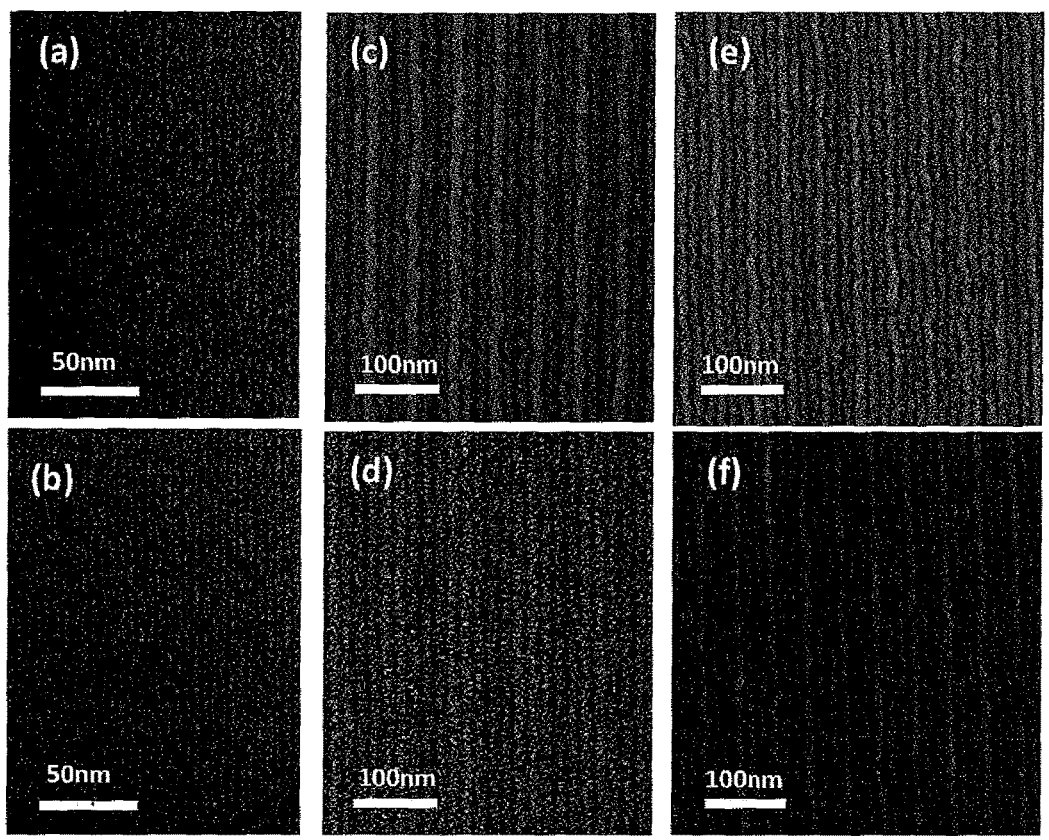

Chemoepitaxy directed self-assembly (USA) figures of Example 126a (FIG. 11a), Example 126b (FIG. 11b), Example 127a (FIG. 11c), Example 127d (FIG. 11d), Example 128 (FIG. 11e) and Example 129 (FIG. 11f).

SUMMARY OF INVENTION

The invention relates to a novel block copolymer with a junction group having structure (1),

(1)

wherein,

A- is a block polymer chain,

B is a block polymer chain, wherein, A- and B- are chemically different, covalently connected polymer chains, which are phase separable, the moiety $X(Y(Z)_b)_a$ is a junction group, which comprises a surface active pendant moiety $Y(Z)_b$ wherein;

a is an integer from 1 to 4 denoting the number of surface active pendant moieties $Y(Z)_b$ on X, b is an integer from 1 to 5 denoting the number of Z moieties on the linking moiety Y, X is a linking group between the A polymer block, the B polymer block and the moiety Y, Y is a linking group or a direct valence bond between X and Z; and Z is a moiety independently selected from, a fluorine containing moiety, a $Si_1$-$Si_8$ siloxane containing moiety or a hydrocarbon moiety with at least 18 carbons, and further wherein the junction group $X(Y(Z)_b)_a$ has a surface energy less than that of the block A and less than that of the block B.

The invention also relates to a composition comprised of the novel block copolymer and a solvent, and also relates to the process of using this composition in self-assembly and directed self-assembly processes.

DETAILED DESCRIPTION OF THE INVENTION

As used herein, unless otherwise indicated, aryl refers to an aromatic moiety with one attachment point (e.g. phenyl, anthracyl, naphthyl and the like). Apart from the attachment point, aryl group may be substituted with alkyl groups, aryl groups or halides (e.g. F, Cl, I, Br). Arylene refers to an aromatic moiety with more than 1 attachment point. Apart from the attachment points, arylene group may be substituted with alkyl groups, or halides (e.g. F, Cl, I, Br) or aryl groups. Alkyl refers to a linear, branched or cyclic alkane moiety with one attachment point (e.g. methyl, ethyl, propyl, n-butyl, tert-butyl, cyclohexyl and the like). Apart from the attachment point, alkyl groups may be substituted with alkyl groups, aryl groups or halides (e.g. F, Cl, I, Br). Alkylene refers to a linear, branched or cyclic alkane moiety with more than one attachment point. Apart from the attachment point, alkylene groups may be substituted with alkyl groups, aryl groups, or halides (e.g. F, Cl, I, Br). A fluoro moiety designates a fluoro group (i.e. F) or a partially or fully fluorinated hydrocarbon group where the hydrocarbon group is an aromatic moiety, an aliphatic moiety, or mixtures of these, where these moieties may also contain heteroatoms other than fluorine as pendant group or as part of a chain or cyclic structure. Fluoroaryl, fluoroarylene, fluoroalkyl, fluoroalkylene refers to these moieties as described above which are partially or completely fluorinated. Nitrogen containing heterocyclic moieties refers to 5-8 membered cyclic hydrocarbons containing one or more nitrogen atoms within the ring, the rings may be fully saturated or contain unsaturated moieties (e.g. nitrogen containing hetero cyclic compounds, such as pyrrolidine, pyrole, imidazolidine, imidazole, 1H-1,2,3-triazole, 2H-1,2,3-triazole, 1H-1,2,4-Triazole, 4H-1,2,4-Triazole, pyridine and the like). Oxygen containing heterocyclic moieties refers to 5-8 membered cyclic hydrocarbons containing one or more oxygen atoms within the ring, (e.g. tetrahydrofuran, furan, oxetane, pyran, dioxolane, dioxane and the like). Sulfur containing heterocyclic moieties refers to 5-8 membered cyclic hydrocarbons containing one or more sulfur atoms within the ring, (e.g. thiophane, thiophene, thiane, thiopyran, dithiane, dithiine and the like). When heterocylic moieties containing oxygen, sulfur or nitrogen are connected through another moiety the name of the moiety which preceded the term " . . . containing heterocylic moiety) under parenthesis. For instance a moiety in which an oxygen containing heterocyclic moiety is attached through a oxy (—O—) moiety will be termed and "oxy-(oxygen containing heterocyclic moiety)".

Fluorine containing linear hydrocarbon group, fluorine containing branched hydrocarbon group, and fluorine containing cyclic hydrocarbon group refer respectively to linear, branched or cyclic partially or fully fluorinated alkyl group which may also contain alkene unsaturations, arylene, moieties or aryl substituents. Fluorine containing linear alkyl ether group, fluorine containing branched alkyl ether group, fluorine containing cyclic alkyl ether group, refer to linear, branched or cyclic ether are linear, branched or cyclic, partially or fully fluorinated, alkyl or alkyloxy moieties containing one or more ether moieties, which may also contain alkene unsaturations, arylene, moieties or aryl substituents.

A $Si_1$-$Si_8$ siloxane moiety, when referring to the Z moiety part of pendant moiety $Y(Z)_b$ moiety refers, to a moiety containing a (—Si(alkyl)$_2$-O)$_n$-alkyl species where the alkyl moiety may be a linear, branched or cyclic alkyl moiety and n designates the number of siloxane moieties in a chain where n=1 to 8. A linear hydrocarbon moiety with a $Si_1$-$Si_8$ siloxane pendant group, a branched hydrocarbon moiety with a $Si_1$-$Si_8$ siloxane pendant group, a cyclic hydrocarbon moiety with a $Si_1$-$Si_8$ siloxane pendant group, refer to respectively a linear, branched or cyclic alkylene moiety to which is attached a $Si_1$-$Si_8$ siloxane moiety as defined above. A carbosilane, refers to an alkyl moiety in which at least one carbon atom has been replaced by a silicon atom. A linear hydrocarbon moiety with a carbosilane pendant group, a branched hydrocarbon moiety with a carbosilane pendant group, and a cyclic hydrocarbon moiety with a carbosilane pendant group, refers to respectively a linear, branched, or cyclic alkylene moiety to which is attached a carbosilane moiety as described above. A silane refers to a $Si_nH_{2n+1}$ moiety. A linear hydrocarbon moiety with a silane pendant group, a branched hydrocarbon moiety to which is attached a silane pendant group, and a cyclic hydrocarbon moiety refers to respectively refers to respectively a linear, branched, or cyclic alkylene moiety to which is attached with a silane pendant group. The term "-b-" refers to "-block-" and designates monomer repeat units that form block copolymer. The term "P" refers to "poly" when in front of a monomer acronym it designates the polymerized monomer (e.g. PS, designates poly(styrene) because S is the defined acronym for styrene). The term "JBCP" (Block copolymers with Junction with surface active pendant moiety) is an acronym which refers to the block copolymers of this invention with a junction group having structure (1) as defined herein that contain a surface active moiety. The term "Surface Active Junction Group" refers to the $X(Y(Z)_b)_a$ moiety in structure (1) as defined herein. The term "Phase Separable" as used to describe polymer blocks in a block copolymer which are phase separable and refers to the property of these blocks when cast as a film to be able to phase separate from each other because of a mutual insolubility of the block domains with each other. This phase separability of the polymer block domains in a film may manifest itself spontaneously in solution, or alternatively in the cast film or by heating of a cast film. When cast as a film the phase separability may also occur at room temperature if the polymer block polymer film is plasticized by solvent vapor. The term $V_f$ refers to the volume fraction, and when further annotated with a subscript which denotes the acronym for a polymer repeat unit block (e.g. PS for polystyrene) denotes the volume fraction of this bock (e.g. $V_{fPS}$ denotes the volume fraction of the polystyrene block in a block copolymer containing this block). The term Lo is the domain periodicity of a self-assembled pattern of a BCP.

The present invention relates to a novel block copolymer having structure (1), wherein the block copolymer comprises a diblock copolymer with a junction group,

(1)

wherein,
A is a block polymer chain,
B is a block polymer chain,
wherein, A and B are chemically different, covalently connected polymer chains, which are phase separable;

$X(Y(Z)_b)_a$ is a moiety which is a junction group comprising a surface active pendant moiety $Y(Z)_b$, wherein a is an integer from 1 to 4 denoting the number of surface active pendant moieties $Y(Z)_b$ attached to X, b is an integer from 1 to 5 denoting the number of Z moieties attached to the moiety Y, X is a linking group connecting the polymer block A, the polymer block B and the moiety Y, Y is a linking group or a direct valence bond between X and Z, and Z is a moiety independently selected from a fluorine containing moiety, a $Si_1$-$Si_8$ siloxane containing moiety or a hydrocarbon moiety with at least 18 carbons, and further wherein the junction group $X(Y(Z)_b)_a$ has a surface energy less than that of block A and less than that of block B.

Specific examples of the fluorine containing moiety a), the Si1-Si8 siloxane moiety b) and the hydrocarbon moiety with at least 18 carbons c) are where, a) Z is a fluorine group, a linear hydrocarbon group containing fluorine, a fluorine containing branched hydrocarbon group, a fluorine containing cyclic hydrocarbon group, a fluorine containing linear alkyl ether group, a fluorine containing branched alkyl ether group, a fluorine containing cyclic alkyl ether group or a mixture thereof, b) Z is a $Si_1$-$Si_8$ siloxane, a linear hydrocarbon moiety with a $Si_1$-$Si_8$ siloxane pendant group, a branched hydrocarbon moiety with a $Si_1$-$Si_8$ siloxane pendant group, a cyclic hydrocarbon moiety with a $Si_1$-$Si_8$ siloxane pendant group, a carbosilane, a linear hydrocarbon moiety with a carbosilane pendant group, a branched hydrocarbon moiety with a carbosilane pendant group, a cyclic hydrocarbon moiety with a carbosilane pendant group, a silane, a linear hydrocarbon moiety with a silane pendant group, a branched hydrocarbon moiety with a silane pendant group, a cyclic hydrocarbon moiety with a silane pendant group, or a mixture thereof, and c) Z is a linear hydrocarbon group with at least 18 carbons, a branched hydrocarbon with at least 18 carbons; and, In one aspect of this invention the junction moiety $X(Y(Z)_b)_a$, in structure (1) has a surface energy less than about 30 mN m$^{-1}$. In a more specific embodiment, the junction moiety has as surface energy between 30 mN m$^{-1}$ and 10 mN m$^{-1}$, preferably between 25 mN m$^{-1}$ and 14 mN m$^{-1}$.

Typically, the block copolymers of structure (1) suitable for being used in these inventions have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) (PD) of about 1.01 to about 6, or 1.01 to about 2 or 1.01 to about 1.5. Further embodiments are wherein in structure (1), a is an integer from 1 or 2. Another embodiment is where b is an integer from 1 to 2. In another embodiment of the block copolymers having structure (1) the $M_n$ ranges from 4,000-150,000 and the polydispersity (PD) ranges from 1.01 to 5.0, more preferably from 1.01 to 2.0.

In another embodiment of the present invention one of block A or block B comprises repeat units which are resistant to plasma etching techniques typically employed in manufacturing IC devices relative to the other block; and the other block either etches rapidly under these same plasma etch conditions or can be removed by chemical or photochemical processes. This property enables the pattern transfer of a self-assembled domain pattern into the substrate, when these materials are formulated with a solvent, and coated on a patterned substrate. If the self-assembly occurs on a patterned substrate it is directed self-assembly. The process of directed self-assembly of the novel block copolymer may, for instance, be made under a using a graphoepitaxy approach or a chemoepitaxy approach.

Another embodiment of the present invention is where block A in structure (1) is comprised of units derived from ethylenically unsaturated polymerizable monomers, or units derived from ring-opening polymerization (ROP) of cyclic monomers, and where block B is comprised of units derived from ethylenically unsaturated polymerizable monomers, or units derived from ring-opening polymerization (ROP) of cyclic monomers, and further wherein polymeric block A and B are different from each other and are phase separable.

Another aspect of this invention is where either block A or B is derived from a vinyl polymerizable monomer.

Another embodiment of structure (1) is where the linking group X in structure (1) is a moiety with 3 to 7 attachment points selected from a multivalent heteroatom, a multivalent group comprised of hetero atoms, a multivalent organic group or a multivalent organic group containing heteroatoms. More specific examples of X moieties are a $C_1$-$C_{20}$ linear alkylene moiety, a $C_3$-$C_{30}$ branched alkylene moiety, a $C_3$-$C_{30}$ cyclic alkylene moiety, a $C_1$-$C_{20}$ linear alkylene moiety with a $C_6$-$C_{30}$ diaryl pendant groups, a $C_3$-$C_{30}$ branched alkylene moiety with a $C_6$-$C_{30}$ diaryl pendant group, a $C_3$-$C_{30}$ cyclic alkylene moiety with a $C_6$-$C_{30}$ diaryl pendant group, a $C_1$-$C_{30}$ linear alkyleneoxy moiety, a $C_3$-$C_{30}$ branched alkyleneoxy moiety, a $C_1$-$C_{20}$ urethane-linear alkylene moiety (—N($R_{11}$)—C(=O)—O-linear alkylene), a $C_3$-$C_{30}$ urethane-branched alkylene moiety (—N($R_{11}$)—C(=O)—O-branched alkylene moiety), a $C_3$-$C_{30}$ urethane-cyclic alkylene moiety (—N($R_9$)—C(=O)—O-cyclic alkylene), a $C_1$-$C_{20}$ urea-linear alkylene moiety (—N($R_{11}$)—C(=O)—N($R_{11}$)-linear alkylene), a $C_3$-$C_{30}$ urea-branched alkylene moiety (—N($R_{11}$)—C(=O)—N($R_{11}$)-branched alkylene moiety), a $C_3$-$C_{30}$ urea-cyclic alkylene moiety (—N($R_{11}$)C(=O)—N($R_{11}$)-cyclic alkylene), a $C_1$-$C_{20}$ thiourea-linear alkylene moiety (—N($R_{11}$)—C(=S)—N($R_{11}$)-linear alkylene), a $C_3$-$C_{30}$ thiourea-branched alkylene moiety (—N($R_{11}$)—C(=S)—N($R_{11}$)-branched alkylene moiety), a $C_3$-$C_{30}$ thiourea-cyclic alkylene moiety (—N($R_{11}$)—C(=S)—N($R_{11}$)-cyclic alkylene), where $R_{11}$ is hydrogen or a $C_1$ to $C_4$ alkyl, a 1,2,3-triazole moiety, a 1,2,3-triazole $C_1$-$C_{30}$ alkylene moiety, a 1,2,3-triazole $C_3$-$C_{30}$ branched alkylenene moiety, a 1,2,3-triazole $C_3$-$C_{30}$ cyclic alkylenene moiety, a 1,2,3-triazole $C_1$-$C_{30}$ alkylene oxy moiety, a 1,2,3-triazole $C_3$-$C_{30}$ branched alkyleneneoxy moiety, a 1,2,3-triazole $C_3$-$C_{30}$ cyclic alkyleneneoxy moiety, a $C_3$-$C_{30}$ cyclic alkoxy moiety, a $C_3$-$C_{30}$ linear alkyleneoxycarbonyl moiety, a $C_5$-$C_{30}$ branched alkyleneoxycarbonyl moiety, a $C_3$-$C_{30}$ cyclic alkoxycarbonyl moiety, a $C_1$-$C_{30}$ linear fluoroalkylene moiety, a $C_3$-$C_{30}$ branched fluoroalkylene moiety, a $C_6$-$C_{30}$ cyclic fluoroalkylene moiety, a $C_6$-$C_{30}$ arylene moiety, a $C_6$-$C_{30}$ fluoroarylene moiety, a $C_5$-$C_{30}$ oxyalkyleneoxycarbonylalkylene moiety, a $C_2$-$C_{30}$ alkyleneoxyalkylene moiety, an aryl substituted $C_8$-$C_{42}$ alkyleneoxy moiety, an aryl substituted $C_8$-$C_{42}$ alkyleneoxyalkylene moiety, a $C_8$-$C_{42}$ aryl substituted alkylene moiety, a $C_7$-$C_{30}$ alkylenearylene moiety, a $C_7$-$C_{30}$ fluoroalkylenearylene moiety where $R_9$ is independently chosen from a $C_1$-$C_4$ alkyl group or hydrogen and combinations thereof.

A more specific embodiment of this aspect are when the X moiety is chosen from a $C_5$-$C_{30}$ oxyalkyleneoxycarbonylalkylene moiety, a $C_2$-$C_{30}$ alkyleneoxyalkylene moiety, an aryl substituted $C_8$-$C_{42}$ alkyleneoxy moiety, an aryl substituted $C_8$-$C_{42}$ alkyleneoxyalkylene moiety, a $C_8$-$C_{42}$ aryl substituted alkylene moiety, or a $C_7$-$C_{30}$ alkylenearylene moiety.

A further embodiment of structure (1) is where the linking group Y in structure (1) is a direct valence bond, a multivalent heteroatom, a multivalent group comprised of hetero atoms, a multivalent organic group or a multivalent organic group containing heteroatoms. More specific examples of Y moieties are a direct valence bond, oxy (—O—), carboxyl (—C(=O)—) carbonyloxy (—C(=O)—O—), oxycarbonyl (—O—C(=O)—), carbonate (—O—C(=O)—O—), a $C_1$-$C_{20}$, linear alkylene, a $C_3$-$C_{20}$ branched alkylene, a $C_3$-$C_{20}$ cyclic alkylene, a $C_1$-$C_{20}$, linear fluoroalkylene, a $C_3$-$C_{20}$ branched fluoroalkylene, a $C_6$-$C_{20}$ cyclic fluoroalkylene, a $C_1$-$C_{20}$, linear oxyalkylene, a $C_3$-$C_{20}$ branched oxyalkylene, a $C_6$-$C_{20}$ cyclic oxyalkylene, carbonyloxyakylene (—C(=O)—O-akylene), alkenylene (—CR$_1$=CR$_2$—) where $R_1$ and $R_2$ are hydrogen or a $C_1$-$C_5$ alkyl, alkynylene (—C≡C—), amino (—N(R$_3$)—) where $R_3$ is hydrogen or an imine (—C(=N—R$_4$)— where $R_4$ is hydrogen or a $C_1$-$C_5$ alkyl, an amide (—C(=O)—N(R$_5$)— and —N(R$_5$)—C(=O)— where $R_5$ is hydrogen or a $C_1$-$C_5$ alkyl, imide (—C(=O)—N(R$_6$)—C(=O)— where $R_6$ is hydrogen or a $C_1$-$C_5$ alkyl, aminooxy (—O—N(R$_7$)— and —N(R$_7$)—O— where $R_7$ is a $C_1$-$C_5$ alkyl, sulfide (—S—), disulfide (—S—S—), thionyl (—S(=O)—), sulfone (—S(=O)$_2$—), sulfoneamide (—S(=O)$_2$—N(R$_8$)— where $R_8$ is hydrogen or a $C_1$-$C_5$ alkyl, thiocarbonyl (—C(=S)—), thiocarboxy (—C(=S)—O—), oxythiocarbonyl (—O—C(=S)—), a $C_3$-$C_{10}$-dialkylsilylene-alkylene (—Si(R$_9$)(R$_{10}$)-alkylene), where $R_9$ and $R_{10}$ are independently selected from a $C_1$ to $C_4$ alkyl moiety, a $C_1$-$C_8$ urethane-alkylene (—N(R$_{11}$)—C(=O)—O— alkylene), a $C_1$-$C_8$ urea-alkylene (—N(R$_{11}$)—C(=O)—N(R$_{11}$)-alkylene), a $C_1$-$C_8$ thiourea-alkylene (—N(R$_{11}$)—C(=S)—N(R$_{11}$)-alkylene), where $R_{11}$ is hydrogen or a $C_1$-$C_4$ alkyl dithiocarboxy (—C(=S)—S—), a $C_1$-$C_{20}$, carbonyloxyfluoroakylene (—C(=O)—O-fluoroakylene-), a $C_1$-$C_{20}$ fluoroalkylene, a $C_6$-$C_{20}$ arylene, a $C_6$-$C_{20}$ oxyarylene, a $C_7$-$C_{20}$ alkylenearylene, a $C_7$-$C_{20}$fluoroalkylenearylene, a $C_7$-$C_{20}$ carbonylarylene, a $C_7$-$C_{20}$ carbonyloxyarylene, a $C_7$-$C_{20}$oxycarbonylarylene, a $C_7$-$C_{20}$oxycarbonyloxyarylene, a $C_5$-$C_{20}$ nitrogen containing heterocyclic moiety, a $C_5$-$C_{20}$ oxy-(nitrogen containing heterocyclic moiety), a $C_6$-$C_{20}$ alkylene-(nitrogen containing heterocyclic moiety), a $C_6$-$C_{20}$ carbonyl-(nitrogen containing heterocyclic moiety), a $C_6$-$C_{20}$ carbonyloxy-(nitrogen containing heterocyclic moiety), a $C_5$-$C_{20}$ oxygen containing heterocyclic moiety, a $C_5$-$C_{20}$ oxy-(oxygen containing heterocyclic moiety), a $C_6$-$C_{20}$ alkylene-(oxygen containing heterocyclic moiety), a $C_6$-$C_{20}$ carbonyl-(oxygen containing heterocyclic moiety), a $C_6$-$C_{20}$ carbonyloxy-(oxygen containing heterocyclic moiety), a $C_5$-$C_{20}$ sulfur containing heterocyclic moiety, a $C_5$-$C_{20}$ oxy-(sulfur containing heterocyclic moiety), a $C_6$-$C_{20}$ alkylene-(sulfur containing heterocyclic moiety), a $C_6$-$C_{20}$ carbonyl-(sulfur containing heterocyclic moiety), a $C_6$-$C_{20}$ carbonyloxy-(sulfur containing heterocyclic moiety), a $C_5$-$C_{20}$ nitrogen containing heterocyclic moiety, a $C_5$-$C_{20}$ oxy-(nitrogen containing heterocyclic moiety), a $C_6$-$C_{20}$ alkylene-(nitrogen containing heterocyclic moiety), a $C_6$-$C_{20}$ carbonyl-(nitrogen containing heterocyclic moiety), a $C_6$-$C_{20}$ carbonyloxy-(nitrogen containing heterocyclic moiety), a —(C$_1$-C$_{20}$ alkylene)$_o$-(Si(C$_1$-C$_{20}$ alkyl)$_2$-O)$_p$—, a —O—(Si(C$_1$-C$_{20}$ alkyl)$_2$-O)$_p$—, wherein o is an integer between 1 and 5, and p is a positive integer from 1 to 5, or combinations thereof. A more specific embodiment of this aspect of the invention is where Y is selected from the group consisting of oxy (—O—), carbonyl (—C(=O)—), carbonyloxy (—C(=O)—O—), oxycarbonyl (—O—C(=O)—), carbonate (—O—C(=O)—O—), carbonyloxyakylene (—C(=O)—O-akylene-), a $C_1$-$C_{20}$ carbonyloxyfluoroakylene (—C(=O)—O-fluoroakylene-), alkylene-fluoroalkylene, a $C_5$-$C_{20}$ arylene, a $C_6$-$C_{20}$ oxyarylene, a $C_7$-$C_{20}$ alkylenearylene, a $C_1$-$C_{20}$, linear alkylene, a $C_3$-$C_{20}$ branched alkylene, a $C_6$-$C_{20}$ cyclic alkylene, a $C_1$-$C_{20}$, linear fluoroalkylene, a $C_3$-$C_{20}$ branched fluoroalkylene, and a $C_6$-$C_{20}$ cyclic fluoroalkylene.

A further embodiment of structure (1) is where the moiety Z is a fluorine containing hydrocarbon group such as linear $C_1$-$C_{10}$fluoroalkyl group, $C_3$-$C_{10}$ branched fluoroalkyl groups, $C_4$-$C_{10}$ cyclic fluoroalkyl group, a alkylenefluoroalkyl group (—(CH$_2$)$_q$(CF$_2$)$_r$—CF$_3$), a CFH containing alkylenefluoroalkyl group —(—CH$_2$—)$_q$(CHF)$_{q2}$(CF$_2$)$_r$—CF$_3$), a alkylenefluoroether-fluoroalkyl group —(—CH$_2$—)$_q$ (—CF$_2$—O—)$_s$(—CF$_2$CF$_2$—O—)$_t$(CF$_2$)$_u$CF$_3$, a —CHF containing alkylenefluoroether-fluoroalkyl groups (—CH$_2$—)$_q$(CHF)$_{q2}$(—CF$_2$—O—)$_s$(—CF$_2$CF$_2$—O—)$_t$(CF$_2$)$_u$CF$_3$, or a moiety having structure (2)

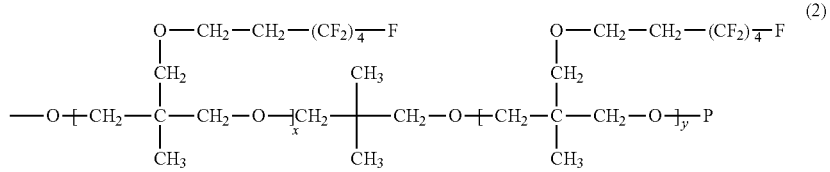

(2)

wherein q is an integer from 0 to 10, q2 is an integer from 1 to 10, r is an integer from 1 to 10, s is an integer from 0-10, t is an integer from 1 to 10, u is an integer between 0 and 10 x is 1 to 5, y is 1 to 5, and P is hydrogen, a $C_1$ to $C_4$ alkyl, or a —CH$_2$—CH$_2$—(CF$_2$)$_4$F moiety.

One embodiment of the novel block copolymer of structure (1) is where the surface active pendant moiety —Y(Z)$_b$ is —C(=O)—O—(—CH$_2$—)$_q$(—CF$_2$—)$_r$—CF$_3$, —C(=O)—O—(—CH$_2$—)$_q$(—CF$_2$—O—)$_s$(—CF$_2$CF$_2$—O)$_t$(CF$_2$)$_u$CF$_3$, a moiety having structure (3)

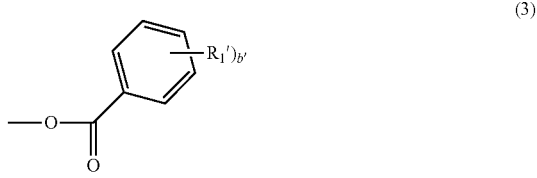

(3)

or a moiety having structure (4)

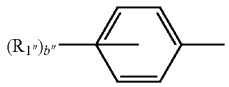

(4)

wherein —$R_{1'}$ and —$R_{1''}$ are independently selected from a fluorinated moiety.

In a further embodiment, the fluorinated moiety is selected from moieties such as —$(-CH_2-)_q(-CF_2-)_r-CF_3$, —$O-(-CH_2-)_q(-CF_2-)_r-CF_3$, —$C(=O)-(-CH_2-)_q(-CF_2-)_r-CF_3$, —$O-C(=O)-(-CH_2-)_q(-CF_2-)_r-CF_3$, —$(-CH_2-)_q(-CF_2-O-)_s(-CF_2CF_2-O)_t(CF_2)_uCF_3$, —$O-(-CH_2-)_q(-CF_2-O-)$, $(-CF_2CF_2-O)_t(CF_2)_uCF_3$, —$O-C(=O)-O-(-CH_2-)_q(-CF_2-O-)_s(-CF_2CF_2-O)_t(CF_2)_uCF_3$ or —$C(=O)-O-(-CH_2-)_q(-CF_2-O-)_s(-CF_2CF_2-O)_t(CF_2)_uCF_3$ and further wherein b' and b" are integers from 1 to 5, q is an integer from 0 to 10, r is an integer from 1 to 10, s is an integer from 0 to 10, t is an integer from 1 to 10 and u is an integer between 0 and 10. A more specific embodiment of this aspect of the invention is where the surface active pendant moiety —$Y(Z)_b$ is represented by (5)

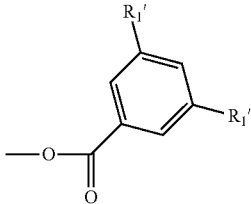

(5)

wherein —$R_{1'}$ is —$O-(-CH_2-)_q(-CF_2-)_r-CF_3$, and further wherein q is an integer from 0 to 10, and r is an integer from 1 to 10.

In a further embodiment of the novel structure (1), the surface active pendant moiety $Y(Z)_b$ is —$C(=O)-O-(-CH_2-)_q(-CF_2-)_r-CF_3$, or —$C(=O)-O-(-CH_2-)_q(-CF_2-O-)_s(-CF_2CF_2-O)_t(CF_2)_uCF_3$ where q is an integer from 0 to 10, r is an integer from 1 to 10, s is an integer from 0-10, and t is an integer from 1 to 10 and u is an integer between 0 and 10. Another more specific embodiment of this aspect of the invention is where the surface active pendant moiety $Y(Z)_b$ has structure (3)

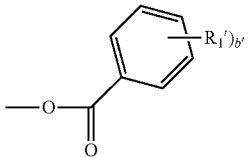

(3)

where $R_1'$ is —$(-CH_2-)_q(-CF_2-)_r-CF_3$, —$O-(-CH_2-)_q(-CF_2-)_r-CF_3$, —$C(=O)-(-CH_2-)_q(-CF_2-)_r-CF_3$, —$O-C(=O)-(-CH_2-)_q(-CF_2-)_r-CF_3$, —$(-CH_2-)_q(-CF_2-O-)_s(-CF_2CF_2-O)_t(CF_2)_uCF_3$, —$O-(-CH_2-)_q(-CF_2-O-)_s(-CF_2CF_2-O)_t(CF_2)_uCF_3$, —$O-C(=O)-O-(-CH_2-)_q(-CF_2-O-)_s(-CF_2CF_2-O)_t(CF_2)_uCF_3$ or —$C(=O)-O-(-CH_2-)_q(-CF_2-O-)_s(-CF_2CF_2-O)_t(CF_2)_uCF_3$ and further wherein b' and b" are integers from 1 to 5, q is an integer from 0 to 10, r is an integer from 1 to 10, s is an integer from 0 to 10, t is an integer from 1 to 10 and u is an integer between 0 and 10.

In another aspect of this invention the surface active pendant moiety $Y(Z)_b$— in structure (1) is —$(C_1-C_{20}$alkylene$)_o$-$(Si(CH_3)_2-O)_p$—, —$(Si(CH_3)_2-O)_v$—Si$(CH_3)_3$, or —$O-(Si(CH_3)_2-O)_p-(Si(CH_3)_2-O)_v$—Si$(CH_3)_3$, where o is an integer between 1 and 10, p is a positive integer from 1 to 10 and v is an integer from 2 to 10.

Another aspect of the invention is where structure (1) has an X moiety which is comprised of an oxyalkyleneoxycarbonylalkylene moiety. In this aspect of the invention the novel block copolymer may be made by atom-transfer radical-polymerization (ATRP) initiators or ring-opening polymerization (ROP) initiators. More specific examples of inventive materials where the X moiety is comprised of an oxyalkylenecarbonylalkylene moiety are shown in FIG. 1 which depicts structures (6) to (11).

In Structure (6)-(9) $R_{2'}$ is hydrogen or a $C_1$ to $C_8$ alkyl group, or a $C_6$-$C_{20}$ aryl group, $R_{3'}$ and $R_{4'}$ are independently a $C_1$ to $C_8$ alkyl group, hydrogen, bromine, chlorine, or iodine, w and w' are independently integers from 1 to 4; in structure (7) xa is an integer from 1 to 6, ya is an integer from 2-16; in structure (8), xa and xb are independently integers from 1 to 6, ya is an integer from 2-16, and b' is an integer from 1 to 5, in structure (9) xa and xb are independently integers from 1 to 6, ya is an integer from 2-16, and b' is an integer from 1 to 5.

In Structure (10) $R_{2'}$ is a $C_1$-$C_4$ alkyl, and $R_{3'}$ and $R_{4'}$ are independently a $C_1$ to $C_8$ alkyl group, and $Rf_1$ and $Rf_2$ are independently selected from —$(-CH_2-)_q(-CF_2-)_r-CF_3$, —$O-(-CH_2-)_q(-CF_2-)_r-CF_3$, or —$(-CH_2-)_q(-CF_2-O-)_s(-CF_2CF_2-O)_t(CF_2)_uCF_3$, and further wherein q is an integer from 0 to 10, r is an integer from 1 to 10, s is an integer from 0 to 10, t is an integer from 1 to 10, u is an integer between 0 and 10.

In Structure (11) $R_{2'}$ is selected from a $C_1$-$C_4$ alkyl, and $R_{3'}$ and $R_{4'}$ are independently a $C_1$ to $C_8$ alkyl group, and $Rf_1$ and $Rf_2$ are independently selected from —$(-CH_2-)_q(-CF_2-)_r-CF_3$, —$O-(-CH_2-)_q(-CF_2-)_r-CF_3$, or —$(-CH_2-)_q(-CF_2-O-)_s(-CF_2CF_2-O)_t(CF_2)_uCF_3$, and further wherein q is an integer from 0 to 10, r is an integer from 1 to 10, s is an integer from 0 to 10, t is an integer from 1 to 10 and u is an integer between 0 and 10.

In another embodiment, when X is an oxyalkylenecarbonylalkylene moiety such as shown in FIG. 1 (Structures (6) to (11)), block B is derived from a vinyl aryl monomer and block A is derived from a lactone, lactam, epoxide or cyclic carbonate monomer.

A further aspect of the novel block copolymer of structure (1) is where the junction group $X(Y(Z)_b)$a is a moiety derived from a 1,1-diphenylethylene (DPE) derivative. FIG. 2, which depicts structure (12) and (14) shows more specific examples of the novel materials containing an X(Y(Z)b)a moiety derived from DPE.

In structure (12) X' is a direct valence bond or a moiety (13)

(13)

where $R_{5'}$ is $-(-CH_2-)_q(-CF_2-)_r-CF_3$, $-O-(-CH_2)_q(-CF_2-)_r-CF_3$, $-C(=O)-(-CH_2-)_q(-CF_2-)_r-CF_3$, $-O-C(=O)-(-CH_2-)_q(-CF_2-)_r-CF_3$, $-(-CH_2-)_q(-CF_2-O-)_s(-CF_2CF_2-O)_t(CF_2)_uCF_3$, $-O-(-CH_2-)_q(-CF_2-O-)_s(-CF_2CF_2-O)_t(CF_2)_uCF_3$, $-O-C(=O)-O-(-CH_2-)_q(-CF_2-O-)_s(-CF_2CF_2-O)_t(CF_2)_uCF_3$ or $-C(=O)-O-(-CH_2-)_q(-CF_2-O-)_s(-CF_2CF_2-O)_t(CF_2)_uCF_3$ and $R_{6'}$ is $-(-CF_2-)_q(-CF_2-)_r-CF_3$, $-O-(-CH_2-)_q(-CF_2-)_r-CF_3$, $-C(=O)-(-CH_2-)_q(-CF_2-)_r-CF_3$, $-O-C(=O)-(-CH_2-)_q(-CF_2-)_r-CF_3$, $-(-CH_2-)_q(-CF_2-O-)_s(-CF_2CF_2-O)_t(CF_2)_uCF_3$, $-O-(-CH_2-)_q(-CF_2-O-)_s(-CF_2CF_2-O)_t(CF_2)_uCF_3$, $-O-C(=O)-O-(-CH_2-)_q(-CF_2-O-)_s(-CF_2CF_2-O)_t(CF_2)_uCF_3$, $-C(=O)-O-(-CH_2-)_q(-CF_2-O-)_s(-CF_2CF_2-O)_t(CF_2)_uCF_3$ or hydrogen, $R_{7'}$ and $R_{9'}$ are independently selected from hydrogen, or a $C_1$-$C_4$ alkyl, $R_{8'}$ and $R_{10'}$ are independently selected from hydrogen, a $C_1$-$C_4$ alkyl, or a $C_2$-$C_6$ alkyleneoxyalkyl moiety, X" is $-O-$ or $-S-$, and further wherein q is an integer from 0 to 10, r is an integer from 1 to 10, s is an integer from 0 to 10, t is an integer from 1 to 10, u is an integer between 0 and 10 and ba and bb are independently integers from 1 to 5.

In Structure (14) $R_{ac}$ is $-O-(-CH_2-)_q(-CF_2-)_r-CF_3$, and $R_{ad}$ is $-(-CH_2-)_q(-CF_2-)_r-CF_3$, or hydrogen, q is an integer from 0 to 10, and r is an integer from 1 to 10.

In FIG. 2 for structures (12) and (14) for the phase separable blocks A and B, block A is derived from a vinyl aryl monomer, and block B is derived from a lactone, lactam, epoxide, cyclic carbonate monomer; also, block B may be derived from an ethylenically unsaturated polymerizable monomers in structure (14) and in structure (12) when X' is a direct valence bond.

In another aspect of this invention the novel block copolymer has a surface active pendant moiety $Y(Z)_b$ containing an alkyl silicon junction moiety which may be derived from a hydrosilation coupling reaction having structure (15) where $R_{af}$ and $R_{ai}$ are independently a $C_1$-$C_5$ linear alkylene moiety, a $C_3$-$C_{10}$ branched alkylene moiety or a $C_3$-$C_{10}$ cyclic alkylene moiety, $R_{ag}$ and $R_{ah}$ are independently selected from a $C_1$ to $C_4$ alkyl moiety, and $R_{aj}$ is $-(-CH_2-)_q(-CF_2-)_r-CF_3$, $-O-(-CH_2-)_q(-CF_2-)_r-CF_3$, $-C(=O)-(-CH_2-)_q(-CF_2-)_r-CF_3$, $-O-C(=O)-(-CH_2-)_q(-CF_2-)_r-CF_3$, $-(-CH_2-)_q(-CF_2-O-)_s(-CF_2CF_2-O)_t(CF_2)_uCF_3$, $-O-(-CH_2-)_q(-CF_2-O-)_s(-CF_2CF_2-O)_t(CF_2)_uCF_3$, $-O-C(=O)-O-(-CH_2-)_q(-CF_2-O-)_s(-CF_2CF_2-O)_t(CF_2)_uCF_3$ or $-C(=O)-O-(-CH_2-)_q(-CF_2-O-)_s(-CF_2CF_2-O)_t(CF_2)_uCF_3$ and further wherein b' and b" are integers from 1 to 5, q is an integer from 0 to 10, r is an integer from 1 to 10, s is an integer from 0 to 10, t is an integer from 1 to 10 and u is an integer between 0 and 10.

More specific examples of inventive block copolymer materials with a surface active pendant moiety containing an alkyl silicon junction moiety are shown in structure (16), where $R_{af}$, $R_{ak}$ and $R_{ai}$ are independently a $C_1$-$C_{10}$ linear alkylene moiety, a $C_3$-$C_{10}$ branched alkylene moiety, or a $C_3$-$C_{10}$ cyclic alkylene moiety, $R_{ag}$ and $R_{ah}$ are independently selected from a $C_1$ to $C_4$ alkyl moiety, and $R_{aj}$ is $-(-CH_2-)_q(-CF_2-)_r-CF_3$, $-O-(-CH_2-)_q(-CF_2-)_r-CF_3$, $-C(=O)-(-CH_2-)_q(-CF_2-)_r-CF_3$, $-O-C(=O)-(-CH_2-)_q(-CF_2-)_r-CF_3$, $-(-CH_2-)_q(-CF_2-O-)_s(-CF_2CF_2-O)_t(CF_2)_uCF_3$, $-O-(-CH_2-)_q(-CF_2-O-)_s(-CF_2CF_2-O)_t(CF_2)_uCF_3$, $-O-C(=O)-O-(-CH_2-)_q(-CF_2-O-)_s(-CF_2CF_2-O)_t(CF_2)_uCF_3$ or $-C(=O)-O-(-CH_2-)_q(-CF_2CF_2-O)_t(CF_2)_uCF_3$ and further wherein b' and b" are integers from 1 to 5, q is an integer from 0 to 10, r is an integer from 1 to 10, s is an integer from 0 to 10, t is an integer from 1 to 10, and u is an integer between 0 and 10.

(16)

In a further aspect of the invention depicted in structure (16), the phase separable blocks A and B may be ones where A is derived from a vinyl aryl monomer and block B is derived front a lactone, lactam, epoxide, cyclic carbonate or an ethynically unsaturated monomer which is not the same as block A, and further wherein block A and B are chemically distinct and are phase separable.

In another aspect of this invention the novel block copolymer of structure (1) has a junction group $X(Y(Z)_b)_a$ incorporating a urethane-alkylene moiety. Structure (17) shows specific examples of novel block copolymer comprising an urethane-alkylene moiety where $R_{ai}$ is hydrogen or a $C_1$-$C_4$ alkyl, $R_{am}$ and $R_{an}$ are independently a $C_1$-$C_{20}$ linear alkylene moiety, a $C_3$-$C_{30}$ branched alkylene moiety, a $C_3$-$C_{30}$ cyclic alkylene moiety, and $R_{ao}$ is $-(-CH_2-)_q(-CF_2-)_r-CF_3$, $-O-(-CH_2-)_q(-CF_2-)_r-CF_3$, $-C(=O)-(-CH_2-)_q(-CF_2-)_r-CF_3$, $-O-C(=O)-(-CH_2-)_q(-CF_2-)_r-CF_3$, $-(-CH_2-)_q(-CF_2-O-)_s(-CF_2CF_2-O)_t(CF_2)_uCF_3$, $-O-(-CH_2-)_q(-CF_2-O-)_s(-CF_2CF_2-O)_t(CF_2)_uCF_3$, $-O-C(=O)-O-(-CH_2-)_q(-CF_2-O-)_s(-CF_2CF_2-O)_t(CF_2)_uCF_3$ or $-C(=O)-O-(-CH_2-)_q(-CF_2-O-)_s(-CF_2CF_2-O)_t(CF_2)_uCF_3$, b' and b" are integers from 1 to 5, q is an integer from 0 to 10, r is an integer from 1 to 10, s is an integer from 0 to 10, t is an integer from 1 to 10, and u is an integer between 0 and 10.

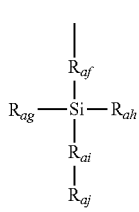

(15)

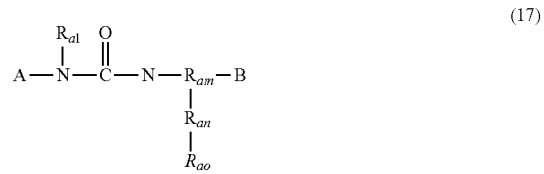

(17)

In a further aspect of the invention depicted in structure (17) block A is derived from a vinyl aryl monomer and block B is derived from a lactone, lactam, epoxide, cyclic carbonate or an ethynically unsaturated monomer which is not the same as block A, and further wherein block A and B are chemically distinct and are phase separable.

In another aspect of this invention the novel block copolymer of structure (1) has a junction group, $X(Y(Z)_b)_a$, comprising a urea-alkylene or thiourea-alkylene moiety which may arise from an isocyanates and thioisocyanate coupling reaction. Structure (18) shows specific examples of this novel block copolymer having a urea-alkylene or thiourea-alkylene moiety where $R_{11}$ is hydrogen or a $C_1$-$C_4$ alkyl, $R_{ap}$ and $R_{aq}$ are independently a $C_1$-$C_{20}$ linear alkylene moiety, a $C_3$-$C_{30}$ branched alkylene moiety, or a $C_3$-$C_{30}$ cyclic alkylene moiety, $M_{ab}$ is O or S, and $R_{ar}$ is —(—$CH_2$—)$_q$(—$CF_2$—)$_r$—$CF_3$, —O—(—$CH_2$—)$_q$(—$CF_2$—)$_r$—$CF_3$, —C(=O)—(—$CH_2$—)$_q$(—$CF_2$—)$_r$—$CF_3$, —O—C(=O)—(—$CH_2$—)$_q$(—$CF_2$—)$_r$—$CF_3$, —(—$CH_2$—)$_q$(—$CF_2$—O—)$_s$(—$CF_2CF_2$—O)$_t$($CF_2$)$_u$$CF_3$, —O—(—$CH_2$—)$_q$(—$CF_2$—O—)$_s$(—$CF_2CF_2$—O)$_t$($CF_2$)$_u$$CF_3$, —O—C(=O)—O—(—$CH_2$—)$_q$—$CF_2$—O—)$_s$(—$CF_2CF_2$—O)$_t$($CF_2$)$_u$$CF_3$ or —C(=O)—O—(—$CH_2$—)$_q$(—$CF_2$—O—)$_s$(—$CF_2CF_2$—O)$_t$($CF_2$)$_u$$CF_3$. and further wherein b' and b" are integers from 1 to 5, q is an integer from 0 to 10, r is an integer from 1 to 10, s is an integer from 0 to 10, t is an integer from 1 to 10 and u is an integer between 0 and 10.

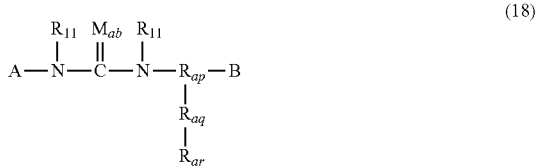

(18)

In another aspect of this embodiment, as shown in Structure (18) the phase separable block A and B are ones where block A and B are chemically distinct and block A is derived from a vinyl aryl monomer, and block B is derived from a lactone, lactam, epoxide, cyclic carbonate or an ethynically unsaturated monomer which is not the same as the vinyl aryl from which block A is derived from.

In another aspect of this invention the novel block copolymer of structure (1) has a junction group $X(Y(Z)_b)_a$ comprised of a 1,2,3-triazole alkyleneneoxy moiety may arise from a click chemistry coupling reaction. In another embodiment of this aspect of the invention where $X(Y(Z)_b)_a$ comprises of a 1,2,3-triazole alkyleneneoxy, the block copolymer may have structures as described in Structure (19) where $R_{as}$ and $R_{at}$ are independently a $C_1$-$C_{20}$ linear alkylene moiety, a $C_3$-$C_{30}$ branched alkylene moiety, a $C_3$-$C_{30}$ cyclic alkylene moiety, and $R_{au}$ is —(—$CH_2$—)$_q$(—$CF_2$—)$_r$—$CF_3$, —O—(—$CH_2$—)$_q$(—$CF_2$—)$_r$—$CF_3$, —C(=O)—(—$CH_2$—)$_q$(—$CF_2$—)$_r$—$CF_3$, —O—C(=O)—(—$CH_2$—)$_q$ (—$CF_2$—)$_r$—$CF_3$, —(—$CH_2$)$_q$(—$CF_2$—O—)$_s$(—$CF_2CF_2$—O)$_t$($CF_2$)$_u$$CF_3$, —O—(—$CH_2$—)$_q$(—$CF_2$—O—)$_s$ (—$CF_2CF_2$—O)$_t$($CF_2$)$_u$$CF_3$, —O—C(=O)—O—(—$CH_2$—)$_q$(—$CF_2$—O—)$_s$(—$CF_2CF_2$—O)$_t$($CF_2$)$_u$$CF_3$ or —C(=O)—O—(—$CH_2$—)$_q$(—$CF_2$—O—)$_s$(—$CF_2CF_2$—O)$_t$($CF_2$)$_u$$CF_3$ and further wherein b' and b" are integers from 1 to 5, q is an integer from 0 to 10, r is an integer from 1 to 10, s is an integer from 0 to 10, t is an integer from 1 to 10, u is an integer between 0 and 10.

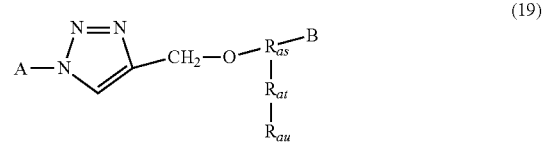

(19)

In this embodiment where the novel block copolymer has structure (19), block A and B are chemically distinct and are phase separable where block A is derived from a vinyl aryl, and block B is derived from a lactone, lactam, epoxide, cyclic carbonate or an ethynically unsaturated monomer which is not the same as the vinyl aryl from which block A is derived.

In another aspect of this invention the novel block copolymer of structure (1) has a junction group incorporating aryl substituted alkyleneoxy moiety. $X(Y(Z)_b)_a$ which may be derived from the reaction of a poly styrenic anion derivative with an epoxide followed by reaction of the oxy anion formed with a with a cyclic monomer. In one example of this embodiment the novel block copolymer may have the structures as shown in FIG. 3 comprising structures 20, 21a, and 21b.

In the embodiment of this aspect of the novel block copolymer as shown in Structure 20, E' and E" are independently selected from hydrogen or methyl, $R_{ax}$ is hydrogen, a $C_1$-$C_3$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy, a $C_9$-$C_{36}$ tris (trialkylsilyl)silyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$alkylcarbonyl, a $C_2$-$C_{20}$ alkylcarbonyloxy, a $C_1$-$C_{20}$ alkoxy or a $C_9$-$C_{36}$ tris(trialkylsilyl)silyl group, $R_{av}$ is a $C_1$-$C_4$ alkylene spacer moiety and $R_{aw}$ is —(—$CH_2$—)$_q$(—$CF_2$—)$_r$—$CF_3$, —O—(—$CH_2$—)$_q$(—$CF_2$—)$_r$—$CF_3$, —C(=O)—(—$CH_2$—)$_q$(—$CF_2$—)$_r$—$CF_3$, —O—C(=O)—(—$CH_2$—)$_q$(—$CF_2$—)$_r$—$CF_3$, —(—$CH_2$—)$_q$(—$CF_2$—O—)$_s$(—$CF_2CF_2$—O)$_t$($CF_2$)$_u$$CF_3$, —O—(—$CH_2$—)$_q$(—$CF_2$—O—)$_s$(—$CF_2CF_2$—O)$_t$($CF_2$)$_u$$CF_3$, —O—C(=O)—O—(—$CH_2$—)$_q$(—$CF_2$—O—)$_s$(—$CF_2CF_2$—O)$_t$($CF_2$)$_u$$CF_3$ or —C(=O)—O—(—$CH_2$—)$_q$(—$CF_2$—O—)$_s$(—$CF_2CF_2$—O)$_t$($CF_2$)$_u$$CF_3$ and further wherein q is an integer from 0 to 10, r is an integer from 1 to 10, s is an integer from 0 to 10, t is an integer from 1 to 10, u is an integer between 0 and 10 and ba is an integer from 1 to 5. In a further aspect of this embodiment, the phase separable block copolymers are derived in the case of block A from a vinyl aryl and for block B from a lactone, lactam, epoxide or cyclic carbonate.

In FIG. 3, structures (21a) and (21b) show another embodiment of this aspect of the novel block copolymer where xb is an integer from 1 to 6 and yb is an integer from 4 to 20.

In the aspects of the novel block copolymer illustrated by FIG. 3, block A and B are phase separable and where further in this aspect of the invention block A is derived from a vinyl aryl and block B is derived from a lactone, lactam, epoxide or cyclic carbonate.

The block copolymer having structure (1), and the substructures described above may be made by a variety of approaches, such as, for instance, block copolymer prepared by using atom-transfer radical-polymerization (ATRP) and ring-opening polymerization (ROP) initiators, block copolymers prepared using a 1,1-diphenylethylene (DPE) derivative as an initiator and capping agent in anionic block polymerization.

Scheme 1 shows the synthesis of an ATRP and ROP initiator comprised of an oxyalkylenecarbonylalkylene moiety. This initiator may be employed to make one example of the novel block copolymer of structure (1) depicted in FIG. 1, namely one belonging to the group having structure (7) where the pendant Z moiety is derived from 2,2,3,3,4,4,4-Heptafluoro-1-butanol (C4OL) pendant on an X moiety comprised of a oxyalkylenecarbonylalkylene moiety.

Similarly, other types of pendant Z moieties may be attached to such initiators by using suitable alcohols containing suitable Z moieties such as a fluorine containing linear hydrocarbon group, a fluorine containing branched hydrocarbon group, a fluorine containing cyclic hydrocarbon group, a fluorine containing linear alkyl ether group, a fluorine containing branched alkyl ether group, a fluorine containing cyclic alkyl ether group or a mixture thereof, a $Si_1$-$Si_8$ siloxane moiety, a linear hydrocarbon moiety with a $Si_1$-$Si_8$ siloxane pendant group, a branched hydrocarbon moiety with a $Si_1$-$Si_8$ siloxane pendant group, a cyclic hydrocarbon moiety with a $Si_1$-$Si_8$ siloxane pendant group, a carbosilane, a linear hydrocarbon moiety with a carbosilane pendant group, a branched hydrocarbon moiety with a carbosilane pendant group, a cyclic hydrocarbon moiety with a carbosilane pendant group, a silane, a linear hydrocarbon moiety with a silane pendant group, a branched hydrocarbon moiety with a silane pendant group, a cyclic hydrocarbon moiety with a silane pendant group, or a linear hydrocarbon chain having more than 18 carbons.

The Example section shows several specific examples of the synthesis of such initiators capable of making novel block copolymer of this invention where the X moiety contains an oxyalkylenecarbonylalkylene moiety.

A specific non-limiting Example of a full synthesis of a novel block copolymer of this invention having structure (7) based on the initiator resulting from Scheme 1 is depicted in sequence illustrated by Schemes 2 and 3. The Example section shows other examples of this approach, using different initiators containing an oxyalkylenecarbonylalkylene moiety employed to make other novel block copolymers with other monomers.

Scheme 1

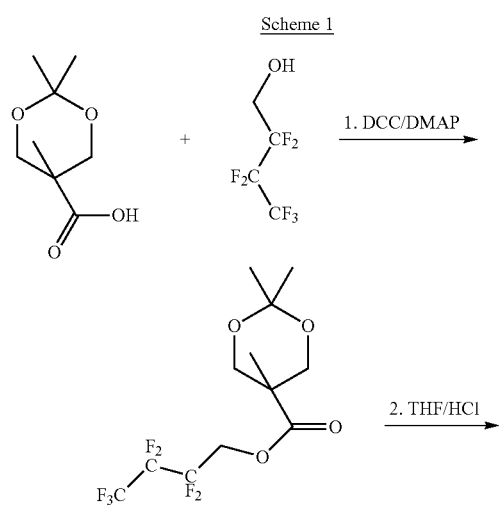

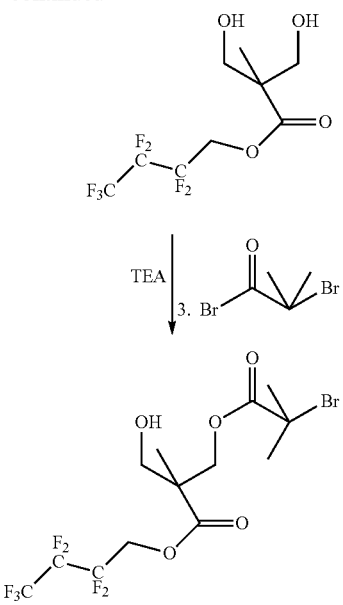

Specifically, in this instance, Scheme 2 shows the reaction of initiator made in Scheme 1 with styrene.

Scheme 2

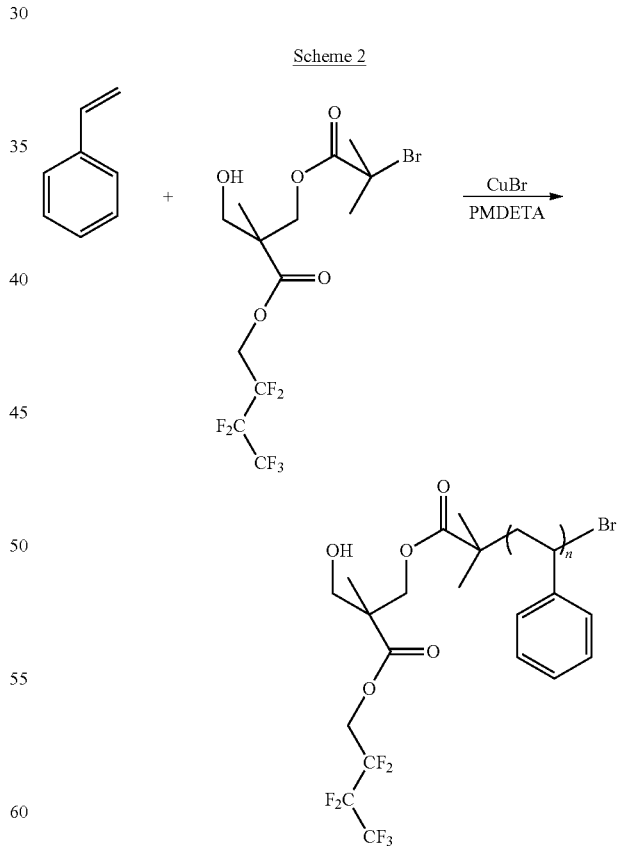

In turn Scheme 3 shows the reaction of this styrene macroinitiator moiety with the cyclic monomer 1,3-propylene carbonate to form one non limiting example of an embodiment of the novel block copolymer of this invention.

Scheme 3

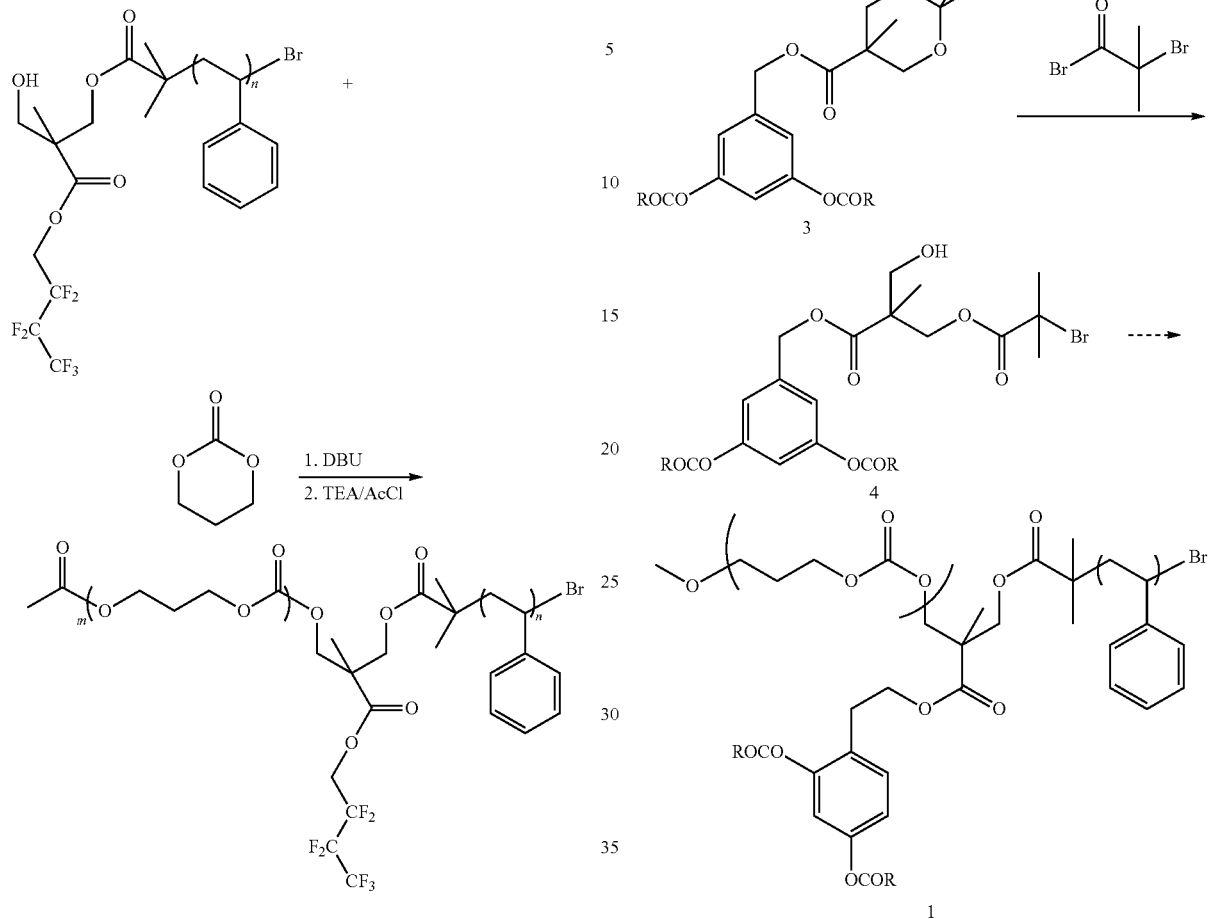

Scheme 4 shows another similar approach where more than one Z moiety may be introduced where the R moiety would be a Z moiety derived from an alcohol as described above.

Scheme 4

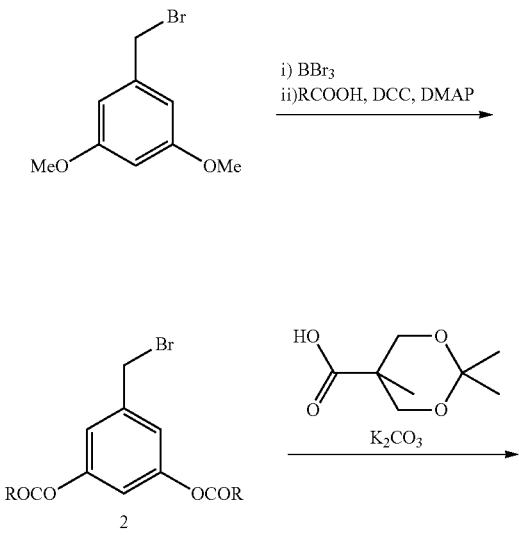

Another approach to making the novel block copolymer of structure (1) is to use 1,1-diphenylethylene (DPE) as an initiator and capping agent in anionic block polymerization of styrene and alkyl(meth)acrylate monomers. These are the materials having structures (12) and (14) depicted in FIG. 2.

1,1-diphenylethylene (DPE) being a non-polymerizable, vinyl monomer can be used in anionic polymerization of various alkyl(meth)acrylates. It can also be used as a reactivity modifier in styrene block copolymerization with alkyl (meth)acrylates in anionic polymerization. The advantage of DPE is that the opening of double bond via carbanion reaction results to form a carbanion, which is highly delocalized into the two phenyl substitution at alpha-carbon of the double bond. This significantly reduces the reactivity and thereby suppresses undesired attachment of carbonyl group in alkyl(meth)acrylate polymerization. An adduct of sec-BuLi and DPE is generally used as initiator for alkyl(meth) acrylate polymerization. The active center of anionic polymerization of styrene, a styryllithium, is very reactive and will not efficiently initiate alkyl(meth)acrylate to produce well-defined block copolymer.

By functionalizing DPE with pendant surface active moieties it is possible to prepare the novel block copolymer of this invention having structure (1) where the surface active pendant moieties $Y(Z)_b$ is comprised of Z moieties selected from, as non-limiting examples, perfluoroalkane and perfluoroethers.

Schemes 5 and 6 show respectively non limiting examples of formation of macroinitiators capable of forming polymers having structure (1) in which the junction groups are derived from DPE having one or two Z moiety. In these schemes the X moiety is an alkyleneoxy moiety to which is attached the linking group Y an arylene moiety (in this instance phenylene) to which is attached the Z moiety which is an alkoxy group derived from a fluoroalcohol. Final polymers of structure (1) would be formed by reaction of the final product of Schemes 5 or 6 (PS-(fluoro-tag-DPE)-OH or PS-(fluoro-tag-DPE)-OH, respectively, with a base to form alkoxide macroinitiators followed by the addition of a monomer capable of undergoing ring-opening polymerization with these macroinitiators such as an epoxide, lactam, lactone, or cyclic carbonate to form the second block.

Scheme 5

1) Living PS with perfluoro DPE capping

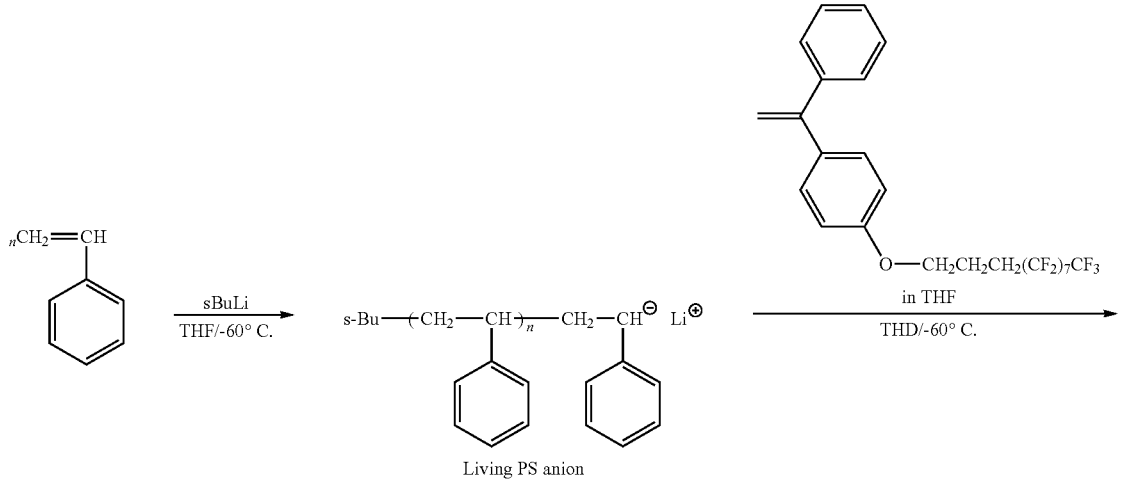

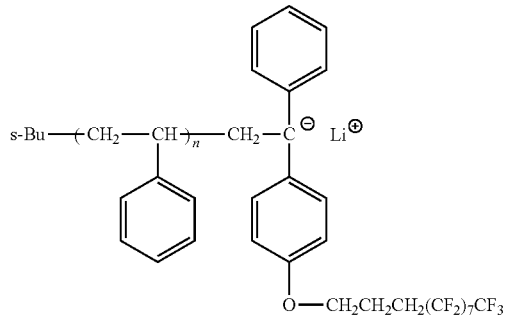

Living PS-DPE cappted anion

2) Ethylene Oxide capping

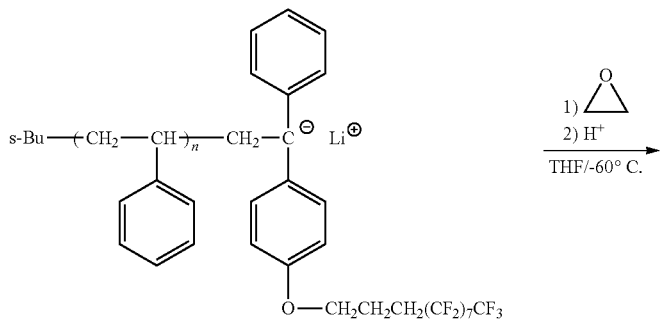

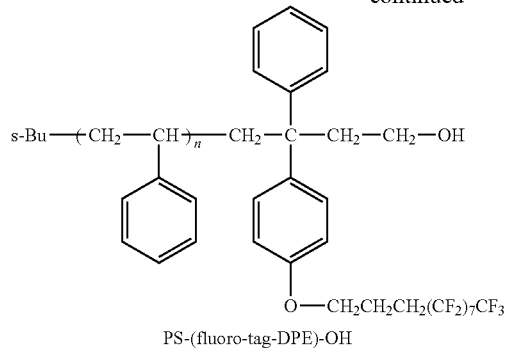
PS-(fluoro-tag-DPE)-OH
Scheme 6
1) Living PS with perfluoro DPE capping
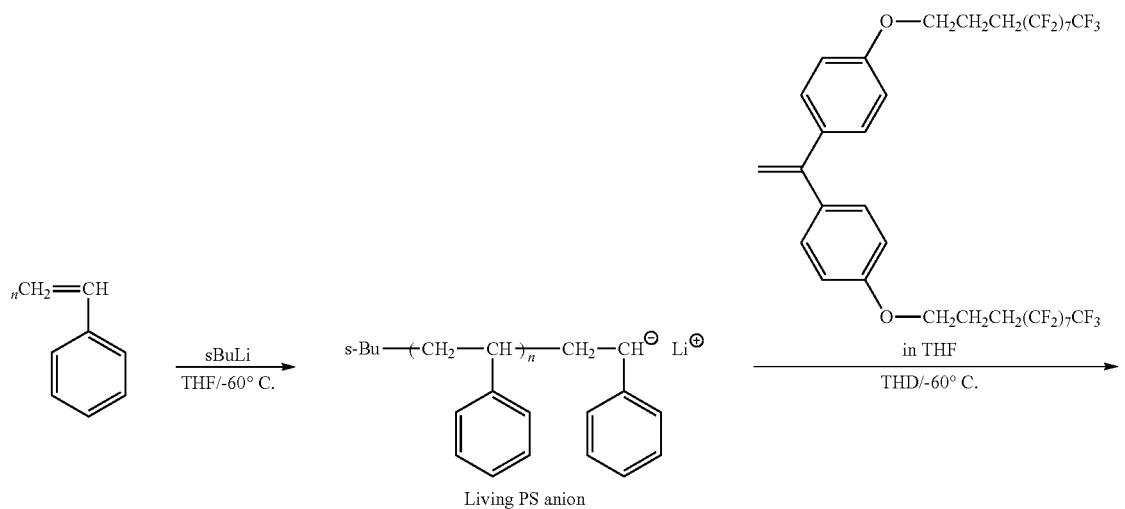
Living PS anion
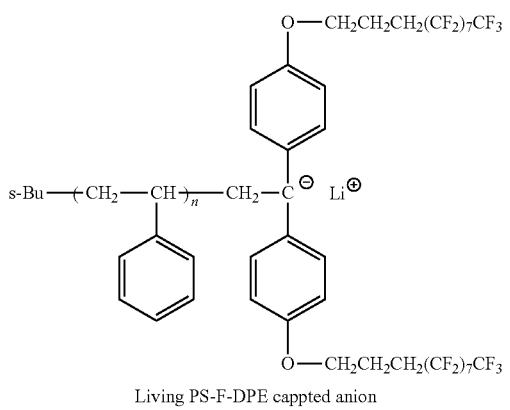
Living PS-F-DPE cappted anion 2) Ethylene Oxide capping

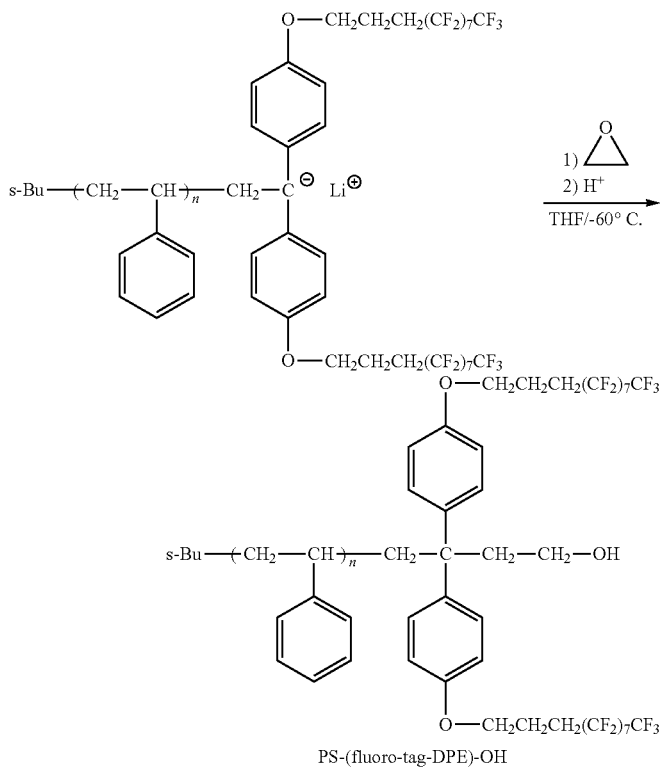

PS-(fluoro-tag-DPE)-OH

The Examples sections show other non-limiting example of polymers having structure (1) which can be prepared using this approach. Using similar approaches block copolymer having structures (12) and (14) shown in FIG. 2 may be prepared.

Apart from the methods described above, the novel block copolymer (1) having a junction group containing a surface active pendant group can also be prepared using other synthetic approaches such as shown in Schemes 7 to 11.

For instance, Scheme 7 shows, in a non-limiting example, the first step in a possible pathway for forming these block copolymers having structure (31) in which an intermediate polymer with an reactive alkoxide end group is formed. This reactive alkoxide end group could then be reacted with a cyclic monomer susceptible to ring-opening polymerization, such as an epoxide, lactam, lactone, or cyclic carbonate to form the second block. In this manner the novel block copolymer having structures (20), (21a) and (21b) shown in FIG. 3 may be formed. The assignment of the variables denoted in Scheme 7 s the same as that in structure (20).

Scheme 7

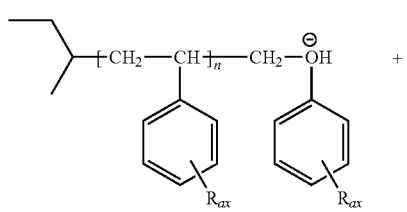 +

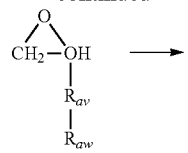

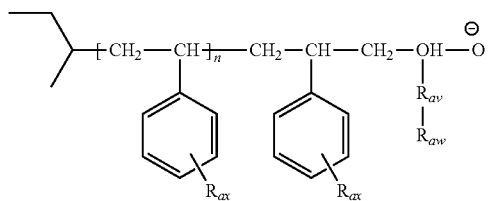

Another approach as shown in Scheme 8 to making the novel block copolymer is to employ an intermediate hydrosilation coupling reaction as shown in Scheme 8 to make structure such as (16). In scheme 8 $R_{af}$, is a $C_1$-$C_8$ linear alkylene moiety, a $C_3$-$C_8$ branched alkylene moiety, a $C_3$-$C_8$ cyclic alkylene moiety $R_{ak}$ and $R_{ai}$ are independently a $C_1$-$C_{10}$ linear alkylene moiety, or a $C_3$-$C_{10}$ branched alkylene moiety, or a $C_3$-$C_{10}$ cyclic alkylene moiety, and all other variables are as previously described for structure (16).

Scheme 8

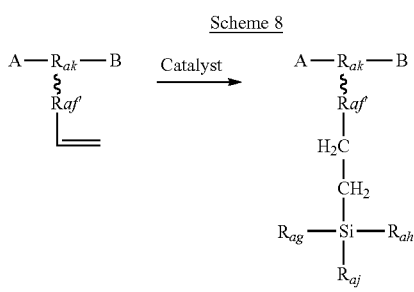

In another method of preparation shown in Schemes 9 and 10, the novel block copolymers having junction groups containing urethane, urea or thio urea functionalities as part of the $X(Y(Z)_b)_a$ junction group with structure (17), (18) with $M_{ab}$ as oxygen or (18) with $M_{ab}$ as sulfur respectively may be made by using coupling chemistry. Various type of coupling reactions forming urethane, urea or thiourea may be employed to form the novel block copolymers. Schemes 9 and 10 show two such non-limiting examples of reaction that may be employed. The assignment of variables in schemes 9 and 10 are the same respectively as denoted previously for structures (17) and (18).

Scheme 9

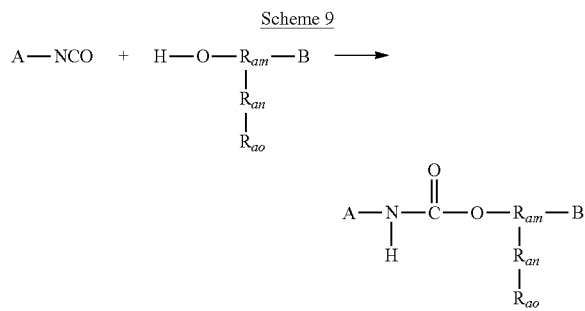

Scheme 10

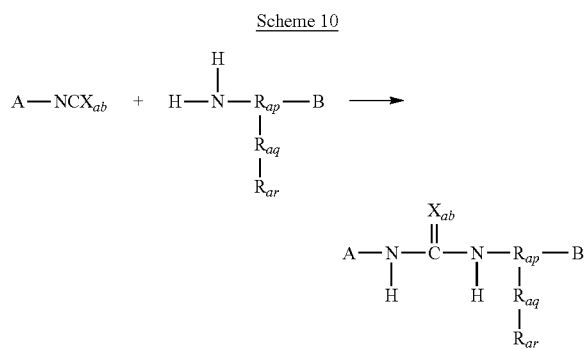

Other coupling reactions may be employed to join two different polymer blocks together through a linking $X(Y(Z)_b)_a$ moiety of structure (1).

For instance, click coupling chemistry could be employed to make novel block copolymers having structure (29) by using a reaction pathway depicted in Scheme 11. The assignments of the variables in Scheme 11 are the same as in structure (19).

Scheme 11

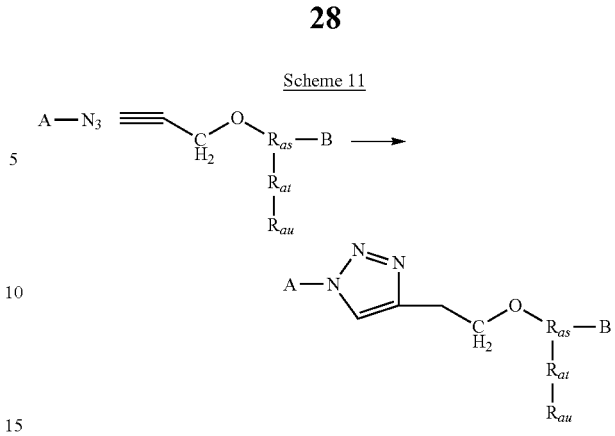

In the block copolymer of structure (1), block A may be a moiety comprised of units derived from an alkylvinyl monomer, an alkyl methacrylate monomer, an alkyl acrylate monomer, a lactone monomer, an epoxide monomer, a lactam monomer, a cyclic carbonate monomer, and block B may be a moiety comprised of repeat units derived from a vinylaryl monomer and further wherein block A and B are phase separable.

Moreover, in another embodiment of this invention, block A may be comprised of units derived from an ethylenically unsaturated polymerizable monomers, which is a vinyl aryl monomer and block B may be comprised of units derived from either an ethylenically unsaturated polymerizable monomer, selected from an acrylate or methacrylate or comprised of units derived from ring-opening polymerization (ROP) of cyclic monomers, selected from lactone, or cyclic carbonates and further wherein block A and B are phase separable.

In another embodiment the block copolymer of structure (1) has one block which is derived from a ring-opening polymerizable monomer. In another embodiment, block A and B may be derived from two different ethylenically unsaturated polymerizable monomers where block A and B are phase separable moieties.

When the polymer block in the novel block copolymer having structure (1) is derived from either a cyclic carbonyl monomer or an ethylenically unsaturated polymerizable monomer it can be a homopolymer or a random copolymer. The cyclic carbonyl monomers can be stereospecific or non-stereospecific.

The formation of polymer blocks containing units derived from cyclic monomers by ring-opening polymerization in the novel block copolymer having structure (1) may be accomplished using techniques described for other types of diblock copolymers in which one of the blocks has been derived by ring-opening polymerization such as disclosed in (U.S. Pat. No. 8,642,086 B2) incorporated herein by reference.

Generally, in structure (1) one block in the diblock copolymer is resistant to plasma etching while the other block or etches very quickly under the same conditions allowing for pattern transfer of the self-assembled pattern formed by coating and annealing the novel polymers of structure (1) into a substrate. This self-assembly is directed on a patterned substrate using either a graphoepitaxy or chemoepitaxy approach.

Ethylenically unsaturated monomers which can be employed to form a polymer block in the novel block polymers having structure (1) may be comprised of units derived from a vinyl aryl, an alkylvinyl, monomer, an alkyl methacrylate monomer, or an alkyl acrylate monomer. A polymer block in the novel block copolymer having structure (1) derived from unsaturated monomers can be a homopolymer or a random copolymer. Ethylenically unsaturated can be stereospecific or non-stereospecific.

Non limiting examples of alkyl vinyl compounds, alkyl acrylate or alkyl methacrylate that can be employed to make a block of the novel block copolymers of this invention are one where the alkyl group is a $C_1$-$C_4$ fluoroalkyl, a $C_1$-$C_{10}$ linear alkyl moiety, a $C_1$-$C_4$ hydroxfluoroalkylene group, a $C_2$-$C_{10}$-alkyloxyalkylene group, a $C_1$-$C_{10}$-hydroxyalkylene group, a $C_3$-$C_{20}$ branched alkyl a $C_3$-$C_{20}$ cyclic alkyl, a $C_2$-$C_{20}$ carboxylalkylene, a $C_3$-$C_{20}$ alkyloxycarboxylalkylene, or a $C_3$-$C_{20}$ alkyloxycarboxyloxyalkylene; other substituents which do not contain a refractory element are possible. The alkyl group in these examples, attached to a carboxyl moiety may also be an acid cleavable group such as a tertiary ester an acetal or ketal capable of releasing a free carboxyl moiety when reacted with a strong acid formed either by a thermal acid generator or a photoacid generator. If the block derived from an alkyl vinyl compound, alkyl acrylate or alkyl methacrylate is to be used as the etch resistant block moiety the alkyl group may be substituted with moieties containing a refractory element such as a $C_3$-$C_{20}$ trialkylsilyl group, a $C_3$-$C_{20}$ trialkylgermanium group, a $C_3$-$C_{20}$ trialkyltin group, or $C_3$-$C_{20}$ trialkyltitanium group.

Non limiting examples of vinyl aryl compounds that can be employed to make an etch resistant block of the novel block copolymers of structure (1) of this invention are unsubstituted styrene, unsubstituted vinyl naphthalenes, unsubstituted vinyl anthracite, unsubstituted vinyl pyrene and the like, or these aryl moieties containing one or more substituents such as a $C_1$-$C_{20}$ alkyl group, a $C_1$-$C_{20}$ hydroxy alkyl group, a $C_2$-$C_{10}$-alkyloxyalkylene group, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, (these acid cleavable moieties capable of releasing respectively a free hydroxyl or free carboxyl moiety when reacted with a strong acid present in a film formed either by a thermal acid generator or a photoacid generator), a fluoroalcohol group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy or a $C_9$-$C_{36}$ tris(trialkylsilyl)silyl group, unsubstituted vinyl naphthalene and vinyl naphthalene substituted with, a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy, a $C_9$-$C_{36}$ tris(trialkylsilyl)silyl group, vinyl anthracene, a vinyl anthracene substituted with a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy, a $C_9$-$C_{36}$ tris(trialkylsilyl)silyl group, vinyl pyrene, a vinyl pyrene substituted with a $C_1$-$C_{20}$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy or a $C_9$-$C_{36}$ tris(trialkylsilyl)silyl group or the like.

In one embodiment of the novel diblock polymer having structure (1) the two polymer blocks are derived from two different ethylenically unsaturated monomers one block of is plasma etch resistant and is derived from either a vinyl aryl compounds, a vinyl alkyl, an alkyl methacrylate or a alkyl acrylate, where the alkyl group contains a refractory element as described above, while the other block etches quickly with the same plasma chemistry such as blocks derived from alkyl vinyl, alkyl acrylate, alkyl methacrylate where the alkyl moiety contains no refractory elements.

In another embodiment of the novel diblock polymer having structure (1) one polymer block is etch resistant and derived either from a vinyl aryl compounds, a vinyl alkyl, an alkyl methacrylate or an alkyl acrylate, where the alkyl group contains a refractory element as described above, while the other block which etches quickly with the same plasma chemistry is derived from ring-opening polymerization of a cyclic monomer, such as an epoxide, a lactone, a lactam, or a cyclic carbonate. These cyclic monomers may contain one or more substituents, which do not contain refractory element, or aromatic rings. Non limiting examples of possible substituents, are hydroxyl groups, a $C_1$-$C_{20}$ alkyl group, a $C_1$-$C_{20}$ hydroxy alkyl group, a $C_2$-$C_{10}$-alkyloxyalkylene group, halide (F, Cl, Br, I), haloalkyl, cyano, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, a carboxyalkylene group, a carboxyalkylene group where the carboxyl group is blocked by an acid labile group, an alkyloxycarbonyl group, an alkylcarbonyl group, a alkyl group containing a double or triple carbon bound and other substituent that do not contain a refractory element.

Specific examples of lactones which may be employed as precursors for one of the blocks in the novel block copolymer of structure (1) are as follows: beta-propiolactone, gamma-butyrolactone,delta-valerolactone, epsilon-caprolactone, beta-butyrolactone, gamma-valerolactone, pivalolactone, 1,5-dioxepan-2-one, 5-(benzyloxy)oxepan-2-one a cyclic carbonate selected from trimethylene carbonate, tetramethylene carbonate, pentamethylene carbonate, glycoside, 7-oxooxepan-4-yl 2-bromo-2-methylpropanoate, 5-phenyloxepan-2-one, 5-methyloxepan-2-one, 1,4,8-trioxa (4,6)spiro-9-undecane, 5-(benzyloxymethyl)oxepan-2-one, 7-oxooxepan-4-yl 3-hydroxy-2-(hydroxymethyl)-2-methyl-propanoate, (Z)-6,7-dihydrooxepin-2(3H)-one, D-lactide, L-lactide, meso-lactide or these materials containing other substitutents such as hydroxyl groups, a $C_1$-$C_{20}$ alkyl group, a $C_1$-$C_{20}$ hydroxy alkyl group, a $C_2$-$C_{10}$-alkyloxyalkylene group, halide (F, Cl, Br, I), haloalkyl, cyano, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, a carboxyalkylene group, a carboxyalkylene group where the carboxyl group is blocked by an acid labile group, an alkyloxycarbonyl group, a alkylcarbonyl group, a alkyl group containing a double or triple carbon bound a refractory element such as a $C_3$-$C_{20}$ trialkylsilyl group, a $C_3$-$C_{20}$ trialkylgermanium group, a $C_3$-$C_{20}$ trialkyltin group, or $C_3$-$C_{20}$ trialkyltitanium group.

Specific examples of carbonates which may be employed as precursors for one of the blocks in the novel block copolymer of structure (1) are as follows: trimethylene carbonate, tetramethylene carbonate, pentamethylene carbonate, 5-methyl-2-oxo-1,3-dioxane-5-carboxylic acid, methyl 5-methyl-2-oxo-1,3-dioxane-5-carboxylate, tert-butyl 5-methyl-2-oxo-1,3-dioxane-5-carboxylate, ethyl 5-methyl-2-oxo-1,3-dioxane-5-carboxylate, 5-methyl-2-oxo-1,3-dioxane-5-carbonyl chloride, benzyl 5-methyl-2-oxo-1,3-dioxane-5-carboxylate, 2-(tetrahydro-2H-pyran-2-yloxy)ethyl 5-methyl-2-oxo-1,3-dioxane-5-carboxylate, 2,2, 3,3,4,4,5,5,6,6,7,7,7-tridecafluoroheptyl 5-methyl-2-oxo-1,3-dioxane-5-carboxylate, 2,2,2-trifluoroethyl 5-methyl-2-oxo-1, 3-dioxane-5-carboxylate, prop-2-ynyl 5-methyl-2-oxo-1,3-dioxane-5-carboxylate, allyl 5-methyl-2-oxo-1,3-dioxane-5-carboxylate, 2-(2-methoxyethoxy)ethyl 5-methyl-2-oxo-1,3-dioxane-5-carboxylate, 3-(tert-butylthio)propyl 5-methyl-2-oxo-1, 3-dioxane-5-carboxylate, 2-(tert-butoxycarbonylamino)ethyl 5-methyl-2-oxo-1,3-dioxane-5-carboxylate, 2-(pyridin-2-yldisulfanyl)ethyl 5-methyl-2-oxo-1, 3-dioxane-5-carboxylate, 4-(hydroxymethyl)benzyl 5-methyl-2-oxo-1,3-dioxane-5-carboxylate, tert-butyl 4-(5-methyl-2-oxo-1,3-dioxane-5-carbonyloxy) piperidine-1-carboxylate, N-benzyl-5-methyl-2-oxo-1,3-dioxane-5-carboxamide, N-isopropyl-N,5-dimethyl-2-oxo-1, 3-dioxane-5-carboxamide, 5,5-dimethyl trimethylene carbonate (5,5-dimethyl-1,3-dioxan-2-one, 5-methyl trimethylene carbonate (5-methyl-1,3-dioxan-2-one), 5,5-diethyl trimethylene carbonate (5,5-diethyl-1,3-dioxan-2-one), and 5-ethyl trimethylene carbonate (5-ethyl-1,3-dioxan-2-one) or any of these materials containing other substitutents such as hydroxyl groups, a $C_1$-$C_{20}$ alkyl group, a $C_1$-$C_{20}$ hydroxy alkyl group, a $C_2$-$C_{10}$-alkyloxyalkylene group, halide (F, Cl, Br, I), haloalkyl, cyano, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, a carboxyalkylene group, a carboxyalkylene group where the carboxyl group is blocked by an acid labile group, an alkyloxycarbonyl group, a alkylcarbonyl group, a alkyl group containing a double or triple carbon bound a refractory element such as a $C_3$-$C_{20}$ trialkylsilyl group, a $C_3$-$C_{20}$ trialkylgermanium group, a $C_3$-$C_{20}$ trialkyltin group, or $C_3$-$C_{20}$ trialkyltitanium group.

Specific examples of epoxides which may be employed as precursors for one of the blocks in the novel block copolymer of structure (1) are as follows: propylene oxide, butylene oxide, ethylene oxide, styrene oxide, glycidyl ether with an R group that is $c_1$-$c_{20}$ hydrocarbon (linear, aliphatic, aromatic, branched, etc., and silicon containing epoxy monomers (e.g. with trimethylsilyl (TMS) pendant groups attached to oxygen or carbon), or any of these materials with other substitutents such as hydroxyl groups, a $C_1$-$C_{20}$ alkyl group, a $C_1$-$C_{20}$ hydroxy alkyl group, a $C_2$-$C_{10}$-alkyloxyalkylene group, halide (F, Cl, Br, I), haloalkyl, cyano, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, a carboxyalkylene group, a carboxyalkylene group where the carboxyl group is blocked by an acid labile group, an alkyloxycarbonyl group, an alkylcarbonyl group, an alkyl group containing a double or triple carbon bound a refractory element such as a $C_3$-$C_{20}$ trialkylsilyl group, a $C_3$-$C_{20}$ trialkylgermanium group, a $C_3$-$C_{20}$ trialkyltin group, or a $C_3$-$C_{20}$ trialkyltitanium group.

Specific examples of lactams which may be employed as precursors for one of the blocks in the novel block copolymer of structure (1): β-propiolactam, γ-butyrolactam, δ-valerolactam, and ∈-caprolactam and these lactams or any of these materials with other substitutents such as hydroxyl groups, a $C_1$-$C_{20}$ alkyl group, a $C_1$-$C_{20}$ hydroxy alkyl group, a $C_2$-$C_{10}$-alkyloxyalkylene group, halide (F, Cl, Br, I), haloalkyl, cyano, a $C_1$-$C_4$ fluoroalkyl, a $C_1$-$C_4$ hydroxfluoroalkylene group, a hydroxyl group, a hydroxyl group blocked with an acid labile group, a carboxyl group, a carboxyl group blocked with an acid labile group, a carboxyalkylene group, a carboxyalkylene group where the carboxyl group is blocked by an acid labile group, an alkyloxycarbonyl group, a alkylcarbonyl group, a alkyl group containing a double or triple carbon bound a refractory element such as a $C_3$-$C_{20}$ trialkylsilyl group, a $C_3$-$C_{20}$ trialkylgermanium group, a $C_3$-$C_{20}$ trialkyltin group, or $C_3$-$C_{20}$ trialkyltitanium group.

In another embodiment the novel diblock polymer having structure (1) one polymer block is etch resistant and derived from either a vinyl aryl compounds or an etch resistant vinyl alkyl, an etch resistant alkyl methacrylate, an etch resistant alkyl acrylate, or an etch resistant substituted cyclic monomer. The etch resistance of the vinyl alkyl, alkyl methacrylate, alkyl acrylate or substituted cyclic monomer is imparted by having the alkyl group or the substituents on the cyclic monomer contain either a refractory element as described above, or contains an aryl substituent, an arylakylene, or an alkylarylene, or a polycyclic alkyl substituent.

In another embodiment pf the novel block copolymer having structure (1), the ethylenically unsaturated monomer which can be employed to form a polymer block A may be comprised of units derived from vinyl aryl monomer and polymer block B may be comprised of units derived from either an ethylenically unsaturated polymerizable monomers, a lactone or a cyclic carbonate and further wherein block A and B are phase separable. In this embodiment the ethylenically unsaturated polymerizable monomers may be selected from an acrylate or methacrylate or comprised on units derived from ring-opening polymerization (ROP) of cyclic monomers, selected from lactone, or cyclic carbonates, wherein the vinyl aryl chosen from the group consisting of styrene, 4-methylstyrene, 4-ethyl styrene, 4-n-propylstyrene, 4-isopropylstyrene, 4-n-butylstyrene, 4-trimethylsilylstyrene, 4-cyclohexylstyrene, 4-cyclopentylstyrene, 3-trimethylsilylstyrene, 4-tertbutylstyrene, 4-isoamylstyrene, 4-methoxystyrene, 4-n-propyloxystyrene, 4-isopropyloxystyrene, 4-n-b utyloxystyrene, 4-cyclohexyloxystyrene, 4-cyclopentyloxystyrene, 4-trimethylsilyloxystyrene, 3-trimethyloxysilylstyrene, 4-tertbutyloxystyrene, 4-isoamyloxystyrene, 4-trifluoromethylstyrene, 3-trifluoromethyistyrene, 4-trifluoromethyloxystyrene, 3-trifluoromethyloxystyrene, 4-tert-butyloxycarbonyloxystyrene, 4-tertbutyloxycarbonylstyrene, 4-tertbutoxycarbonyloxystyrene, 4-vinylbenzoic acid, 4-vinylbenzyl alcohol, methyl 4-vinylbenzoate, α-methylstyrene, 2,4-dimethylstyrene, 2,5-Dimethylstyrene, and 2,4,6-trimethylstyrene, and where the methacrylate, if present, may be selected from the group consisting of methyl methacrylate, ethyl methacrylate, propyl methacrylate, n-butyl methacrylate, isopropy methacrylate, t-butyl methacrylate, cyclohexyl methacrylate, cyclopentyl methacrylate, isobornyl methacrylatehydroxy-1-adamantyl methacrylate, 2-ethyl-2-adamantyl methacrylate, 2-adamantyl methacrylate, ethylcyclopentylmethacrylate, 2-ethyl-, adamantyloxymethyl methacrylate, tricyclo[5,2,1,$0^{2,6}$]deca-8-yl methacrylate, 2-oxoadamantyl methacrylate, 2-ethyl-2-diamantylmethacrylate, 2-carboxyethyl methacrylate methyl ester, 2-carboxyethyl methacrylate ethyl ester, 2-carboxyethyl methacrylate propyl ester, 2-carboxyethyl methacrylate n-butyl ester, 2-carboxyethyl methacrylate tert-butyl ester, 2-carboxyethyl methacrylate adamantly ester, and 2-hydroxylethyl methacrylate, and acrylates if present may be selected form thee group consisting of methyl acrylate, ethyl acrylate, propyl acrylate, n-butyl acrylate, t-butyl acrylate, isopropy acrylate, cyclohexyl acrylate, cyclopentyl acrylate, isobornyl acrylate, hydroxy-1-adamantyl acrylate, 2-ethyl-2-adamantyl acrylate, 2-adamantyl acrylate, ethylcyclopentylacrylate, 2-ethyl-, adamantyloxymethyl acrylate, tricyclo[5,2,1,$0^{2,6}$]deca-8-yl acrylate, 2-oxoadamantyl acrylate, 2-ethyl-2-diamantylacrylate, 2-carboxyethyl acrylate methyl ester, 2-carboxyethyl acrylate ethyl ester, 2-carboxyethyl acrylate propyl ester, 2-carboxyethyl acrylate n-butyl ester, 2-carboxyethyl acrylate tert-butyl ester, 2-carboxyethyl acrylate adamantyl ester, and 2-hydroxylethyl acrylate. Also in this embodiment the lactone may be selected from the group consisting beta-propiolactone, gamma-butyrolactone, delta-valerolactone, epsilon-caprolactone, beta-butyrolactone, gamma-valerolactone, pivalolactone, 1,5-dioxepan-2-one, 5-(benzyloxy)oxepan-2-one, 7-oxooxepan-4-yl 2-bromo-2-methylpropanoate, 5-phenyloxepan-2-one, 5-methyloxepan-2-one, 1,4,8-trioxa(4,6)spiro-9-undecane, 5-(benzyloxymethyl)oxepan-2-one, 7-oxooxepan-4-yl 3-hydroxy-2-(hydroxymethyl)-2-methylpropanoate, (Z)-6,7-dihydrooxepin-2(3H)-one, glycolide, D-lactide, L-racemic lactide, 1:1 D:L forms lactide, and meso-lactide. Also in this embodiment the cyclic carbonate may be selected from the group consisting of trimethylene carbonate, tetramethylene carbonate, pentamethylene carbonate, 5-methyl-2-oxo-1,3-dioxane-5-carboxylic acid, methyl 5-methyl-2-oxo-1,3-dioxane-5-carboxylate, tert-butyl 5-methyl-2-oxo-1,3-dioxane-5-carboxylate, ethyl 5-methyl-2-oxo-1,3-dioxane-5-carboxylate, 5-methyl-2-oxo-1,3-dioxane-5-carbonyl chloride, benzyl 5-methyl-2-oxo-1, 3-dioxane-5-carboxylate, 2-(tetrahydro-2H-pyran-2-yloxy)ethyl 5-methyl-2-oxo-1,3-dioxane-5-carboxylate, 2,2,3,3,4,4,5,5,6,6,7,7,7-tridecafluoroheptyl 5-methyl-2-oxo-1,3-dioxane-5-carboxylate, 2,2,2-trifluoroethyl 5-methyl-2-oxo-1,3-dioxane-5-carboxylate, prop-2-ynyl 5-methyl-2-oxo-1,3-dioxane-5-carboxylate, allyl 5-methyl-2-oxo-1, 3-dioxane-5-carboxylate, 2-(2-methoxyethoxy)ethyl 5-methyl-2-oxo-1,3-dioxane-5-carboxylate, 3-(tert-butylthio)propyl 5-methyl-2-oxo-1, 3-dioxane-5-carboxylate, 2-(tert-butoxycarbonylamino) ethyl 5-methyl-2-oxo-1,3-dioxane-5-carboxylate, 2-(pyridin-2-yldisulfanyl)ethyl 5-methyl-2-oxo-1,3-dioxane-5-carboxylate, 4-(hydroxymethyl)benzyl 5-methyl-2-oxo-1,3-dioxane-5-carboxylate, tert-butyl 4-(5-methyl-2-oxo-1,3-dioxane-5-carbonyloxy)piperidine-1-carboxylate, N-benzyl-5-methyl-2-oxo-1,3-dioxane-5-carboxamide, N-isopropyl-N,5-dimethyl-2-oxo-1,3-dioxane-5-carboxamide, 5, 5-dimethyl trimethylene carbonate (5,5-dimethyl-1, 3-dioxan-2-one, 5-methyl trimethylene carbonate (5-methyl-1,3-dioxan-2-one), 5,5-diethyl trimethylene carbonate (5, 5-diethyl-1,3-dioxan-2-one), and 5-ethyl trimethylene carbonate (5-ethyl-1,3-dioxan-2-one).

In another more specific embodiment of the novel block copolymer, having structure (1) the ethylenically unsaturated monomer which can be employed to form polymer block A may be comprised of units derived from vinyl aryl monomer and block B may be comprised of units derived from either an ethylenically unsaturated and polymer block B is comprised of units derived from either an ethylenically unsaturated polymerizable monomer, or a lactone and further wherein block A and B are phase separable. In this embodiment the ethylenically unsaturated polymerizable monomers may be. In this embodiment the ethylenically unsaturated polymerizable monomer is selected from an acrylate or methacrylate or comprised on units derived from ring-opening polymerization (ROP) of a cyclic carbonates, where the vinyl aryl is chosen from the group consisting of styrene, 4-methylstyrene and 4-ethyl styrene, and where the methacrylate, if present, is selected from the group consisting of methyl methacrylate, ethyl methacrylate, and propyl methacrylate; and the lactone, is selected from the group consisting of beta-propiolactone, gamma-butyrolactone, delta-valerolactone, epsilon-caprolactone, beta-butyrolactone, gamma-valerolactone, pivalolactone, 1,5-dioxepan-2-one, 5-(benzyloxy)oxepan-2-one a cyclic carbonate selected from trimethylene carbonate, tetramethylene carbonate, pentamethylene carbonate, glycoside, 7-oxooxepan-4-yl 2-bromo-2-methylpropanoate, 5-phenyloxepan-2-one, 5-methyloxepan-2-one, 1,4,8-trioxa(4,6)spiro-9-undecane, 5-(benzyloxymethyl)oxepan-2-one, 7-oxooxepan-4-yl 3-hydroxy-2-(hydroxymethyl)-2-methylpropanoate, (Z)-6,7-dihydrooxepin-2(3H)-one, D-lactide, L-lactide, meso-lactide, and further wherein block A and B are phase separable.

The present invention also relates to a composition comprising the novel block copolymer of structure (1) and a solvent. Solvents suitable for dissolving either the novel block copolymer of structure (1) alone or in a composition with other components include propylene glycol monomethyl ether acetate (PGMEA), ethoxyethyl propionate, anisole, ethyl lactate, 2-heptanone, cyclohexanone, amyl acetate, n-butyl acetate, n-amyl ketone (MAK), gamma-butyrolactone (GBL), toluene, and the like. In an embodiment, specifically useful casting solvents include propylene glycol monomethyl ether acetate (PGMEA), gamma-butyrolactone (GBL), or a combination of these solvents. The wt % of the novel block copolymer having structure (1) in a solvent may range from 0.2 to 10 wt %. In another embodiment the range may be from 0.5 to 10 wt %. In yet another embodiment the range may be 0.5 to 5 wt %. In yet another more specific embodiment the range may be 0.8 to 1.2 wt %

Solutions containing the novel block copolymer of structure (1) can further comprise additional components and/or additives selected from the group consisting of: inorganic-containing polymers; additives including small molecules, inorganic-containing molecules, surfactants, photoacid generators, thermal acid generators, quenchers, hardeners, cross-linkers, chain extenders, and the like; and combinations comprising at least one of the foregoing, wherein one or more of the additional components and/or additives co-assemble with the block copolymer to form the block copolymer assembly.

In another aspect of this invention the novel composition comprised of the first block copolymer of structure (1) may further contain a second different block copolymer block copolymer of structure (1). In this aspect of the invention the second block copolymer different from the first block copolymer may be present from 5 to 50 wt % of total solids.

In a further embodiment of the novel composition, the composition comprises the block copolymer of structure (1) and a second block copolymer which does not have a junction group but comprises blocks derived from either ethylenically unsaturated monomers or cyclic monomers as described above for the novel block copolymers. A specific example of a suitable second diblock copolymer containing a high etch resistant block and a highly etchable block would be the block copolymer poly(styrene-b-methylmethacrylate). Typically, the block copolymers suitable for being used in these inventions have a weight-averaged molecular weight ($M_w$) in the range of about 3,000 to about 500,000 g/mol and a number averaged molecular weight ($M_n$) of about 1,000 to about 60,000 and a polydispersity ($M_w/M_n$) (PD) of about 1.01 to about 6, or 1.01 to about 2 or 1.01 to about 1.5. Other specific non-limiting examples of other diblock copolymers not containing a junction group that are may be useful as additional components are poly(styrene-b-methyl methacrylate), poly(styrene-b-butadiene), poly(styrene-b-isoprene), poly(styrene-b-methyl methacrylate), poly(styrene-b-alkenyl aromatics), polystyrene-b-(ethylene-propylene)), poly(styrene-b-t-butyl (meth)acrylate), poly(styrene-b-tetrahydrofuran), poly(styrene-b-ethyleneoxide), poly(styrene-b-dimethylsiloxane), poly(methyl methacrylate-b-dimethylsiloxane), and poly(methylmethacrylate-b-4-vinylpyridine)). All these polymeric materials share in common the presence of at least one block which has repeat units resistant to plasma etching techniques typically employed in manufacturing IC devices, and at least one block which etches rapidly under these same conditions or that can be removed by chemical or photochemical processes. This allows for the directed self-assembled polymer to pattern transfer onto the substrate to affect via formation.

In this aspect of the invention the second block copolymer may be present from 1 to 20 wt %, or more preferentially from 5 to 10 wt % of total solids.

A further embodiment of this novel composition is where it further comprises a homopolymer as an additional component. This homopolymer may be a homopolymer derived from any of the ethylenically unsaturated monomers or cyclic monomer previously described above as suitable precursors for the block of the novel block copolymer having structure (1). Such a homopolymer component may be present in a composition in a level range from 0.5 to 10 wt % or more specifically 1 to 5 wt % of solids.

The molar ratio in the novel block copolymer of the repeat unit in block A to that of the repeat unit in block B is between 1.2 to 0.8 and further as described above in all its possible embodiments.

The present invention relates to forming patterns using the novel composition in processes comprising directed self assembly of the novel block copolymer. Any process that comprises the step of directed self assembly of the novel block copolymer may be used.

The composition comprising the novel block copolymer may be used to form films by applying the novel composition a substrate by processes such as spin-casting, dip-coating, doctor blading, spraying, or any other known processes. Films of the block copolymer can have a thickness of 1-1000 nm and more particularly 1-130 nm. It is particularly thicknesses film equal or greater than 25 nm in particular in the thickness range of 25 to 125 nm. Films can be optionally annealed to promote self-assembly and remove defects. Annealing processes include thermal annealing, thermal gradient annealing, solvent vapor annealing, thermal solvent vapor annealing and the like. Thermal annealing can be carried out at a temperature above the glass transition temperature of the block copolymer and below the thermal decomposition temperature of the block copolymer. Thermal annealing may be carried out from a temperature of room temperature to about 300° C. Thermal annealing can be performed for a period of about 10 sec to about 100 hours, more particularly 30 seconds to 1 hour.

The block copolymers of the present invention can form self-assembled domains with various morphologies including lamella, cylinders, and spheres. The size (e.g. width) of these domains may be from 1 nm to 100 nm, from 2 nm to 30 nm, or more particularly from 3 nm to 20 nm. The present invention further relates to novel processes which employ the novel block copolymer of structure (1). One of the unexpected results imparted by the novel block copolymers of structure (1) is that, when they are coated on a substrate and made to undergo self-assembly, the underlayer does not need to be non-preferential (e.g. neutral). This is due to the larger process latitude (with respect to the underlayer surface affinity) for perpendicular alignment of the novel block copolymer domains imparted by the presence of the surface active junction group in structure (1). Another unexpected results imparted by the novel block copolymers of structure (1) is that they afford block copolymer domains with perpendicular alignment relative to the substrate for much thicker block copolymer films than analogous block copolymers without the novel surface-active junction group. Specifically, ranges from 25 nm to 125 nm are possible.

As a non-limiting example of how this may be used in pattern transfer, when the novel block copolymer is coated on an underlayer (i.e. substrate) and further processed the block copolymer forms microphase-separated domains that comprise cylindrical microdomains oriented perpendicular to the underlayer surface. This is because neither domain has any preference to associate with the underlayer, and which further provide parallel line/space patterns in the block copolymer assembly. The domains, so oriented, are thermally stable under further processing conditions. Thus, after forming a coating layer of the novel block copolymer on an underlayer, and causing it to self-assemble by baking and/or annealing, the domains of the block copolymer will form on and remain perpendicular to the underlayer surface.

One of the domains may be selectively removed in the presence of the other domain to generate an etched domain pattern. This selective removal may be accomplished by wet or dry processes. In one example wet or plasma etching could be used with optional UV exposure. Wet etching could be with acetic acid. Standard plasma etch process, such as a plasma comprising oxygen may be used; additionally argon, carbon monoxide, carbon dioxide, $CF_4$, $CHF_3$, may be present in the plasma. In the case of a thermally decomposable polymer block, the selective removal may be accomplished by a thermal bake. In another example, one of the block copolymer domains may be selectively modified after self-assembly to increase its etch resistance. For example, etch resistant metal or inorganic species may be introduced by chemical infiltration from solution or vapor. Domains or functional groups may be selectively reacted with reactive compounds such as silanes or silyl chlorides. Alternatively, cycles of atomic layer deposition (e.g. sequential infiltration synthesis) can be used to infiltrate etch-resistant materials into one domain. After modification, wet or dry etch processes may be used to remove the less resistant domain.

After selective removal process, the resulting etched domain pattern can be further pattern transferred in the substrate layers. These self-assembled block copolymer patterns are transferred into the underlying substrate using known techniques.

In some cases, it may be advantageous to invert the tone of the pattern prior to transfer into the substrate or after transfer into a layer of the substrate. This may be accomplished by standard tone-inversion processes such as backfilling an organic pattern with an etch-resistant spin-on dielectric tone-inversion material.

FIGS. 4a and b show respectively a schematic depiction of the novel block copolymer of structure (1) and a schematic depiction of its self assembly. Specifically, FIG. 4a shows a schematic depiction of the novel block copolymer. FIG. 4b shows a schematic depiction of the block copolymer depicted schematically in FIG. 4a when coated on an underlayer (i.e. substrate) undergoing two type of self-assembly. In the top view of FIG. 4a the film of the block copolymer forms domains which orient to form vertically oriented lamellae. In the bottom view of FIG. 4b these domains in the film orient to form vertically oriented cylinder domains.

Figure 5:
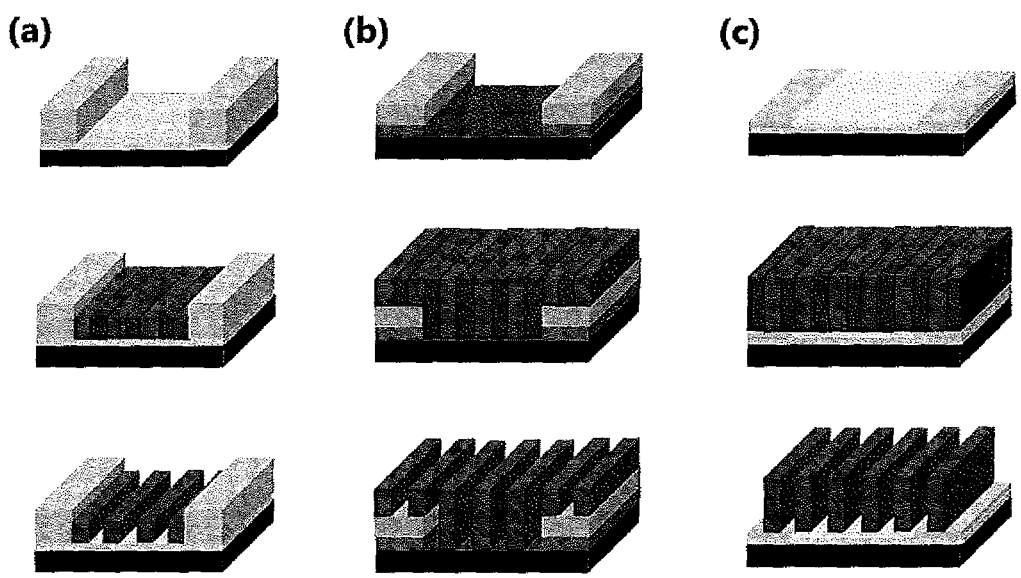
Figure 6:
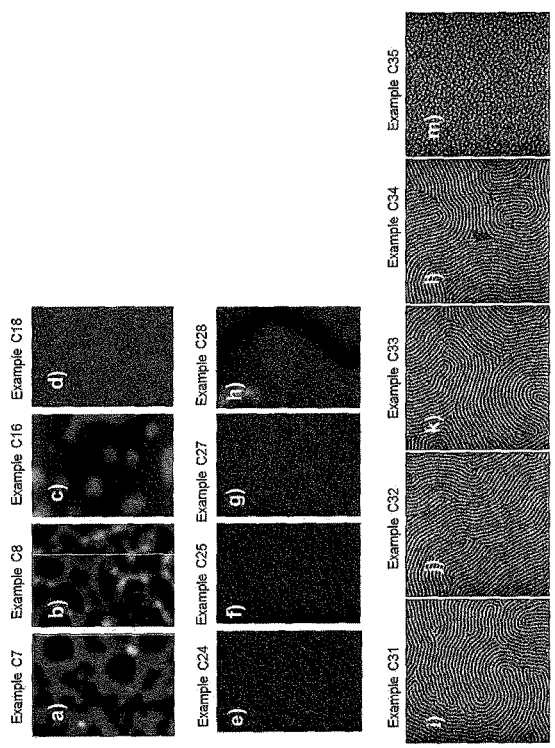
Figure 8:
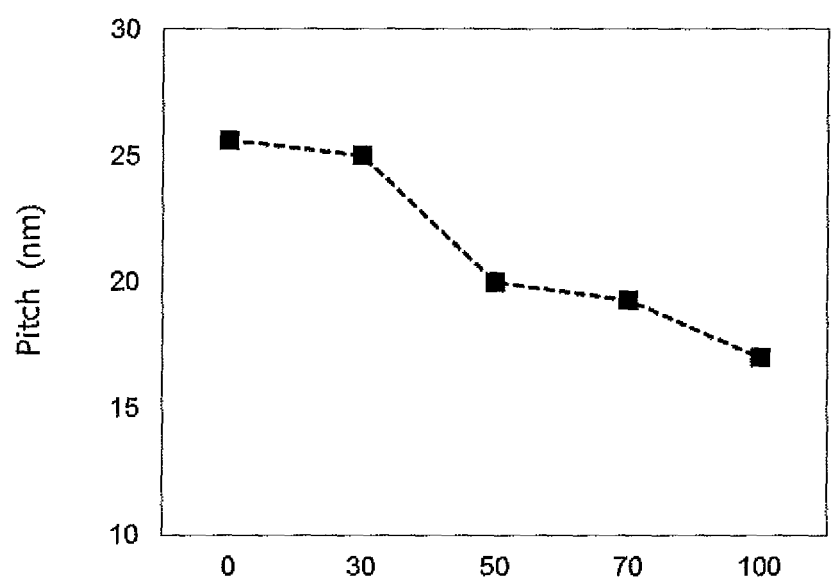

FIG. 5a-c shows schematics of the directed self-assembly (DSA) of the novel block copolymer of structure (1). Specifically FIG. 5a shows graphoepitaxy DSA where most of the novel block copolymer is confined within the recessed region in the topographical prepattern, the domains of this novel block copolymer subdivide the recessed region. FIG.

5b shows coating of this novel block copolymer over and within shallow, periodic topographical prepattern where the domains of this block copolymer are aligned to the topographical prepattern. Finally, FIG. 5c shows chemoepitaxial DSA where a film of this novel block copolymer is coated over the chemical prepattern comprised of preferential and non-preferential regions (such as the non-limiting example of a neutral region) with domains of this novel block copolymer aligned to the wetting features. Unlike, conventional block polymers, the inventive materials of structure (1) with a surface active junction group, do not require the presence of substantially non-preferential regions and therefore provide the wider process latitude with respect to underlayer surface affinity. That is, these novel materials can form domains which orient perpendicular to the substrate during self-assembly for a wider range of underlayer surface property. This can enable more robust SA performance across surfaces with imperfect or non-uniform surface properties, for example. The imperfect or non-uniform surface properties may be the result of damage, contamination, imperfect deposition/grafting conditions, impurities, poor compositional uniformity of the underlayer material, or other reasons.

In the above processes, and the following inventive processes employing the novel composition comprised of the novel block copolymer of structure (1), other type of substrate may be used. As an example, a substrate which has a coating of high carbon underlayer and a silicon antireflective coating may be used as a substrate. The high carbon underlayer can have coating thickness of about 20 nm to about 2 microns. Over this is coated a silicon antireflective coating of about 10 nm to about 100 nm. In instances where an orientation of the self-assembled cylinder of the novel block copolymer perpendicular to the substrate is desired a neutral layer may be employed.

This invention may be employed also in a variety of other substrates such as those prepared by chemically vapor deposition (CVD), physical vapor deposition (PVD) and atomic layer deposition (ALD). The preparation of substrates using these CVD and PVD is discussed in the following reference: "HANDBOOK OF THIN-FILM DEPOSITION PROCESSES AND TECHNIQUES, Principles, Methods, Equipment and Applications, Second Edition, Edited by Krishna Seshan, Intel Corporation, Santa Clara, Calif., Copyright© 2002 by Noyes Publications, Library of Congress Catalog Card Number: 2001135178, ISBN: 0-8155-1442-5, Noyes Publications/William Andrew Publishing, 13 Eaton Avenue Norwich, N.Y. 13815, Chapter 1 title: Deposition Technologies and Applications: Introduction and Overview, page 11-page 43, Chapter 1 Authors: Werner Kern and Klaus K. Schuegraf." The preparation of substrates by ALD is described in the following reference: "Chemical Review 2010, 110, page 111-131."

In another aspect of this invention the novel composition comprised of the block copolymer having structure (1) is employed in a method for vertically orienting first and second block copolymer domains over an unpatterned substrate using a layer of a block copolymer having a periodicity of Lo comprising steps a) and b); wherein, a) forming a coating layer of a block copolymer from the novel composition on said unpatterned substrate; and
b) annealing the layer of the block copolymer to generate a non-zero positive integer number of first and second block copolymer domains, vertically oriented on said unpatterned substrate.

In this inventive method the unpatterned substrate may be selected from the group consisting of a polymer brush layer, a cross-linked polymer layer, a self-assembled monolayer, a layer of anti-reflection coating, a layer deposited by chemically vapor deposition (CVD), a layer of carbon, a layer deposited by physical vapor deposition (PVD), a layer deposited by atomic layer deposition (ALD).

In another aspect of this invention the novel composition comprised of the block copolymer having structure (1) is employed in a method of vertically orienting first and second block copolymer domains over a first patterned substrate where the height of topography of the pattern on the substrate is at least 0.7 times Lo and aligning the domains with the pattern, using a coating comprised of a block copolymer having a periodicity of $L_O$ comprising steps a) and b); wherein, a) forming a coating layer of the block copolymer with a junction group with the composition of the aforementioned novel composition comprised of the block copolymer having structure (1) on said first topographical substrate wherein the average thickness of the coating layer of the block copolymer is less than the height of the topography of the first topographical substrate, wherein the block copolymer layer is laterally confined by the topography; and,
b) annealing the block copolymer layer to generate first and second block copolymer domains, which are vertically oriented on said first patterned substrate, and confined within the recessed region.

In this aspect of the invention the first patterned substrate is a topography-forming material over an underlayer where the topography-forming material may be selected from the group consisting of resist materials, a cross-linked polymer layer, a layer of anti-reflection coating, a layer deposited by chemical vapor deposition (CVD), a layer deposited by physical vapor deposition (PVD), a layer deposited by atomic layer deposition (ALD), and further where the underlayer is selected from the group consisting of a polymer brush layer, a cross-linked polymer layer, a self-assembled monolayer, a layer of anti-reflection coating, a layer deposited by chemical vapor deposition (CVD), a layer deposited by physical vapor deposition (PVD), a layer deposited by atomic layer deposition (ALD).

Furthermore, in this aspect of the invention the resist material may be selected from the group consisting of i-line photoresists, g-line photoresists 284 nm photoresists, 193 nm photoresist, Extreme Ultraviolet photoresists, and electron beam photoresists. Another embodiment is where the antireflective coating material is selected from the group consisting of bottom antireflective coatings, silicon antireflective coatings, and titanium antireflective coatings.

In another aspect of this invention the novel composition comprised of the block copolymer having structure (1) is employed in a method of vertically orienting, first and second block copolymer domains with a periodicity of Lo over a second patterned substrate having a topographical pattern of which the height of topography is larger than 0.7 times Lo and a pitch $P_1$ where the pitch $P_1$ is a non-zero positive integer multiplied by Lo, and aligning the domains with the pattern, using the novel coating comprised of a block copolymer comprising steps a) and b); wherein, a) forming a coating layer from block copolymer with a surface-active junction group with aforementioned the composition of the novel composition comprised of the block copolymer having structure (1) on said second patterned substrate, where the thickness of the coating layer of the block copolymer is more than the height of the topography of the second patterned substrate; and, b) annealing the block copolymer layer to generate a non-zero positive integer number of first and second block copolymer domains vertically oriented on said second patterned substrate and aligning them to the second patterned substrate where the sum of vertically oriented domains is equal or larger than the pitch $P_1$ the of topographical pattern.

In this aspect of the invention the first patterned substrate is prepared by treating topographical organic features on top of inorganic layer with plasma which selectively trims the organic features and modifies the exposed surface region of the inorganic layer. In a further aspect of this embodiment the material of topographical organic features is selected from the group consisting of patterned i-line photoresists, g-line photoresists 248 nm photoresists, 193 nm photoresist, Extreme Ultraviolet photoresists, and electron beam photoresists over a thin underlayer. In a final aspect of this embodiment the underlayer may be an antireflective coating, or an inorganic layer material is selected from silicon antireflective coatings, or titanium antireflective coatings.

In another aspect of this invention the novel composition comprised of the block copolymer having structure (1) is employed in a method of vertically orienting first and second block copolymer domains over a substrate having a surface chemical prepattern having a pitch $P_2$, where the pitch $P_2$ is a non-zero positive integer multiplied by Lo and aligning the domains with the prepattern, using a coating comprised of a block copolymer where the block copolymer has a periodicity of Lo comprising steps a) and b)

a) forming a coating layer of the block copolymer with a surface-active junction group with the novel composition containing the block copolymer of structure (1) on the substrate having a surface chemical prepattern, b) annealing the block copolymer layer to generate vertically oriented first and second block copolymer domains aligned with the substrate having a surface chemical prepattern having a pitch $P_2$.

In this aspect of the invention the substrate having a surface chemical prepattern is comprised of alternating preferential wetting regions and orientation control regions where the sum of the width of preferential wetting regions and the width of the orientation control region is equal to the prepattern pitch $P_2$, where the materials used in the orientation control region supports vertical orientation of the block copolymer domains, and the preferential wetting region has a lower interfacial energy to one of the block copolymer domain compared to the other block copolymer domain.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

I. Synthesis of Block Copolymers and Relevant Materials
I.0 Instruments and Chemicals Chemicals not specified in Table 1 were obtained from the Aldrich Chemical Company (Sigma-Aldrich Corp St. Louis, Mo., USA) and used as received. Unless otherwise indicated spinning and baking of films was done with Laurel WS-650-23B spin coater and a Tokyo Electron Ltd. Clean Track ACT-8. Nordson (300 Nordson Dr. M/S 47 Amherst, Ohio 44001 U.S.A. MARCH etcher was used for plasma etching of non-Si containing domain. Top down and cross section images were respectively taken on an AMAT (Applied Materials, Inc. 3050 Bowers Avenue P.O. Box 58039 Santa Clara, Calif. 95054-3299 U.S.A.) NanoSEM 3D and a Hitachi (Hitachi High Technologies America Inc. 10 North Martingale Road, Suite 500 Schaumburg, Ill. 60173-2295) S-5500. Table 1 gives a list of abbreviations for compounds and solvents used. In this Table "Sigma-Aldrich" refers to the "Sigma-Aldrich Corporation" located at 3050 Spruce St., St. Louis, Mo. 63103; "Synquest" refers to "SynQuest Laboratories, Inc." located at 13201 Rachael Blvd, Rt 2054, "Exfluor" refers to "Exfluor Research Corporation" located at 2350 Double Creek Dr, Round Rock, Tex. 78664, "Perstorp Chemicals" refers to "Perstorp Specialty Chemicals" located at Neptunigatan 1, 211 20 Malmö, Sweden, "Richman Chemicals" refers to "Richman Chemicals Custom Solutions" located at 768 North Bethlehem Pike, Pa. 19002. The coating SiArc solution (Shin Etsu SHB A-940 L35) was obtained from the Shin-Etsu Chemical Co., Ltd (Tokyo 100-0004, Japan).

The coating solutions, AZEMBLY™ NLD-089, AZEMBLY™ NLD-208D AZEMBLY™ NLD-128, and AZEMBLY™ NLD-127 were obtained from AZ Electronic Materials (Somerville, N.J.).

TABLE 1

| ABBREVIATION | DESCRIPTION | SUPPLIER |
| --- | --- | --- |
| DBU | 1,8-Diazabicyclo[5,4,0]undec-7-ene | Sigma Aldrich |
| DCM | Dichloromethane | Sigma Aldrich |
| AcCl | Acetyl Chloride | Sigma Aldrich |
| TEA | Triethylamine | Sigma Aldrich |
| BriBr | α-Bromoisobutyryl bromide | Sigma Aldrich |
| THF | Tetrahydrofuran | Sigma Aldrich |
| MeOH | Methanol | Sigma Aldrich |
| ACN | Acetonitrile | Sigma Aldrich |
| S | Styrene | Sigma Aldrich |
| EtAc | Ethyl acetate | Sigma Aldrich |
| Tol | Toluene | Sigma Aldrich |
| C8OL | 1H,1H-Perfluoro-1-heptanol | Synquest |
| C10GOL | Fluorinated triethylene glycol monobutyl ether | Exfluor |
| C9OL | 1H,1H-Perfluoro-1-nonanol | Synquest |
| C4OL | 2,2,3,3,4,4,4-Heptafluoro-1-butanol | Sigma Aldrich |
| BISMPA | Dimethylol propionic acid | Perstorp Chemicals |
| ODBr | Octadecyl bromide | Sigma Aldrich |
| Chol | Cholesterol | Sigma Aldrich |
| TMC | Trimethylene carbonate | Richman Chemicals |
| CuBr | Copper (I) bromide | Sigma Aldrich |
| PMDETA | N,N,N',N',N''-pentamethyl-diethylenetriamine | Sigma Aldrich |
| Anisole | Anisole | Sigma Aldrich |
| Si Gel | Silica Gel | Sigma Aldrich |
| DCC | N,N'-Dicyclohexylcarbodiimide | Sigma Aldrich |
| DMAP | 4-Dimethylaminopyridine | Sigma Aldrich |

Acetal-protected BISMPA monomer (AcBISMPA) (21) was prepared as previously reported (ACS Macro Letters, 2(1), 19-22; 2013).

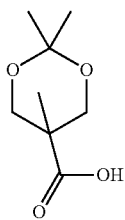

(21)

Trimethyl silyistyrene (TMSS) (22) was synthesized as previously reported (Macromolecules 2009, 42, 4614-4621).

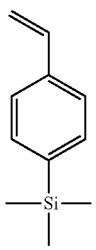

(22)

I-1. Synthesis of Block Copolymers with Surface-Active Junction Groups (JBCPs) Using Macroinitiators Prepared by Atom Transfer Radical Polymerization (ATRP)

Example 1

Synthesis of ATRP and ROP Initiator with Pendant Group C4OL

Scheme 12

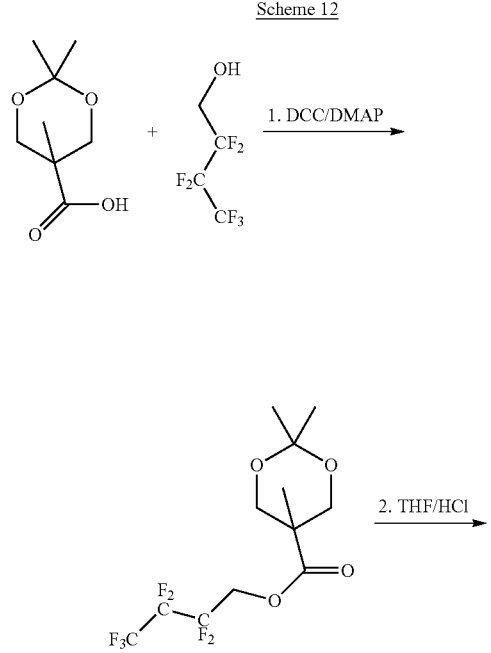

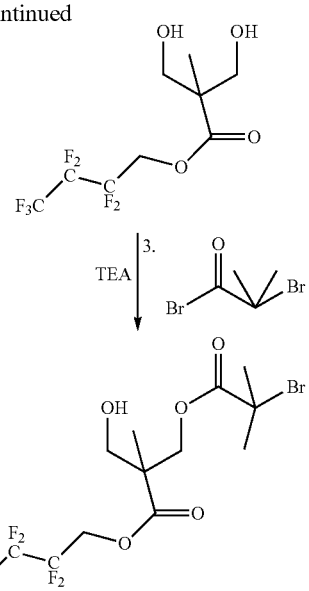

To a 100 ml round bottom flask (RBF) equipped with a magnetic stir bar, 1.0 (5.74 mm) of AcBISMPA, 1.15 g (5.74 mm) of C4OL, 0.7 g (5.74 mm) of DMAP were added to 30 ml of dry DCM. The reaction was stirred under $N_2$ for 10 min at room temperature after which point 1.18 g (5.74 mm) of DCC in 10 ml of DCM was added drop wise over 10 minutes. The reaction was stirred for 24 hours and was stopped the solution was filtered to remove the dicyclohexylurea. DCM was evaporated under vacuum and the resulting crude product was purified by passing through a silica gel column with Hexane: EtOAc 90:10 as the eluent to obtain the acetal-protected C4OL ester. The product was confirmed by $^1$H NMR and $^{19}$F NMR. $^1$H NMR (400 MHz, CDCl$_3$ 23° C., ppm): 1.21 (3H), 1.46 (6H), 3.71 (2H), 4.21 (2H), and 4.69 (2H). $^{19}$F NMR (400 MHz, CDCl$_3$ 23° C., ppm): −81.00, −120.48, −127.79.

In the next step, 1.5 g of the intermediate was added to 15 ml of THF in a 250 ml RBF equipped with a magnetic stir bar. To this solution, 20 ml of 1 M HCl was added and the reaction was allowed to stir for 24 hours at room temperature. After this time, THF was removed under vacuum and 50 ml of EtOAC was added to the acidic water solution. The organic layer was washed with saturated $K_2CO_3$ and brine and collected over magnesium sulfate. Pure diol was collected by filtering the magnesium sulfate and evaporating the EtOAc under vacuum. The product was confirmed by $^1$H NMR. $^1$H NMR (400 MHz, CDCl$_3$ 23° C., δ): 1.13 (3H), 2.68 (2H), 3.80 (2H), 3.96 (2H), and 4.70 (2H).

To obtain the ATRP and ROP initiator with pendant C4OL chain, the 1.0 g (3.16 mm) diol from above step was dissolved in 20 ml of DCM in a 100 ml RBF equipped with a magnetic stir bar. To this solution, 0.32 g (3.16 mm) of TEA was added and the reaction mixture was stirred under $N_2$ flow for 10 min at room temperature. 0.54 g (2.37 mm) of BriBr in 10 ml of DCM was then added dropwise over 30 min. The resulting mixture was further stirred at r.t. for 24 hours at which point the reaction was stopped by filtering the solution to remove the TEA.HCl salt. The filtrate was collected and washed with 1× saturated $K_2CO_3$, 1× 1 M HCl, 1× deionized water and 1× brine solution. The organic layer was collected over magnesium sulfate and the crude product was obtained by filtering the DCM solution and evaporating the DCM layer under vacuum. Pure ATRP and ROP initiator was pendant C4OL chain was obtained by purifying the crude product with column chromatography using Si gel column with Hex: EtOAC 90:10 as the eluant. The product was confirmed by $^1$H NMR and $^{19}$F NMR. $^1$H NMR (400 MHz, CDCl$_3$ 23° C., ppm): 1.32 (3H), 1.94 (6H), 2.31 (1H), 3.80 (2H), 3.36-3.46 (2H), and 4.67 (2H). $^{19}$F NMR (400 MHz, CDCl$_3$ 23° C., ppm): −80.80, −120.45, −127.57.

Example 2

Synthesis of ATRP and ROP Initiator with Pendant Group C8OL

The same reaction conditions used for Example 1 were employed, expect C8OL was used instead of C4OL. In the first step, the product acetal protected C8OL ester was confirmed by $^1$H NMR. $^1$H NMR (400 MHz, CDCl$_3$ 23° C., ppm): 1.21 (3H), 1.46 (6H), 3.71 (2H), 4.21 (2H), and 4.69 (2H). In the next step the product was confirmed by $^1$H NMR. $^1$H NMR (400 MHz, CDCl$_3$ 23° C., δ): 1.08 (3H), 2.54 (2H), 3.77 (2H), 3.94 (2H), and 4.51 (2H). In the final step the ATRP and ROP initiator with pendant C8OL group was confirmed by $^1$H NMR and $^{19}$F NMR. $^1$H NMR (400 MHz, CDCl$_3$, 23° C., ppm): 1.28 (3H), 1.94 (6H), 2.36 (1H), 2.53 (2H), 3.77 (2H), 4.33 (1H), and 4.45-4.50 (3H).

Example 3

Synthesis of ATRP and ROP Initiator with Pendant Group C9OL

The same reaction conditions used for Example 1 were employed, expect C9OL was used instead of C4OL in the same molar amount. In the first step, the acetal-protected C9OL ester was confirmed by $^1$H NMR. $^1$H NMR (400 MHz, CDCl$_3$ 23° C., ppm): 1.21 (3H), 1.46 (6H), 3.69 (2H), 4.20 (2H), and 4.71 (2H). In the next step the diol was confirmed by $^1$H NMR. $^1$H NMR (400 MHz, CDCl$_3$ 23° C., δ): 1.14 (3H), 3.81 (2H), 3.97 (2H), and 4.71 (2H). In the final step to obtain the ATRP and ROP initiator with pendant C9OL chain, the by product was confirmed by $^1$H NMR and $^{19}$F NMR. $^1$H NMR (400 MHz, CDCl$_3$ 23° C., ppm): 1.32 (3H), 1.94 (6H), 2.24 (1H), 3.80 (2H), 4.37-4.46 (2H), 4.69 (2H). $^{19}$F NMR (400 MHz, CDCl$_3$ 23° C., ppm): −199.41, −121.93, −122.72, −123.21, and −126.11.

Example 4

Synthesis of ATRP and ROP Initiator with Pendant Group C10GOL

The same reaction conditions as for Example 1 were employed, expect C10GOL was used instead of C4OL. In the first step the C10GOL acetal protected ester was confirmed by $^1$H NMR. $^1$H NMR (400 MHz, CDCl$_3$ 23° C., ppm): 1.21 (3H), 1.46 (6H), 3.71 (2H), 4.23 (2H), and 4.57 (2H). In the next step the pure diol was confirmed by $^1$H NMR. $^1$H NMR (400 MHz, CDCl$_3$ 23° C., δ): 1.12 (3H), 2.63 (2H), 3.81 (2H), 3.95 (2H), and 4.58 (2H). In the final step to obtain the ATRP and ROP initiator with pendant C10GOL chain, the product was confirmed by $^1$H NMR and $^{19}$F NMR. $^1$H NMR (400 MHz, CDCl$_3$ 23° C., ppm): 1.32 (3H), 1.94 (6H), 2.24 (1H), 3.80 (2H), 4.37-4.46 (2H), 4.69 (2H). $^{19}$F NMR (400 MHz, CDCl$_3$ 23° C., ppm): −199.41, −121.93, −122.72, −123.21, and −126.11.

Example 5

Synthesis of ATRP and ROP Initiator with Pendant Group ODBr

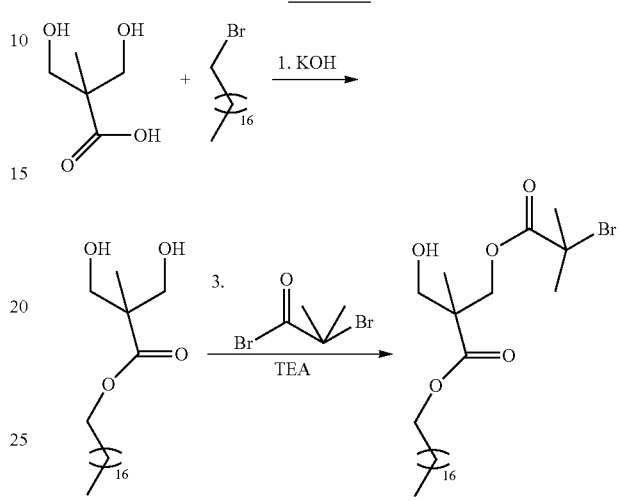

Scheme 13

To a 100 ml RBF equipped with a magnetic stir bar and a condenser, 2.0 g (14.91 mm) of BISMPA, 5.22 g (15.65 mm) of ODBr, 1.0 g (17.90 mm) of KOH and 50 ml of DMF were taken. The reaction was stirred at 100° C. for 16 hours. The reaction was then cooled to room temperature and DMF was removed under vacuum. 100 ml of EtOAc was added to the remaining compound and was rinsed 2× with 100 ml deionized water and 1× with 50 ml saturated brine solution. The organic layer was dried over magnesium sulfate and the crude solids were obtained by evaporating the solvent under vacuum. Pure diol with octadecyl pendant group was obtained by passing the compound through a Si gel column with Hexane:EtOAc 60:40 as the eluent. The product was confirmed by $^1$H NMR.

$^1$H NMR (400 MHz, CDCl$_3$ 23° C., ppm) 0.9 (3H), 1.08 (3H), 1.19-1.46 (30H), 1.69 (2H), 2.83 (2H), 3.76 (2H), 3.92 (2H), 4.19 (2H).

To obtain the ATRP and ROP initiator with pendant octadecyl chain, the 1.5 g (3.88 mm) diol from the above step was dissolved in 30 ml of DCM in a 250 ml RBF equipped with a magnetic stir bar. To this solution, 0.78 g (7.76 mm) of TEA was added and the reaction mixture was stirred under N$_2$ flow for 10 min at room temperature. 0.89 g (3.88 mm) of BriBr in 10 ml of DCM was then added dropwise over 30 min. The resulting mixture was further stirred at r.t. for 48 hours at which point the reaction was stopped by filtering the solution to remove the TEA.HCl salt. The filtrate was collected and washed with 1× saturated K$_2$CO$_3$, 1× 1 M HCl, 1× deionized water and 1× brine solution. The organic layer was collected over magnesium sulfate and the crude product was obtained by filtering the DCM solution and evaporating the DCM layer under vacuum. Pure ATRP and ROP initiator was pendant C9OL chain was obtained by purifying the crude product with column chromatography using Si gel column with Hexane: EtOAC 80:20 as the eluent. The product was confirmed by $^1$H NMR. $^1$H NMR (400 MHz, CDCl$_3$ 23° C., ppm): 0.9

(3H), 1.21-1.42 (33H), 1.68 (2H), 1.94 (6H), 2.45 (1H), 3.74 (2H), 4.16 (2H), 4.27-4.46 (2H).

Table 2. summarizes various ATRP and ROP dual initiators containing different pendant groups

TABLE 2

| Example | Pendant Group |
|---------|---------------|
| 1 | $CH_2C_3F_7$ |
| 2 | $C_2H_4C_6F_{13}$ |
| 3 | $CH_2C_8F_{17}$ |
| 4 | $CH_2CF_2(OCF_2CF_2)_3C_2F_5$ |
| 5 | C18H37 |

Example 6

Synthesis of Hydroxyl-Functional Polystyrene with Initiator from Example 1

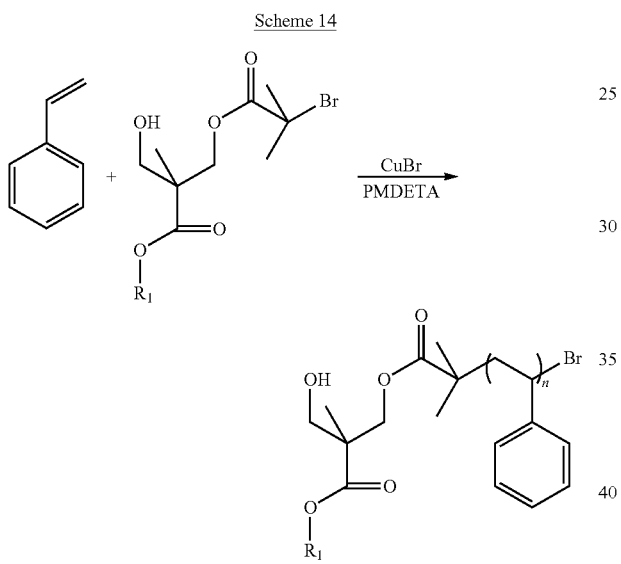

Scheme 14

To a 50 ml Schlenk flask equipped with a stir bar, 7.53 g, (7.25 mmol) of styrene(ST), 0.30 g (0.657 mmol) ATRP initiator from Example 1, 94 mg (0.657 mm) CuBr and 7.5 g of Anisole were added. The flask was sealed with a rubber septum and was purged by bubbling nitrogen for one hour. At this point, 0.12 g (0.657 mmol) of PMDETA was added and the reaction flask was placed in an oil-bath set at 100° C. for 150 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer was collected in a frit funnel and was dried under vacuum for 24 hours at 50° C. $M_n$=4.8 k, Mw=5.1 k, PDI=1.06.

Example 7

Synthesis of Hydroxyl-Functional Polystyrene with Initiator from Example 2

The same conditions were employed as for Example 6 except that the ATRP initiator from Example 2 was employed in the same molar amounts. The polymer obtained had Mn=5.2 k, Mw=5.6 k, PDI=1.07.

Example 8

Synthesis of Hydroxyl-Functional Polystyrene with Initiator from Example 3

The same conditions were employed as for Example 6 except that the ATRP initiator from Example 3 was employed in the same molar amounts. The polymer obtained had $M_n$=4.7 k, Mw=5.0 k, PDI=1.07.

Example 9

Synthesis of Hydroxyl-Functional Polystyrene with Initiator from Example 3

The same conditions were employed as for Example 6 except that the ATRP initiator from Example 3 was employed in the same molar amounts. The polymer obtained had $M_n$=9.4 k, Mw=10.1 k, PDI=1.07. (AV7-47-1)

Example 10

Synthesis of Hydroxyl-Functional Polystyrene with Initiator from Example 4

The same conditions were employed as for Example 6 except that the ATRP initiator from Example 4 was employed in the same molar amounts. The polymer obtained had $M_n$=6.9 k, Mw=7.4 k, PDI=1.07.

Example 11

Synthesis of Hydroxyl-Functional Polystyrene with Initiator from Example 5

The same conditions were employed as for Example 6 except that the ATRP initiator from Example 5 was employed in the same molar amounts. The polymer obtained had $M_n$=4.2 k, Mw=4.5 k, PDI=1.06.

Example 12

Synthesis of Hydroxyl-Functional Poly(Trimethyl Silylstyrene) with Initiator from Example 2

The same procedures was employed as for Example 6 except that the following reagents were employed: 1.83 g, (10.41 mmol) of TMSS, 0.10 g (0.170 mmol) ATRP initiator from Example 2, 30 mg (0.208 mmol) CuBr, 1.83 g of Anisole, and 36 mg (0.208 mmol) of PMDETA. The polymer obtained had $M_n$=7.5 k, Mw=8.1 k, PDI=1.09.

Example 13

Synthesis of Hydroxyl-Functional Poly(Trimethyl Silylstyrene) with Initiator from Example 3

The same procedure was employed as for Example 6 except that the following reagents were employed: 3.0 g, (17.0 mmol) of TMSS, 0.13 g (0.170 mmol) ATRP initiator from Example 3, 24 mg (0.170 mmol) CuBr, 3.0 g of Anisole and 30 mg (0.170 mmol) of PMDETA. The polymer had $M_n$=6.8 k, Mw=7.4 k, PDI=1.09.

Example 14

Synthesis of Hydroxyl-Functional Poly(Trimethylsilylstyrene-r-Styrene) with Initiator from Example 4

The same procedure was employed as for Example 6 except that the following reagents were employed: 0.89 g, (5.08 mmol) of TMSS, 2.11 g (20.3 mmol) of styrene, 0.15 g (0.188 mmol) ATRP initiator from Example 4, 27 mg (0.170 mmol) CuBr, 3.0 g of Anisole and 33 mg (0.188 mmol) of PMDETA. The polymer had Mn=4.7 k, Mw=5.1 k, PDI=1.09. The ratio of Styrene:TMSS by $^1$H NMR=74:26

Example 15

Synthesis of Hydroxyl-Functional Polystyrene with Initiator from Example 3

The same procedure was employed as for Example 6 except that the following reagents were employed: 9.20 g, (88.20 mmol) of styrene, 0.15 g (0.196 mmol) ATRP initiator from Example 3, 28 mg (0.196 mm) CuBr, 9.20 g of 34 mg (0.196 mmol) of PMDETA The polymer had $M_n$=15.6 k, Mw=16.9 k, PDI=1.08.

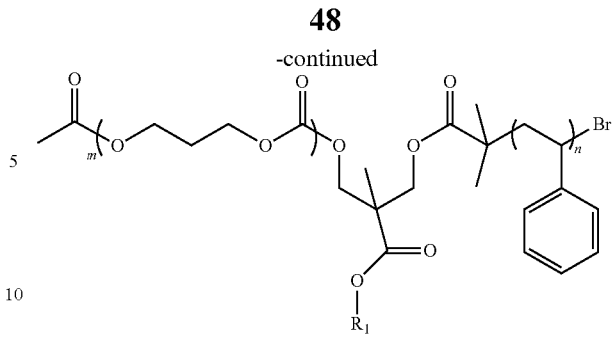

Synthesis of PS-b-PTMC with pendant group $CH_2C_3F_7$. To an oven dried 4 ml glass vial equipped with a magnetic stir bar, 0.20 g (0.0454 mmol) hydroxyl-functional polystyrene with $CH_2C_3F_7$ pendant group from Example 6, 0.52 g (5.17 mmol) of TMC and 1.70 g of DCM were added. The reaction mixture was stirred until the macroinitiator and TMC were completely dissolved in DCM, upon which DBU (about 12 mg, 0.078 mmol) was added. The reaction mixture was stirred at room temperature for 5.5 hours in a glove box. After 5.5 hours, the reaction was stopped by bringing the reaction vial out of the glove box and adding DCM (2 ml), acetyl chloride (0.1 g, 0.988 mmol), and TEA (0.1 g, 1.28

TABLE 3

| Example | Monomer | Catalyst | Initiator | Pendant Group | Temp °C. | Time (hours) | $M_n$ | $M_w$ | PDI |
|---|---|---|---|---|---|---|---|---|---|
| 6 | Styrene | CuBr/PMDETA | Example 1 | $R_1 = CH_2C_3F_7$ | 100 | 2.5 | 4.8K | 5.1K | 1.06 |
| 7 | Styrene | CuBr/PMDETA | Example 2 | $R_2 = C_2H_4C_6F_{13}$ | 100 | 1 | 5.2K | 5.6K | 1.07 |
| 8 | Styrene | CuBr/PMDETA | Example 3 | $R_3 = CH_2C_8F_{17}$ | 100 | 3 | 4.7K | 5.0K | 1.07 |
| 9 | Styrene | CuBr/PMDETA | Example 3 | $R_3 = CH_2C_8F_{17}$ | 100 | 3 | 9.5K | 10.1K | 1.07 |
| 10 | Styrene | CuBr/PMDETA | Example 4 | $R_4 = CH_2CF_2(OCF_2CF_2)_3C_2F_5$ | 100 | 2.5 | 6.9K | 7.4K | 1.07 |
| 11 | Styrene | CuBr/PMDETA | Example 5 | $R_5 = C_{18}H_{37}$ | 100 | 2 | 4.2K | 4.5K | 1.07 |
| 12 | Trimethyl silylstyrene | CuBr/PMDETA | Example 2 | $R_2 = C_2H_4C_6F_{13}$ | 100 | 0.67 | 7.5K | 8.1K | 1.07 |
| 13 | Trimethyl silylstyrene | CuBr/PMDETA | Example 3 | $R_3 = CH_2C_8F_{17}$ | 100 | 0.5 | 6.8K | 7.4K | 1.09 |
| 14 | Styrene and Trimethyl silylstyrene | CuBr/PMDETA | Example 4 | $R_4 = CH_2CF_2(OCF_2CF_2)_3C_2F_5$ | 100 | 1 | 4.7 | 5.1K | 1.09 |
| 15 | Styrene | CuBr/PMDETA | Example 3 | $CH_2C_8F_{17}$ | 100 | 2.33 | 15.6K | 16.9K | 1.08 |

Example 16

Synthesis of PS-b-PTMC with Macroinitiator of Example 6 (JB4-F)

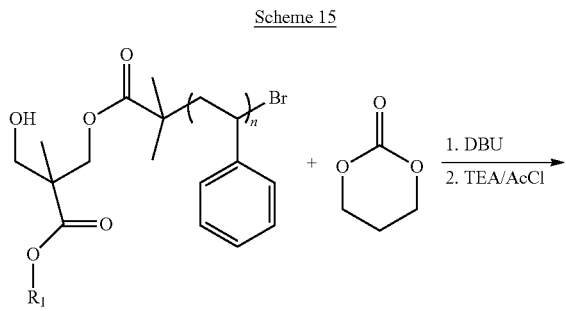

Scheme 15 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. This compound was dissolved in THF to form a 20 wt % solution and the polymer was precipitated in methanol: acetonitrile (200 ml, 60:40 v:v). The precipitated solids and the solvents were collected in a centrifuge tube and the solids was collected by centrifuging at 4000 RPM at 0° C. followed by decanting the solvent and drying the solids in a vacuum oven at 40° C. for two hours. $M_n$ (GPC)=14.2 k, Mw=15.7 k, PDI=1.10. $M_n$ (NMR)=PS (4.8 k)-b-PTMC (5.8 k), $Vf_{PTMC}$=0.49.

Example 17

Synthesis of PS-b-PTMC with Macroinitiator of Example 6 (JB8-F)

The same procedure was employed as for Example 16 except that the following reagents were employed: 0.15 g (0.0312 mmol) hydroxyl-functional polystyrene with $CH_2C_3F_7$ pendant group from Example 6, 0.208 g (2.08 mmol) of TMC, 0.67 g of DCM, DBU (12 mg, 0.078 mmol), DCM (1 ml), acetyl chloride (0.1 g, 0.988 mmol), and TEA (0.1 g, 1.28 mmol). The polymer had $M_n$ (GPC)=9.5 k, Mw=10.5 k, PDI=1.10. $M_n$ (NMR)=PS (4.8 k)-b-PTMC (2.6 k), $Vf_{PTMC}$=0.30.

Example 18

Synthesis of PS-b-PTMC with Macroinitiator of Example 7 (JB11F)

The same procedure was employed as for Example 16 except that the following reagents were employed 0.3 g (0.0577 mmol) hydroxyl-functional polystyrene with $C_2H_4C_6F_{13}$ pendant group from Example 7, 0.78 g (7.64 mmol) of TMC, 2.55 g of DCM, DBU (12 mg, 0.078 mmol), DCM (2 ml), acetyl chloride (0.1 g, 0.988 mmol), and TEA (0.1 g, 1.28 mmol). The polymer had $M_n$ (GPC)=14.6 k, Mw=15.5 k, PDI=1.16. $M_n$ (NMR)=PS (5.2 k)-b-PTMC (6.6 k), $Vf_{PTMC}$=0.50.

Example 19

Synthesis of PS-b-PTMC with Macroinitiator of Example 7 (JB12F)

The same procedure was employed as for Example 16 except that the following reagents were employed: 0.2 g (0.0384 mmol) hydroxyl-functional polystyrene with $C_2H_4C_6F_{13}$ pendant group from Example 7, 0.217 g (2.12 mmol) of TMC, 0.7 g of DCM, DBU (12 mg, 0.078 mmol), DCM (1 nil), acetyl chloride (0.1 g, 0.988 mmol), and TEA (0.1 g, 1.28 mmol. The polymer had $M_n$ (GPC)=9.2 k, Mw=9.8 k, PDI=1.06. $M_n$ (NMR)=PS (5.2 k)-b-PTMC (2.5 k), $Vf_{PTMC}$=0.28.

Example 20

Synthesis of PS-b-PTMC with Macroinitiator of Example 8 (JB1F)

The same procedure was employed as for Example 16 except that the following reagents were employed: 0.2 g (0.0425 mmol) hydroxyl-functional polystyrene with $CH_2C_8F_{17}$ pendant group from Example 8, 0.260 g (2.55 mmol) of TMC, 0.85 g of DCM, DBU (12 mg, 0.078 mmol) DCM (1 ml), acetyl chloride (0.1 g, 0.988 mmol), and TEA (0.1 g, 1.28 mmol). The reaction was further stirred for two hours at room temperature. The resulting polymer had Mn (GPC)=10.2 k, Mw=11.1 k, PDI=1.08. $M_n$ (NMR)=PS (4.7 k)-b-PTMC (2.3 k), $Vf_{PTMC}$=0.28.

Example 21

Synthesis of PS-b-PTMC with Macroinitiator of Example 8 (JB2F)

The same procedure was employed as for Example 16 except that the following reagents were employed: 0.2 g (0.0425 mmol) hydroxyl-functional polystyrene with $CH_2C_8F_{17}$ pendant group from Example 8, 0.43 g (4.25 mmol) of TMC, 1.4 g of DCM, DBU (12 mg, 0.078 mmol), DCM (1 ml), acetyl chloride (0.1 g, 0.988 mmol), and TEA (0.1 g, 1.28 mmol). The polymer had $M_n$ (GPC)=14.7 k, $M_w$=15.9 k, PDI=1.07, $M_n$ (NMR)=PS (4.7 k)-b-PTMC (5.3 k), $Vf_{PTMC}$=0.47.

Example 22

Synthesis of PS-b-PTMC with Macroinitiator of Example 8 (JB2IIF)

Similar reaction conditions as described in Example 21 were used to make PS-b-PTMC with $CH_2C_8F_{17}$ pendant group. $M_n$ (GPC)=15.3 k, $M_w$=16.7 k, PDI=1.08. $M_n$ (NMR)= PS (4.7 k)-b-PTMC (5.7 k), $Vf_{PTMC}$=0.49.

Example 23

Synthesis of PS-b-PTMC with Macroinitiator of Example 9 (JB9F)

The same procedure was employed as for Example 16 except that the following reagents were employed: 0.2 g (0.021 mmol) hydroxyl-functional polystyrene with $CH_2C_8F_{17}$ pendant group from Example 9, 0.515 g (5.05 mmol) of TMC, 1.65 g of DCM, upon which DBU (about 12 mg, 0.078 mmol) was added, DCM (1 ml), acetyl chloride (0.1 g, 0.988 mmol), and TEA (0.1 g, 1.28 mmol). The polymer had $M_n$ (GPC)=24.3 k, =27.6 k, PDI=1.13, $M_n$ (NMR)=PS (9.5 k)-b-PTMC (11.8 k), $Vf_{PTMC}$=0.49.

Example 24

Synthesis of PS-b-PTMC with Macroinitiator of Example 9 (JB10F)

The same procedure was employed as for Example 16 except that the following reagents were employed: 0.15 g (0.0158 mmol) hydroxyl-functional polystyrene with $CH_2C_8F_{17}$ pendant group from Example 9, 0.167 g (1.64 mmol) of TMC, 0.73 g of DCM, DBU (about 12 mg, 0.078 mmol), DCM (1 ml), acetyl chloride (0.1 g, 0.988 mmol), and TEA (0.1 g, 1.28 mmol). The polymer had Mn (GPC)= 18.0 k, $M_w$=20.0 k, PDI=1.11. $M_n$ (NMR)=PS (9.5 k)-b-PTMC (4.8 k), $Vf_{PTMC}$=0.28.

Example 25

Synthesis of PS-b-PTMC with Macroinitiator of Example 10 (JB13F)

The same procedure was employed as for Example 16 except that the following reagents were employed: 0.20 g (0.0290 mmol) hydroxyl-functional polystyrene with $CH_2CF_2(OCF_2CF_2)_3C_2F_5$ pendant group from Example 10, 0.212 g (2.08 mmol) of TMC, 1.1 g of DCM, DBU (about 12 mg, 0.078 mmol), DCM (1 ml), acetyl chloride (0.1 g, 0.988 mmol), and TEA (0.1 g, 1.28 mmol). The polymer had $M_n$ (GPC)=12.4 k, $M_w$=13.7 k, PDI=1.11. $M_n$ (NMR)=PS (6.9 k)-b-PTMC (3.2 k), $Vf_{PTMC}$=0.27.

Example 26

Synthesis of PS-b-PTMC with Macroinitiator of Example 10 (JB14F)

The same procedure was employed as for Example 16 except that the following reagents were employed: 0.20 g (0.0290 mmol) hydroxyl-functional polystyrene with $CH_2CF_2(OCF_2CF_2)_3C_2F_5$ pendant group from Example 10, 0.502 g (4.93 mmol) of TMC, 1.6 g of DCM, DBU (about 12 mg, 0.078 mmol), DCM (1 ml), acetyl chloride (0.1 g, 0.988 mmol), and TEA (0.1 g, 1.28 mmol). The polymer had $M_n$ (GPC)=19.3 k, $M_w$=21.0 k, PDI=1.09. $M_n$ (NMR)=PS (6.9 k)-b-PTMC (8.3 k), $Vf_{PTMC}$=0.49.

Example 27

Synthesis of PS-b-PTMC with Macroinitiator of Example 11 (JB6F)

The same procedure was employed as for Example 16 except that the following reagents were employed: 0.15 g (0.0357 mmol) hydroxyl-functional polystyrene with $C_{18}H_{37}$ pendant group from Example 11, 0.382 g (3.75 mmol) of TMC, 1.24 g of DCM, DBU (12 mg, 0.078 mmol), DCM (1 ml), acetyl chloride (0.1 g, 0.988 mmol), and TEA (0.1 g, 1.28 mmol). The resultant polymer had $M_n$ (GPC)= 10.8 k, $M_w$=11.6 k, PDI=1.06. $M_n$ (NMR)=PS (4.2 k)-b-PTMC (5.0 k), $Vf_{PTMC}$=0.48.

Example 28

Synthesis of PS-b-PTMC with Macroinitiator of Example 11 (JB7F)

The same procedure was employed as for Example 16 except that the following reagents were employed: 0.15 g (0.0357 mmol) hydroxyl-functional polystyrene with $C_{18}H_{37}$ pendant group from Example 11, 0.172 g (1.68 mmol) of TMC, 0.56 g of DCM, DBU (12 mg, 0.078 mmol), DCM (1 ml), acetyl chloride (0.1 g, 0.988 mmol), and TEA (0.1 g, 1.28 mmol). The resultant polymer had $M_n$ (GPC)= 8.1 k, $M_w$=8.6 k, PDI=1.06. $M_n$ (NMR)=PS (4.2 k)-b-PTMC (2.9 k), $Vf_{PTMC}$=0.35.

Table 4 summarizes the polystyrene-b-polycarbonate block copolymers with different pendant group at the junction

TABLE 4

| Example | Pendant Group | Catalyst | Macroinitiator | Temp | Time (hours) | GPC $M_n$ (kDa) | GPC $M_w$ (kDa) | PDI | NMR ($M_n$, kDa) PS block | NMR ($M_n$, kDa) PC block | Vf (PC block) |
|---|---|---|---|---|---|---|---|---|---|---|---|
| 16 | $R_1 = CH_2C_3F_7$ | DBU | Example 6 | rt | 5.5 | 14.2K | 15.7K | 1.1 | 4.6K | 5.8K | 0.49 |
| 17 | $R_1 = CH_2C_3F_7$ | DBU | Example 6 | rt | 2 | 9.5K | 10.6K | 1.1 | 4.8K | 2.6K | 0.3 |
| 18 | $R_2 = C_2H_4C_6F_{13}$ | DBU | Example 7 | rt | 8 | 14.6K | 15.5K | 1.06 | 5.2K | 6.6K | 0.5 |
| 19 | $R_2 = C_2H_4C_6F_{13}$ | DBU | Example 7 | rt | 1.5 | 9.2K | 9.8K | 1.06 | 5.2K | 2.5K | 0.28 |
| 20 | $R_3 = CH_2C_8F_{17}$ | DBU | Example 8 | rt | 1.5 | 10.2K | 11.1K | 1.09 | 4.7K | 2.3K | 0.28 |
| 21 | $R_3 = CH_2C_8F_{17}$ | DBU | Example 8 | rt | 2 | 14.7K | 15.9K | 1.07 | 4.7K | 5.3K | 0.47 |
| 22 | $R_3 = CH_2C_8F_{17}$ | DBU | Example 8 | rt | 2.3 | 15.2K | 16.6K | 1.09 | 4.7K | 6.7K | 0.49 |
| 23 | $R_3 = CH_2C_8F_{17}$ | DBU | Example 9 | rt | 8 | 24.3K | 27.6K | 1.13 | 9.5K | 11.8K | 0.49 |
| 24 | $R_3 = CH_2C_8F_{17}$ | DBU | Example 9 | rt | 3.5 | 18.0K | 20.0K | 1.11 | 9.5K | 4.8K | 0.28 |
| 25 | $R_4 = CH_2CF_2(OCF_2CF_2)_3C_2F_5$ | DBU | Example 10 | rt | 3 | 12.4K | 13.7K | 1.11 | 6.9K | 3.2K | 0.27 |
| 26 | $R_4 = CH_2CF_2(OCF_2CF_2)_3C_2F_5$ | DBU | Example 10 | rt | 7 | 19.3K | 21.0K | 1.09 | 6.9K | 8.3K | 0.49 |
| 27 | $R_5 = C_{18}F_{37}$ | DBU | Example 11 | rt | 3.5 | 10.8K | 11.6K | 1.06 | 4.2K | 5.0K | 0.48 |
| 28 | $R_5 = C_{18}F_{37}$ | DBU | Example 11 | rt | 1.5 | 8.1K | 8.7K | 1.06 | 4.2K | 2.9K | 0.35 |

Example 29

Synthesis of PTMSS-b-PTMC with Macroinitiator of Example 12 (PERL)

The same procedure was employed as for Example 16 except that the following reagents were employed: 0.05 g (0.0067 mmol) hydroxyl-functional PTMSS with $C_2H_4C_6F_{13}$ pendant group from Example 12, 0.134 g (1.31 mmol) of TMC, 0.87 g of DCM, 14 mg (0.039 mmol) of 1-[3,5-Bis(trifluoromethyl)phenyl]-3-cyclohexylthiourea (TU) and DBU (6 mg, 0.039 mmol). The resultant polymer had Mn (GPC)=17.0 k, $M_w$=18.9 k, PDI=1.11. $M_n$ (NMR)= PS (6.9 k)-b-PTMC (8.3 k), $Vf_{PTMC}$=0.49.

Example 30

Synthesis of PTMSS-b-PTMC with Macroinitiator of Example 13 (PERL)

The same procedure was employed as for Example 16 except that the following reagents were employed: 0.05 g (0.0067 mmol) hydroxyl-functional PTMSS with $C_2H_4C_6F_{13}$ pendant group from Example 13, 0.39 g (3.85 mmol) of TMC, 1.75 g of DCM, DBU (18 mg, 0.12 mmol), DCM (1 ml), acetyl chloride (0.1 g, 0.988 mmol), and TEA (0.1 g, 1.28 mmol). The resultant polymer had $M_n$ (GPC)= 18.6 k, $M_w$=20.2 k, PDI=1.08. $M_n$ (NMR)=PS (6.8 k)-b-PTMC (8.4K), $Vf_{PTMC}$=0.48.

TABLE 5

| Example | Pendant Group | Catalyst | Macroinitiator | Temp | Time (hours) | GPC $M_n$ (kDa) | GPC $M_w$ (kDa) | PDI | NMR ($M_n$, kDa) PS block | NMR ($M_n$, kDa) PC Block | Monomer % Conv. | Vf (PC block) |
|---|---|---|---|---|---|---|---|---|---|---|---|---|
| 29 | $C_2H_4C_6F_{13}$ | DBU/TU | Example 12 | rt | 3 | 17.0K | 18.9K | 1.11 | 6.9k | 8.3k | ~50 | 0.50 |
| 30 | $CH_2C_8F_{17}$ | DBU | Example 13 | rt | 9 | 18.6k | 20.2 | 1.08 | 6.8k | 8.4k | ~50 | 0.486 |

Example 31

Synthesis of PS-b-PLA with Macroinitiator of Example 9 (SFE-1-II)

Scheme 16

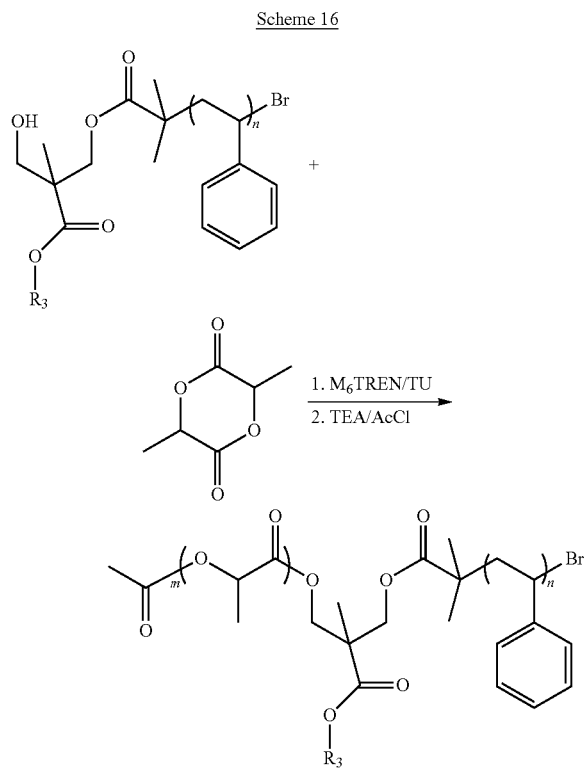

Synthesis of PS-b-PLA with $CH_2C_8F_{17}$ pendant group. To an oven dried 4 ml glass vial equipped with a magnetic stir bar, 0.1 g (0.0105 mmol) hydroxyl-functional polystyrene with $CH_2C_8F_{17}$ pendant group from Example 9, 0.23 g (1.59 mmol) of D,L-lactide (PLA) and 2.1 g of DCM were added. The reaction mixture was stirred until the macroinitiator and D,L-lactide were completely dissolved in DCM, upon which 20 mg (0.0525 mmol) of TU and tris[2-(dimethylamino)ethyl]amine (M6TREN) (12 mg, 0.0526 mmol) was added. The reaction mixture was stirred at room temperature for 3 hours in a glove box. After 3 hours, the reaction was stopped by bringing the reaction vial out of the glove box and adding DCM (1 ml), acetyl chloride (0.1 g, 0.988 mmol), and TEA (0.1 g, 1.28 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. $M_n$ (GPC)=24.0K, $M_w$=26.0 k, PDI=1.09. $M_n$ (NMR)=PS (9.5 k)-b-PLA(9.6 k), $Vf_{PLA}$=0.47.

Example 31a

The compound from Example 31 was dissolved in THF to form a 20 wt % solution and the polymer was precipitated in methanol: acetonitrile (20 ml, 75:25 v:v). The precipitated solids and the solvents were collected in a centrifuge tube and the solids was collected by centrifuging at 4000 RPM at 0° C. followed by decanting the solvent and drying the solids in a vacuum oven at 40° C. for two hours. $M_n$ (GPC)=24.6 k, $M_w$=26.8 k, PDI=1.09. $M_n$ (NMR)=PS (9.5 k)-b-PLA (8.0K), $Vf_{PLA}$=0.42

Example 32

Synthesis of PS-b-PLA with Macroinitiator of Example 9 (SFE-2)

The same procedure was employed as for Example 31 except that the following reagents were employed: 0.1 g (0.0105 mmol) hydroxyl-functional polystyrene with $CH_2C_8F_{17}$ pendant group from Example 9, 0.1 g (0.69 mmol) of D,L-lactide, 0.92 g of DCM, 20 mg (0.00525 mmol) of TU, M6TREN (12 mg, 0.0526 mmol, DCM (1 nil), acetyl chloride (0.1 g, 0.988 mmol), and TEA (0.1 g, 1.28 mmol The resultant polymer had $M_n$ (GPC)=18.5K, $M_w$=20.0 k, PDI=1.08. $M_n$ (NMR)=PS (9.5 k)-b-PLA(5.4 k), $Vf_{PLA}$=0.32.

Example 33

Synthesis of PS-b-PLA with Macroinitiator of Example 15 (SFE-3)

The same procedure was employed as for Example 31 except that the following reagents were employed: 0.1 g (0.0064 mmol) hydroxyl-functional polystyrene with $CH_2C_8F_{17}$ pendant group from Example 15, 0.115 g (0.80 mmol) of D,L-lactide, 1.0 g of DCM 12 mg (0.032 mmol) of TU, M6TREN (7 mg, 0.026 mmol), DCM (1 ml), acetyl chloride (0.1 g, 0.988 mmol), and TEA (0.1 g, 1.28 mmol). T. $M_n$ (GPC)=35.6K, $M_w$=38.7 k, PDI=1.08. $M_n$ (NMR)=PS (15.6 k)-b-PLA(16.6 k), $Vf_{PLA}$=0.485.

Example 33a

The compound from Example 33 was dissolved in THF to form a 20 wt % solution and the polymer was precipitated in methanol: acetonitrile (20 ml, 70:30 v:v). The precipitated solids and the solvents were collected in a centrifuge tube and the solids was collected by centrifuging at 4000 RPM at 0° C. followed by decanting the solvent and drying the solids in a vacuum oven at 40° C. for two hours. $M_n$ (GPC)=37.3 k, $M_w$=40.2 k, PDI=1.07. $M_n$ (NMR)=PS (15.6 k)-b-PLA (13.5K), $Vf_{PLA}$=0.435

Example 34

Synthesis of PS-b-PLA with Macroinitiator of Example 15 (SFE-4)

The same procedure was employed as for Example 31 except that the following reagents were employed: 0.1 g (0.0064 mmol) hydroxyl-functional polystyrene with $CH_2C_8F_{17}$ pendant group from Example 15, 0.46 g (0.80 mmol) of D,L-lactide, 0.6 g of DCM, 12 mg (0.032 mmol) of TU and M6TREN (7 mg, 0.026 mmol) was added, DCM (1 ml), acetyl chloride (0.1 g, 0.988 mmol), and TEA (0.1 g, 1.28 mmol). The resultant polymer had $M_n$ (GPC)=25.5K, $M_w$=27.7 k, PDI=1.08. $M_n$ (NMR)=PS (15.6 k)-b-PLA(6.3 k), $Vf_{PLA}$=0.27.

Table 6 summarizes different polystyrene-b-polylactide block copolymers with various pendant groups at the junction

TABLE 6

| Example | Polymer Name | Pendant Group | Catalyst | Macroinitiator | Temp | Time (hours) | GPC $M_n$ (kDa) | GPC $M_w$ (kDa) | PDI | NMR ($M_n$, kDa)) PS block | NMR ($M_n$, kDa)) PLA block | Vf (PLA block) |
|---|---|---|---|---|---|---|---|---|---|---|---|---|
| 31 | SFE-1-II | $R_3 = CH_2C_8F_{17}$ | M6TREN/ TU | Example 9 | rt | 1.5 | 24.0K | 26.0K | 1.09 | 9.5K | 9.9K | 0.47 |
| 31a | SFE-1-IIF | $R_3 = CH_2C_8F_{17}$ | M6TREN/ TU | Example 9 | rt | 1.5 | 24.6k | 26.8k | 1.09 | 9.5K | 8.0K | 0.42 |
| 32 | SFE-2 | $R_3 = CH_2C_8F_{17}$ | M6TREN/ TU | Example 9 | rt | 0.25 | 18.5K | 20.0K | 1.08 | 9.5K | 5.4K | 0.32 |
| 33 | SFE-3 | $R_3 = CH_2C_8F_{17}$ | M6TREN/ TU | Example 15 | rt | 2.25 | 35.6K | 38.7K | 1.08 | 15.6K | 16.6K | 0.48 |
| 33a | SFE-3F | $R_3 = CH_2C_8F_{17}$ | M6TREN/ TU | Example 15 | rt | 0.75 | 37.3k | 40.2k | 1.07 | 15.6K | 13.5 | 0.435 |
| 34 | SFE-4 | $R_3 = CH2C8F17$ | M6TREN/ TU | Example 15 | rt | 0.75 | 25.5K | 27.7K | 1.09 | 15.6K | 6.3K | 0.27 |

Example 35

Synthesis of PTMSS-b-PLA with Macroinitiator of Example 12 (PERL)

The same procedure was employed as for Example 31 except that the following reagents were employed: 0.05 g (0.0067 mmol) hydroxyl-functional PTMSS with $C_2H_4C_6F_{13}$ pendant group from Example 12, 0.060 g (0.412 mmol) of Lactide, 1.10 g of DCM, 29 mg (0.078 mmol) of TU, M6TREN (about 18 mg, 0.078 mmol), DCM (1 ml), acetyl chloride (0.1 g, 0.988 mmol), and TEA (0.1 g, 1.28 mmol). The resultant polymer had $M_n$ (GPC)=15.5 k, $M_w$=16.9 k, PDI=1.09. $M_n$ (NMR)=PS (6.3 k)-b-PLA(4.0 k), $Vf_{PLA}$=0.35.

Example 36

Synthesis of PTMSS-b-PLA with Macroinitiator of Example 12 (PERL)

The same procedure was employed as for Example 31 except that the following reagents were employed: 0.05 g (0.0067 mmol) hydroxyl-functional PTMSS with $C_2H_4C_6F_{13}$ pendant group from Example 12, 0.060 g (0.412 mmol) of lactide, 1.10 g of DCM, 29 mg (0.078 mmol) of TU, M6TREN (18 mg, 0.078 mmol), DCM (1 ml), acetyl chloride (0.1 g, 0.988 mmol), and TEA (0.1 g, 1.28 mmol). The resultant polymer had $M_n$ (GPC)=17.3 k, $M_w$=19.1 k, PDI=1.10. $M_n$ (NMR)=PS (6.3 k)-b-PLA(6.2 k), $Vf_{PLA}$=0.45.

TABLE 7

| Example | Pendant Group | Catalyst | Macroinitiator | Temp | Time (minutes) | GPC $M_n$ (kDa) | GPC $M_w$ (kDa) | PDI | NMR ($M_n$, kDa) PS block | NMR ($M_n$, kDa) PLA block | Vf (PLA block) |
|---|---|---|---|---|---|---|---|---|---|---|---|
| 35 | $C_2H_4C_6F_{13}$ | M6TREN/TU | Example 12 | rt | 20 | 15.5k | 16.9k | 1.08 | 6.3k | 4.0k | 0.35 |
| 36 | $C_2H_4C_6F_{13}$ | M6TREN/TU | Example 12 | rt | 45 | 17.3k | 19.1k | 1.10 | 6.3k | 6.2k | 0.45 |

Example 37

Synthesis of PS-b-PMeCAR

Scheme 17

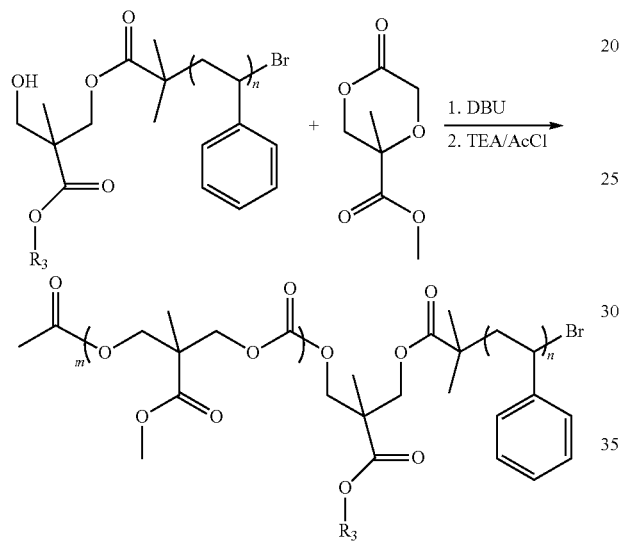

room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solids were collected in a frit funnel and dried under vacuum at 40° C. for two hours to obtain the resulting compound. This compound was dissolved in THF to form a 20 wt % solution and the polymer was precipitated in methanol:acetonitrile (20 ml, 85:15 v:v). The precipitated solids and the solvents were collected in a centrifuge tube and the solids was collected by centrifuging at 4000 RPM at 0° C. followed by decanting the solvent and drying the solids in a vacuum oven at 40° C. for two hours. $M_n$ (GPC)=13.0 k, $M_w$=14.0 k, PDI=1.07. $M_n$ (NMR)=PS (4.70 k)-b-PMeCAR (6.2K), $Vf_{PMeCAR}$=0.51.

Examples 38-40

Synthesis and Purification of PS-b-PMeCAR with $CH_2C_8F_{17}$ Pendant Group with Different Molecular Weights These polymers were prepared using the general procedure of Example 37, summarized in Table 8 along with example 37.

TABLE 8

| Ex. | Macroinitiator Example | Macroinitiator (g, mmol) | MeCAR (g, mmol) | DCM (g) | DBU (mg) | Time (hours) | Mn (NMR) PS | Mn (NMR) PMeCAR | Vf PMeCAR | GPC Mn | GPC Mw | GPC PDI |
|---|---|---|---|---|---|---|---|---|---|---|---|---|
| 37 | Example 8 | 0.1, 0.0212 | 0.24, 1.378 | 1.80 | 3.27 | 0.67 | 4.7k | 6.2k | 0.51 | 13.0k | 14.0k | 1.07 |
| 38 | Example 9 | 0.10, 0.0105 | 0.25, 1.430 | 1.86 | 1.6 | 2 | 9.5k | 8.8k | 0.43 | 20.0k | 21.9k | 1.09 |
| 39 | Example 9 | 0.10, 0.0105 | 0.44, 2.52 | 3.36 | 1.6 | 2.5 | 9.5k | 11.7k | 0.495 | 21.5k | 23.5k | 1.09 |
| 40 | Example 15 | 0.1, 0.0064 | 0.23, 1.320 | 1.75 | 1.0 | 4.2 | 15.6k | 19k | 0.49 | 30.1k | 32.7k | 1.08 |

Synthesis of PS-b-PMeCAR with $CH_2C_8F_{17}$ pendant group. To an oven dried 4 ml glass vial equipped with a magnetic stir bar, 0.1 g (0.0212 mmol) hydroxyl-functional polystyrene with $CH_2C_8F_{17}$ pendant group from Example 8, 0.24 g (1.37 mmol) of methyl 5-methyl-2-oxo-1,3-dioxane-5-carboxylate (MeCAR) and 1.80 g of DCM were added. The reaction mixture was stirred until the macroinitiator and MeCAR were completely dissolved in DCM, upon which DBU (3.27 mg, 0.0212 mmol, of a 10 wt % stock solution in toluene) was added. The reaction mixture was stirred at room temperature for forty minutes in a glove box. After forty minutes, the reaction was stopped by bringing the reaction vial out of the glove box and adding DCM (1 ml), acetyl chloride (0.1 g, 0.988 mmol), and TEA (0.1 g, 1.28 mmol). The reaction was further stirred for two hours at

Example 41

Synthesis of PS-b-PEtCAR

The same procedure was employed as for Example 37 except that the following reagents were employed: 0.1 g (0.0105 mmol) hydroxyl-functional polystyrene with $CH_2C_8F_{17}$ pendant group from Example 8, 0.22 g (1.17 mmol) of ethyl 5-methyl-2-oxo-1,3-dioxane-5-carboxylate (EtCAR), 1.50 g of DCM, DBU (1.6 mg, 0.0105 mmol, 10 wt % stock solution in toluene), DCM (0.5 ml), acetyl chloride (0.1 g, 0.988 mmol), and TEA (0.1 g, 1.28 mmol). The resultant polymer had $M_n$ (GPC)=23.3 k, $M_w$=26.7 k, PDI=1.14. $M_n$ (NMR)=PS (9.5 k)-b-PEtCAR(11.1), $Vf_{PEtCAR}$~0.48.

Example 42

Synthesis of PS-b-PPCAR

The same procedure was employed as for Example 37 except that the following reagents were employed: 0.1 g (0.0105 mmol) hydroxyl-functional polystyrene with $CH_2C_8F_{17}$ pendant group from Example 9, 0.34 g (1.68 mmol) of Propyl 5-methyl-2-oxo-1,3-dioxane-5-carboxylate (PCAR), 2.23 g of DCM, DBU (1.6 mg, 0.0105 mmol, 10 wt % stock solution in toluene), DCM (0.5 ml), acetyl chloride (0.1 g, 0.988 mmol), and TEA (0.1 g, 1.28 mmol). The resultant polymer had $M_n$ (GPC)=23.3 k, Mv=25.7 k, PDI=1.10. $M_n$ (NMR)=PS (9.5 k)-b-PPCAR(11.5), $Vf_{PCAR}$~0.49.

Example 43

Synthesis of PS-b-PPCAR with Different Molecular Weight

This polymer was prepared using the general procedure of Example 42, summarized in Table 9.

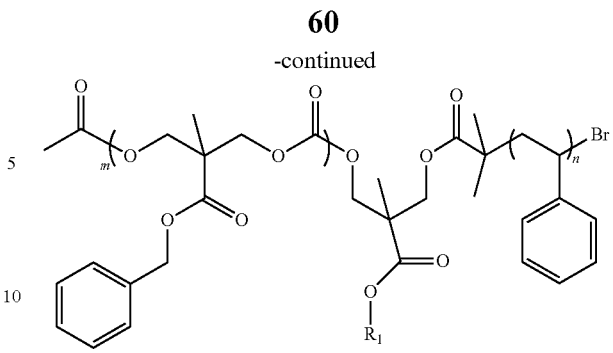

The same procedure was employed as for Example 37 except that the following reagents were employed: 0.15 g (0.0096 mmol) hydroxyl-functional polystyrene with $CH_2C_8F_{17}$ pendant group from Example 15, 0.20 g (0.80 mmol) of benzyl 5-methyl-2-oxo-1,3-dioxane-5-carboxylate (PBzCAR), 1.06 g of DCM, DBU (1.6 mg, 0.0105 mmol, 10 wt % stock solution in toluene), DCM (0.5 ml), acetyl chloride (0.1 g, 0.988 mmol), and TEA (0.1 g, 1.28 mmol).

TABLE 9

| Ex. | Macroinitiator Example | Macroinitiator (g, mmol) | PPCAR (g, mmol) | DCM (g) | DBU (mg) | Time (hours) | $M_n$ (NMR) PS | $M_n$ (NMR) PMeCAR | Vf PMeCAR | GPC $M_n$ | GPC $M_w$ | GPC PDI |
|---|---|---|---|---|---|---|---|---|---|---|---|---|
| 42 | Example 9 | 0.10, 0.0105 | 0.34, 1.68 | 2.23 | 1.6 | 3.5 | 9.5k | 11.5k | 0.49 | 23.3 | 25.7 | 1.10 |
| 43 | Example 15 | 0.1, 0.0064 | 0.33, 1.64 | 2.17 | 1.0 | 8.5 | 15.6k | 17.5 | 0.47 | 30.2 | 33.7 | 1.11 |

Example 44

Synthesis of PS-b-PBzCAR

Scheme 18

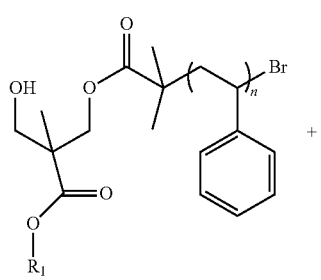

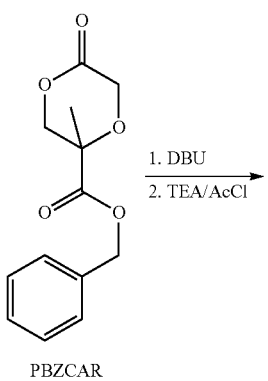

PBZCAR

The resultant polymer had $M_n$ (GPC)=26.0 k, $M_w$=28.3 k, PDI=1.09. $M_n$ (NMR)=PS (15.6 k)-b-PPCAR(14.9), $Vf_{PBzCAR}$~0.44.

Example 45

Synthesis of Hydroxyl-Functional Polystyrene with Initiator from Example 3

The same procedure was employed as for Example 6 except that the following reagents were employed: 27.50 g, (0.266 mol) of styrene, 1.20 g (1.56 mmol) ATRP initiator from Example 3, 0.225 g (1.56 mmol) CuBr, and 27.5 g of Anisole, 0.271 g (1.56 mmol) of PMDETA. The final reaction mixture was diluted in adding THF (100 ml) and was passed through a short silica-gel column to remove copper catalyst. The resulting solution was concentrated under vacuum and was precipitated once in methanol from THF. The polymer was collected and redissolved in THF and precipitated once in methoxyperfluorobutane (HFE-7100). The resulting polymer was dried under vacuum and redissolved in THF and reprecipitated in methanol. The polymer was collected in a fit funnel and was dried under vacuum. $M_n$=8.5 k, $M_w$=9.2 k, PDI=1.08.

Example 46

Synthesis of PS-b-PLA with Macroinitiator of Example 45

The same procedure was employed as for Example 31 and Example 31a except that the following reagents were employed: 015 g (0.0176 mmol) hydroxyl-functional polystyrene with $CH_2C_8F_{17}$ pendant group from Example 45, 0.23 g (1.58 mmol) of D,L-lactide (LA), 2.1 g of DCM, 32 mg (0.088 mmol) of TU, M6TREN (20 mg, 0.088 mmol), DCM (1 ml), acetyl chloride (0.1 g, 0.988 mmol), and TEA (0.1 g, 1.28 mmol). The resultant polymer had $M_n$ (GPC)= 19.9K, $M_w$=21.4 k, PDI=1.07. $M_n$ (NMR)=PS (8.5 k)-b-PLA(9.2 k), $Vf_{PLA}$=0.48.

Example 47

Synthesis of PS-b-PMeCAR

The same procedure was employed as for Example 31 except that the following reagents were employed: 0.25 g (0.029 mmol) hydroxyl-functional polystyrene with $CH_2C_8F_{17}$ pendant group from Example 45, 0.80 g (4.60 mmol) of MeCAR, 6.50 g of DCM, DBU (4.5 mg, 0.0294 mmol, 10 wt % stock solution in toluene), DCM (1 ml), acetyl chloride (0.1 g, 0.988 mmol), and TEA (0.1 g, 1.28 mmol). The polymer had $M_n$ (GPC)=17.2 k, $M_w$=18.5 k, PDI=1.07. $M_n$ (NMR)=PS (8.5 k)-b-PMeCAR(10.2K), $Vf_{PMeCAR}$=0.49.

I-2. Synthesis of JBCPs by Anionic Polymerization

Example 48

Synthesis of Monofunctional Perfluoroalkane-Substituted DPE ($C_3H_6C_8F_{17}$-DPE)

Scheme 19: Synthesis of perfluoro alkane substituted 1,1'-diphenylethylene ($C_3H_6C_8F_{17}$-DPE).

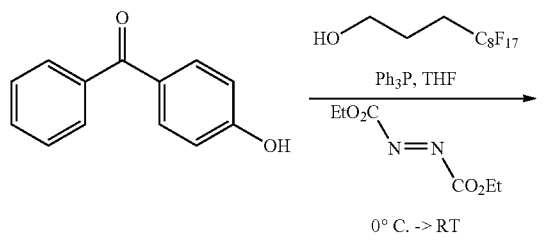

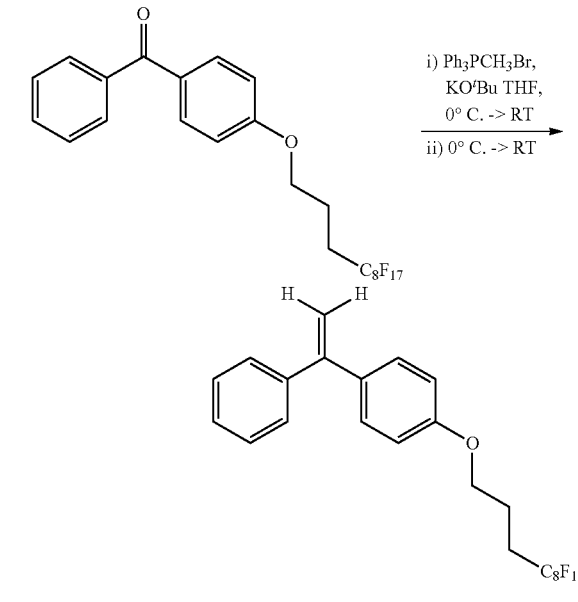

To a mixture of 4-hydroxybenzophenone (6 g, 30.2 mmol), (perfluorooctyl)propanol (17.4 g, 36.4 mmol) and triphenylphosphine (10.2 g, 36.4 mmol) in 100 mL of THF, 17.7 mL of diethyl azodicarboxylate (36.4 mmol, 40 wt % in toluene) was drop wise added at ice bath temperature. After stirring for 2 hours at RT, most of solvent was evaporated and then about 100 mL of methanol was poured into reaction mixture and its slurry mixture was stirred for one hour to dissolve byproducts and reagents. White solid product was filtered and washed with cold methyl alcohol several times. Resulting 18.1 g of product was dried under vacuum oven at 50° C. (91%). $^1$H NMR (300 MHz, $CDCl_3$): (ppm) 7.83 (2H, d, J=8.7 Hz), 7.76 (2H, d, J=6.9 Hz), 7.60-7.45 (m, 3H), 6.96 (2H, d, J=8.7 Hz), 4.13 (2H, t, J=5.7 Hz), 2.41-2.13 (4H, m). Potassium t-butoxide (4.01 g, 35.75 mmol) was added into methyltriphenylphosphonium bromide (11.8 g, 33 mmol) in 30 mL of THF at 0° C. under nitrogen and the solution was stirred at RT for 1 hr. This reacting mixture was slowly transferred into $C_3H_6C_8F_{17}$—BP (18.1 g, 27.5 mmol) in 30 mL of THF under nitrogen by cannula at 0° C. and was left at RT for 1 hr. 1~2 mL of water was added to quench the reaction and then methanol (~100 mL) was poured to precipitate product and to dissolve other byproducts. The mixture was stored in refrigerator for overnight and then product was filtered and washed with cold methyl alcohol several times. The product was dissolved into chloroform and filtered through silica column with eluent of $CHCl_3$/Hexane=1/10. After solvent evaporation and vacuum dry, 16.4 g of product was obtained (91%). $^1$H NMR (300 MHz, $CDCl_3$): (ppm) 7.35-7.25 (7H, m), 6.85 (2H, d, J=8.7 Hz), 6.38 (2H, d, J=10.2 Hz), 4.06 (2H, t, J=5.7 Hz), 2.41-2.06 (4H, m); $^{19}$F NMR (282 MHz, $CDCl_3$):(ppm) −80.82 (3F), −114.34 (2F), −121.70—121.91 (6F), −122.70 (2F), −123.41 (2F), −126.10 (2F).

Example 49

Synthesis of Difunctional Perfluoroalkane-Substituted DPE ($diC_3H_6C_4F_9$-DPE)

Scheme 20: Synthesis of perfluoro alkane disubstituted 1,1'-diphenylethylene ($diC_3H_6C_8F_{17}$-DPE).

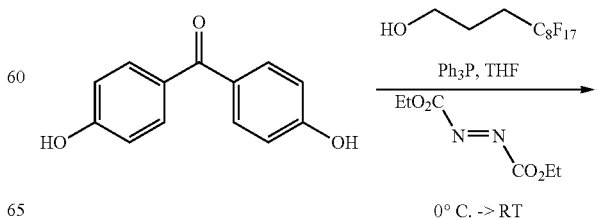

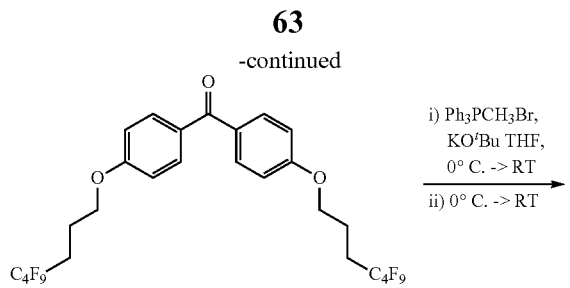

4,4'-Dihydroxybenzophenone and (perfluorobutyl)propanol were used for di-substituted BP and its synthesis was accomplished with the similar method of synthesis as $C_3H_6C_8F_{17}$—BP using same reagents and reaction condition. White solid powder was obtained with 94% yield. $^1$H NMR (300 MHz, CDCl$_3$): (ppm) 7.82 (4H, d, J=8.7 Hz), 6.96 (4H, d, J=8.7 Hz), 4.13 (4H, t, J=5.7 Hz), 2.41-2.11 (8H, m). The reaction and purification were followed by the same method as Example 48 by replacing appropriate perfluoroalkane. A white solid product was obtained with 90% yield, which was further purified using column chromatography. $^1$H NMR (300 MHz, CDCl$_3$):(ppm) 7.26 (4H, d, J=9.0 Hz), 6.85 (4H, d, J=9.0 Hz), 4.06 (4H, t, J=6 5.7 Hz),

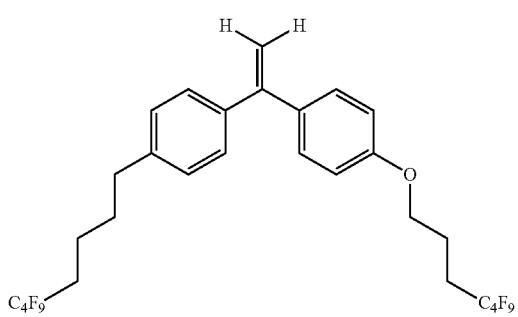

2.41-2.07 (8H, m); $^{19}$F NMR (282 MHz, CDCl$_3$):(ppm) −81.05 (3F), −114.57 (2F), −123.40 (2F), −126.02 (2F).

Example 50

Synthesis of Hydroxyl Polystyrene Macroinitiator Containing Perfluoroalkane-Substituted DPE Via Anionic Polymerization (DB-PS(F)-OH-20)

Required amount of monomers were distilled in the presence of dehydrating agents into calibrated ampules and stored under N$_2$. Liquids were transferred into the reactor either via ampule or using stainless steel cannula under N$_2$. Into a dry 500 mL round bottom reactor equipped with side arms for connecting ampules, magnetic stir bar, nitrogen/vacuum three-way septum adapter, was added 200 mL dry tetrahydrofuran. The temperature of the reactor was reduced to −60° C. using dry ice-acetone bath. Then, 1 mL (0.0014 moles) of sec-butyllithium (sec-BuLi) (1.4 M) was added into the reactor. Subsequently, a known amount of styrene (14.75 mL) was added from ampule into the reactor under fast stirring. The reaction solution turned into orange and the reaction was stirred over 10 min. Subsequently, 1.2 g of perfluoroalkane-substituted 1,1'-diphenylethylene ($C_3H_6C_8F_{17}$-DPE) of Example 48 in 8 ml of dry toluene was added via ampule into the reactor. The orange color of the reaction mixture turned into dark brick-red indicating conversion of styryllithium active centers to delocalized carbanion resulting from $C_3H_6C_8F_{17}$-DPE adduct formation. After 2 min of stirring, 2 mL of ethylene oxide (EO), which distilled over sec-BuLi, was added into the reactor via ampule and the dark brick-red color disappeared immediately upon addition of EO and became a faint-pink in color. The reaction was terminated after 15 min with 1 mL of degassed methanol. The polymer was recovered by precipitation in excess methanol (4 times of the polymer solution) containing 10% water, filtered, and dried at 55° C. for 12 h under vacuum giving 14.1 g of PS(F)-OH (98% yield).

Scheme 21: Synthesis of hydroxyl with perflouroalkane-functionalized PS macroinitiator from anionic polymerization using $C_3H_6C_8F_{17}$-DPE.

1) Living PS with perfluoro DPE capping

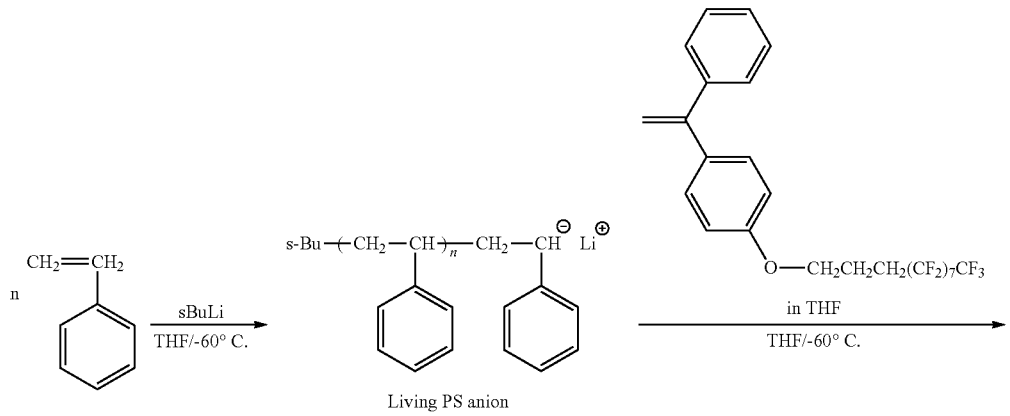

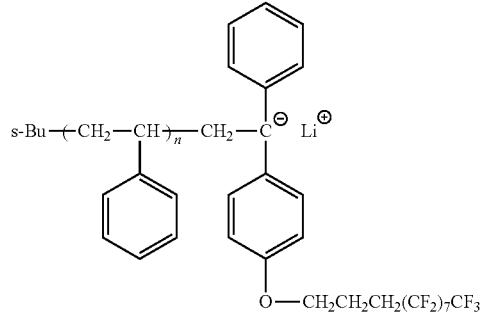

Living PS-F-DPE cappted anion

2) Ethylene Oxide capping

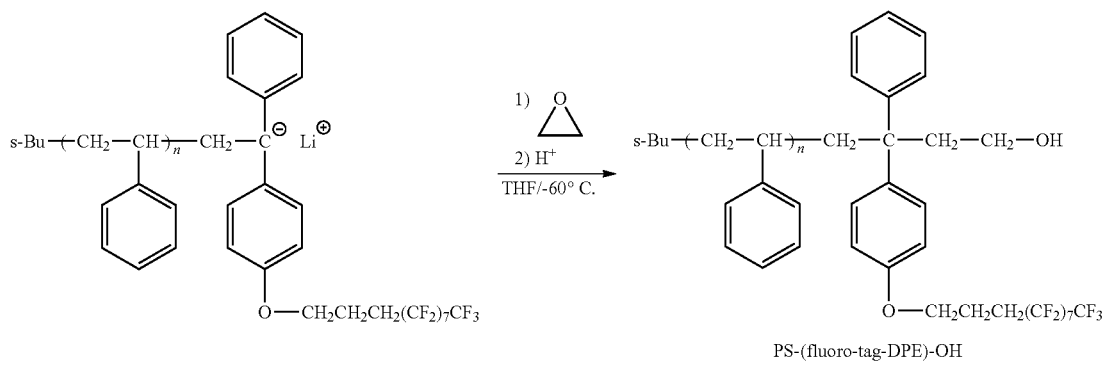

PS-(fluoro-tag-DPE)-OH

Gel permeation chromatography equipped with 100 Å, 500 Å, $10^3$ Å, $10^5$ Å and $10^6$ Å μ-ultrastyragel columns showed that the polymer had $M_{n,PS}$=10,100 g/mol and $M_w/M_n$=1.06 with respect to PS calibration standards. After subtracting molecular weight of $C_3H_6C_8F_{17}$-DPE (656 g/mol), the molecular weight of PS is 9,400 g/mol.

Example 50a

Synthesis of Hydroxyl Polystyrene Macroinitiator Containing Perfluoroalkane-Substituted DPE Via Anionic Polymerization (DB-PS(F)-OH-3)

Similar experiment as given in Example 50 was performed using 13.75 ml of styrene and keeping all other reagents concentration same. The obtained polymer had, $M_{n,PS}$=9,700 g/mol and $M_w/M_n$=1.05 with respect to PS calibration standards. After subtracting molecular weight of $C_3H_6C_8F_{17}$-DPE (656 g/mol), the molecular weight of PS is 9,000 g/mol.

Example 51

Synthesis of PS-b-PTMC Using Macroinitiator of Example 50a (AZHC22)

Scheme 22: Ring-opening polymerization of TMC using perfluoroalkane functionalized hydroxy PS macroinitiator using base atalyst.

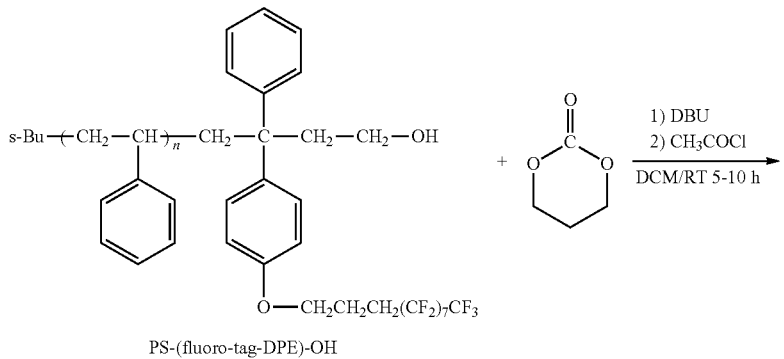

PS-(fluoro-tag-DPE)-OH

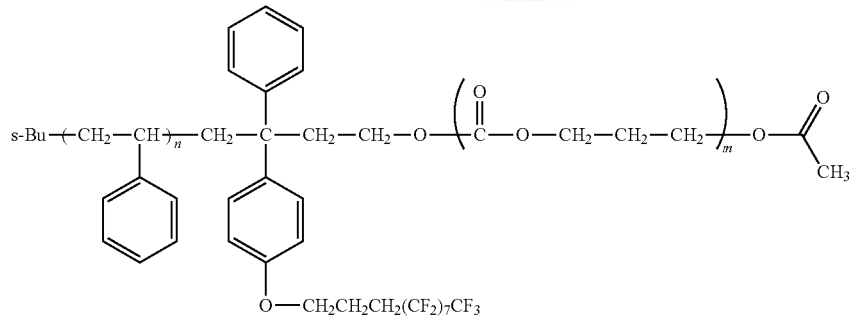

To an oven dried 20 ml glass vial equipped with a magnetic stir bar, 1.0 g (0.106 mmol) hydroxyl-functional polystyrene with perfluoro-pendant group ($C_8F_{17}$) from Example 50a, 2.5951 g (25.42 mmol) of 1,3-dioxan-2-one or trimethylcarbonate (TMC) and 6.35 ml of DCM were added. The reaction mixture was stirred until the macroinitiator and TMC were completely dissolved in DCM, upon which, 1,8-diazabicyclo [5.4.0]undec-7-ene (DBU) (90 μL, 0.515 mmol) was added. The reaction mixture was stirred at room temperature for 8 h in a glove box. After 8 h, the reaction vial was taken out of the glove box and benzoic acid (0.075g, 0.602 mmol) in DCM (15 ml) was added all at once to terminate the reaction. The reaction was further stirred for 10 min at room temperature. The resulting polymer was isolated by precipitating the reaction mixture in methanol. The product was collected in a frit funnel by removing methanol under vacuum and the resulting solids were redissolved and reprecipitated in methanol. The solids were collected in a frit funnel and dried under vacuum at 50° C. overnight to obtain 2.34 g of BCP. This material as 20 wt. % acetone solution was precipitated in methanol: acetonitrile (375 ml, 60:40 v:v). The precipitated solid was collected in a frit funnel than dried-under vacuum at 50° C. for 10 h. Yield: 2.1 g (58%); $M_n$ (GPC)=19,400 g/mol, $M_w$ =21,700 g/mol, PDI =1.12. Molecular weight of PTMC block based on the integration of PS block in $^1$H NMR is $M_{n\text{-}PTMC(NMR)}$=11,100 grams/mol; PS(9.0k)-b-PTMC(11.1k), $V_{f\text{-}PTMC}$=0.49.

Example 52

Synthesis of PS-b-PLA with macroinitiator of Example 50 (AZHC-39)

Scheme 23: Ring-opening polymerization of LA using perfluoroalkane functionalized hydroxy PS macroinitiatior (Example 50) using base catalyst.

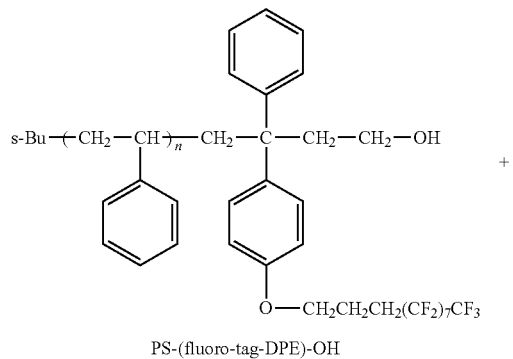

PS-(fluoro-tag-DPE)-OH

-continued

PF-(F)-b-PLA

To an oven dried 50 ml round bottom flask equipped with a magnetic stir bar, 2.0017 g (0.197 mmol) hydroxyl-functional polystyrene with perfluor0-pendant group ($C_8F_{17}$) from Example 50, 2.9616 g (20.55 mmol) of D,L—Lactide and 17 ml of DCM were added. The reaction mixture was stirred until the macroinitiator and D,L—Lactide were completely dissolved in DCM, upon which 1-[3,5- Bis(trifluoromethyl)phenyl ]-3-cyclohexylthiourea (TU) (0.2586 g, 0.699 mmol) followed by tris[2- (dimethylamino)ethyl]amine ($M_6$TREN) (186 μL, 0.696 mmol) were added. The reaction mixture was stirred at room temperature for 3 h and 7 min in a glove box. Then, the reaction vial was taken out of the glove box and to it, benzoic acid (0.488 g, 4 mmol) in DCM (10 ml) was added all at once. The reaction was further stirred for 10 min at room temperature. The resulting polymer was isolated by precipitating the reaction mixture in methanol. The solids were collected in a frit funnel and dried under vacuum at 50° C. overnight to obtain 3.67g of BCP. This compound was dissolved in DCM (15 ml) then triethylamine, (TEA, 105 μL, 0.753 mmol) and acetyl chloride (53.6 μL, 0.753 mmol) were added and stirred for 7 h at room temperature. The resulting acetylated polymer was filtered than dried in vacuum oven at 50° C. for 3 h. This material as 20 wt. % acetone solution was precipitated in methanol: acetonitrile (375 ml, 75:25 v:v). The precipitated solid was collected in a frit funnel than dried-under vacuum at 50° C. for 10 h. Yield: 3.36 g (67.7%); $M_n$ (GPC)=27.1 k, $M_w$=27.8 k, PDI=1.03. Molecular weight of PLA block based on the integration of PS block in $^1$H NMR is $M_{n\text{-}PLA(NMR)}$=10,700 grams/mol; PS (9.4 k)-b-PLA(10.7 k), $V_{f\text{-}PTMC}$=0.49.

Example 53

Synthesis of $PS_{18.6K}$(F)-b-$PMMA_{22K}$ with Monofunctional Perfluoroalkane-Substituted DPE ($C_3H_6C_8F_{17}$-DPE) at the Junction (DB-SFM-4)

Required amount of monomers were distilled in the presence of dehydrating agents into calibrated ampules and stored under $N_2$. Liquids were transferred into the reactor either via ampule or using stainless steel cannula under $N_2$. Into a dry 500 mL round bottom reactor equipped with side arms for connecting ampules, magnetic stir bar, nitrogen/vacuum three-way septum adapter, was added 200 mL dry tetrahydrofuran. The temperature of the reactor was reduced to −60° C. using dry ice-acetone bath. Then, 3.5 mL (0.00042 moles) of sec-butyllithium (sec-BuLi, 0.12 M) was added into the reactor. Subsequently, a known amount of styrene (10 mL) was added from ampule into the reactor under fast stirring. The reaction solution turned into orange and the reaction was stirred over 10 min. Subsequently, 0.390 g of perfluoroalkane substituted 1,1-diphenylethylene ($C_3H_6C_8F_{17}$-DPE) of Example 48 in 10 ml of dry toluene was added via ampule into the reactor. The orange color of the reaction mixture turned into dark brick-red indicating conversion of styryllithium active centers to delocalized carbanion resulting from $C_3H_6C_8F_{17}$-DPE adduct formation. After 2 min of stirring, a small amount (2 mL) of the reaction mixture was withdrawn for PS block molecular weight analysis. Then, 10.75 mL of methyl methacrylate (MMA), distilled over a small amount of triethylaluminum (1M in toluene), was added via ampule. The reaction was terminated after 15 min with 1 mL of degassed methanol. The block copolymer was recovered by precipitation in excess methanol (4 times of the polymer solution) containing 10% water, filtered, and dried at 55° C. for 12 h under vacuum giving 19.2 g of PS(F)-b-PMMA (100% yield).

Scheme 24: PS-b-PMMA diblock copolymer synthesis using perfluoro alkane substituted 1,1-diphenylethylene ($C_3H_6C_8F_{17}$-DPE) of Example 48 as junction unit.

1) Living PS with perfluoro DPE capping

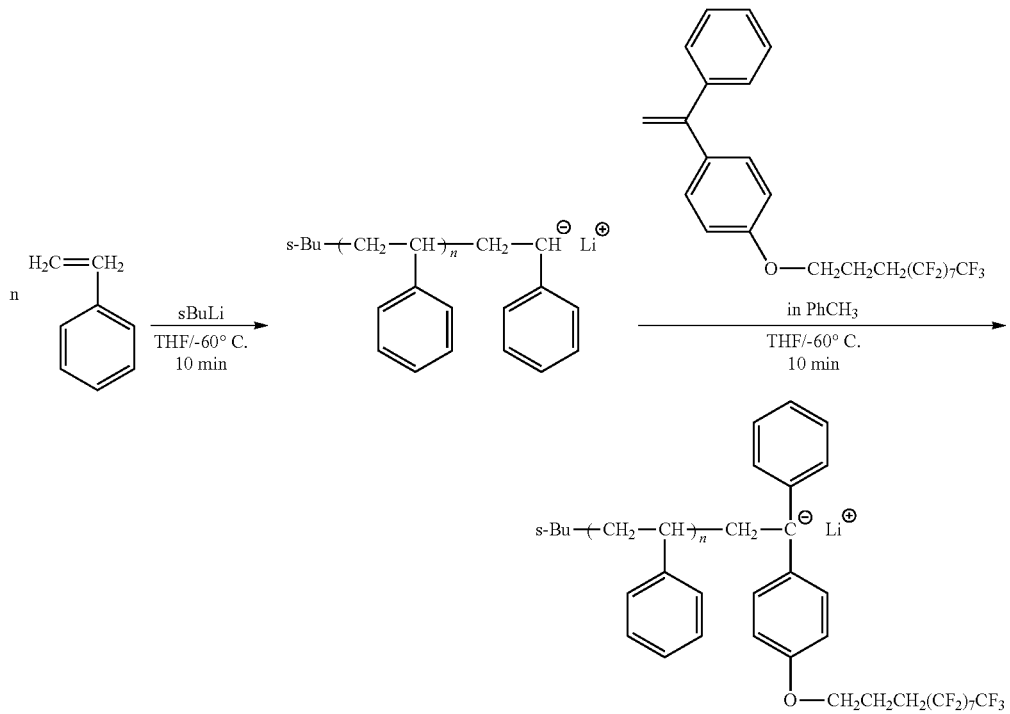

2) Second block PMMA Growth

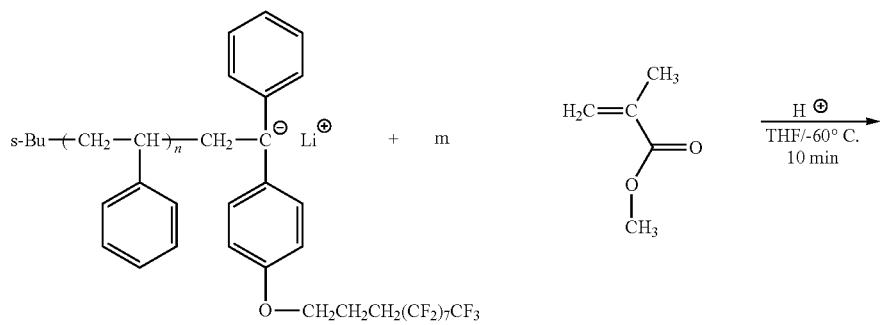

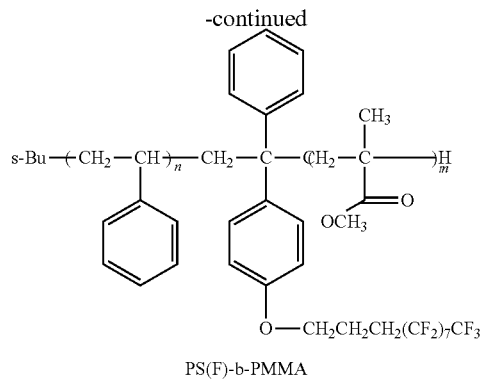

PS(F)-b-PMMA

Gel permeation chromatography equipped with 100 Å, 500 Å, $10^3$ Å, $10^5$ Å and $10^6$ Å μ-ultrastyragel columns showed that the 1st PS block had $M_{n,PS}$ (GPC)=19,300 g/mol and $M_w/M_n$=1.06 with respect to PS calibration standards. After subtracting $C_3H_6C_8F_{17}$-DPE molecular weight (656 g/mol), the molecular weight of PS is 18,600 g/mol. The diblock copolymer molecular weight obtained from GPC is $M_{n,PS-b-PMMA}$=34,300 g/mol and $M_w/M_n$=1.09. The block copolymer had a small amount of low molecular weight hump, which resulted from the termination side reaction of carbanion with C-F bond of DPE derivative. The diblock copolymer was purified using Soxhlet extraction procedure using cyclohexane to remove homopolystyrene (hPS) and the apparent molecular weight and distribution with respect to PS standards are; $M_{n,PS-b-PMMA}$=35,900 g/mol and $M_w/M_n$=1.07. The molecular weight of PMMA block calculated by NMR intensities of —$OCH_3$ protons and aromatic protons based on $M_{n,PS}$(GPC) block is: $M_{n,PMMA}$ (NMR)=22,000 g/mol. This corresponds to $V_{f-PS}$=0.49 in the diblock copolymer.

Example 54

Synthesis of $PS_{36.8K}(F)_2$-b-$PMMA_{38.3K}$ with Difunctional Perfluoroalkane-substituted DPE ($diC_3H_6C_4F_9$-DPE) of Example 49 at the Junction (AZ-160)

Experiment was performed similar to Example 53 as given above using $diC_3H_6C_4F_9$-DPE of Example 49 with appropriate amount of monomers to obtain $PS_{36.8K}(F)_2$-b-$PMMA_{38.3K}$. Gel permeation chromatography equipped with 100 Å, 500 Å, $10^3$ Å, $10^5$ Å and $10^6$ Å μ-ultrastyragel columns showed that the 1st PS block had $M_{n,PS}$ (GPC)=37,500 g/mol and $M_w/M_n$=1.06 with respect to PS calibration standards. After subtracting $C_3H_6C_8F_{17}$-DPE molecular weight (656 g/mol), the molecular weight of PS is 36,800 g/mol. The diblock copolymer molecular weight obtained from GPC is $M_{n,PS-b-PMMA}$=57,700 g/mol and $M_w/M_n$=1.08. The block copolymer had a small amount of low molecular weight hump (5.7%). The diblock copolymer was purified using Soxhlet extraction procedure using cyclohexane to remove hPS. The molecular weight of PMMA block calculated by NMR intensities of —$OCH_3$ protons and aromatic protons based on $M_{n,PS}$(GPC) block is: $M_{n,PMMA}$(NMR)= 38,300 g/mol.

I-3. Synthesis of Relevant Block Copolymers without Surface-active Junction Groups[Comparative Examples]

Example C1

Synthesis of Hydroxyl Polystyrene Macroinitiator ($M_n$=6,200) Prepared by Anionic Polymerization Required amount of monomers were distilled in the presence of dehydrating agents into calibrated ampules and stored under $N_2$. Liquids were transferred into the reactor either via ampule or using stainless steel cannula under $N_2$. Into a dry 500 mL round bottom reactor equipped with side arms for connecting ampules, magnetic stir bar, nitrogen/vacuum three-way septum adapter, was added 200 mL dry tetrahydrofuran. The temperature of the reactor was reduced to −60° C. using dry ice-acetone bath. Then, 2.6 mL (0.0036 moles) of sec-butyllithium (sec-BuLi) (1.4 M) was added into the reactor. Subsequently, a known amount of styrene (14.75 mL) was added from ampule into the reactor under fast stirring. The reaction solution turned into orange and the reaction was stirred over 10 min. After this, 2 mL of ethylene oxide (EO), which was distilled over sec-BuLi, was added into the reactor via ampule. The reaction was terminated after 15 min with 1 mL of degassed methanol. The polymer was recovered by precipitation in excess methanol (4 times of the polymer solution) containing 10% water, filtered, and dried at 55° C. for 12 h under vacuum giving 14.1 g of PS—OH with $M_n$ (GPC)=6,200 g/mol and $M_w/M_n$=1.05 (98% yield).

Example C2

Synthesis of Hydroxyl Polystyrene Macroinitiator ($M_n$=10,000) Prepared by Anionic Polymerization This polymer was prepared along the method of Example C1. $M_n$ (GPO)=10000, PDI=1.05.

Example C3

Synthesis of $PS_{6.2K}$-b-$PTMC_{8.4K}$ without Surface-Active Junction Group

To an oven dried 20 mL round bottom flask equipped with a magnetic stir bar, PS—OH (0.70 g, 0.113 mmol, $M_n$=6200, PDI=1.02, n=57), from Example C1, TMC (1.76 g, 17.25 mmol), and DCM (2.94 mL) were added. The reaction mixture was stirred until the PS—OH macroinitiator and TMC were completely dissolved in DCM, upon which catalyst diphenylphosphate (DPP, 400 mg, 1.6 mmol) was added. The reaction mixture was stirred at room temperature (r.t.) for 16 hours in a glove box. The reaction flask brought out of the glove box and cooled at 0° C. by immersing it in an ice-water bath. The reaction was stopped by adding DCM (6 mL), TEA (0.7 mL, 02.72 mmol) and acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours to give the polymer; $M_n$ (GPC)=19,300, $M_w$=19,900, PDI=1.02; $M_n$ (NMR)=PS (6.2 k)-b-PTMC (8.4 k), n=57, m=82.

Example C4

Synthesis of $PS_{6.2K}$-b-$PTMC_{2.9K}$ with Non-Surface Active Junction Group

Along the procedure outlined in Example C3, this diblock copolymer was prepared with PS—OH macroinitiator of Example C1 (0.30 g, 0.048 mmol, $M_n$=6200, n=57), TMC (0.296 g, 2.90 mmol), and DPP (0.12 g, 0.483 mmol). Mn (GPC)=10800, $M_w$=11200, PDI=1.03; $M_n$ (NMR)=PS (6.2 k)-b-PTMC (2.9 k), n=57, m=28.

Example C5

Synthesis of $PS_{10K}$-b-$PLA_{11.4K}$ with Non-Surface Active Junction Group

To an oven dried 4 mL round bottom flask equipped with a magnetic stir bar, PS—OH macroinitiator (0.20 g, 0.02 mmol, $M_n$=10000, PDI=1.05, n=96) of Example C2, Lactide (0.254 g, 1.76 mmol), and DCM (2.00 mL) were added. The reaction mixture was stirred until the PS—OH macroinitiator and Lactide were completely dissolved in DCM, upon which M6TREN (23 mg, 0.1 mmol) and TU (37 mg, 0.1 mmol) were added. The reaction mixture was stirred at room temperature (r.t.) for 1 hour 40 minutes in a glove box. The reaction flask brought out of the glove box and was stopped by adding DCM (1 mL), TEA (0.1 mL) and acetyl chloride (0.1 ml). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. $M_n$ (GPC)=29,500, $M_w$=31,100, PDI=1.05; $M_n$ (NMR)=PS (10 k)-PLA(11.4 k), n=57, m=79;

Example C6

Synthesis of $PS_{36.8K}$-b-$PMMA_{38.3K}$

Along the procedure of Example 54 was performed by 1-1-diphenylethylene without functionalization in the same molar quantities as a reference PBCP for comparison. The polymer obtained has as similar $M_{n,PS-b-PMMA}$=57,700 g/mol and $M_w/M_n$=1.08.

Example C7

Synthesis of Hydroxyl Polystyrene Macroinitiator ($M_n$=4,200) Prepared by Anionic Polymerization This polymer was prepared along the method of Example C1. $M_n$ (GPC)=4200, PDI=1.05

Example C8

Synthesis of $PS_{4.2K}$-b-$PTMC_{5.3K}$ with Non-Surface Active Junction Group

Along the procedure outlined in Example C3, this diblock polymer was prepared with PS—OH macroinitiator of Example C7 (0.1 g, 0.0238 mmol, $M_n$=4200, PDI=1.05, TMC (0.133 g, 1.31 mmol), DCM (0.4 ml), and DPP (60 mg, 0.238 mmol). $M_n$ (GPC)=13.7 k, $M_w$=14.1 k, PDI=1.02; Mn (NMR)=PS (4.2 k)-b-PTMC (5.3 k).

I-4. Synthesis of Underlayer Materials (ULs)

Underlayer random copolymers based on styrene, TMC, and GMA (STGH). These random copolymers have the prefix "G1" in the name.

Example 55

Synthesis of Macroinitiator Random Copolymer P-1, P(S-r-HEMA-r-GMA)

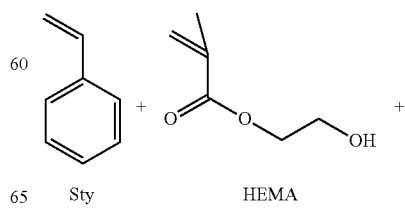

Scheme 25

Sty      HEMA

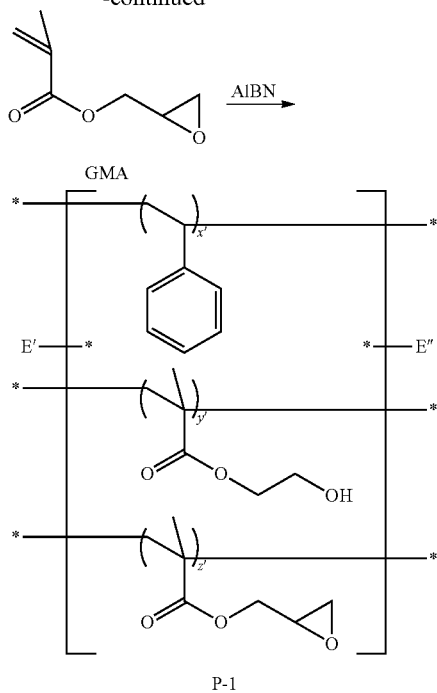

In the above notation, the vertical stacking of the repeat units within the square brackets indicates a random distribution of the repeat units in the polymer chain. End group E' is linked to one of the starred bonds overlapping the left square bracket. End group E" is linked to one of the starred bonds overlapping the right square bracket. It should be understood that for a given repeat unit, a starred bond that overlaps the left square bracket can be linked to a different repeat unit at the position indicated by the right starred bond overlapping the right square bracket, or to end group E'. Likewise, for a given repeat unit, a starred bond that overlaps the right square bracket can be linked to a different repeat unit at the position indicated by the left starred bond overlapping the left square bracket, or to end group E". Unless otherwise indicated, subscripts x', y', and z' average number of the corresponding parenthesized repeat unit in the polymer. For P-1, the end groups E' and E" are not shown.

Styrene (S, 14.4 g, 138.0 mmol), hydroxy ethyl methacrylate (HEMA, 1.0 g, 7.68 mmol), glycidyl methacrylate (GMA, 1.09 g, 7.66 mmol), THF (50 g), and azobisisobutyronitrile (AIBN, 0.757 g, 4.61 mmol, 3 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours. $M_n$=6200, Mw=8700, PDI=1.40. The product Styrene:HEMA:GMA mole ratio x:y:z was calculated by $^{13}$C inverse gated NMR as x:y:z=88:6:6. Based on the $M_n$ and the product mole ratio, the degree of polymerization (DP) of each repeat units Styrene:HEMA:GMA was calculated for P-1 to be x': y': z'=50.5: 3.5: 3.5, respectively.

Example 56

Synthesis of TMC-Functional Random Graft Copolymer G1-1, P(S-r-HEMA-r-GMA)-g-PTMC Scheme 26

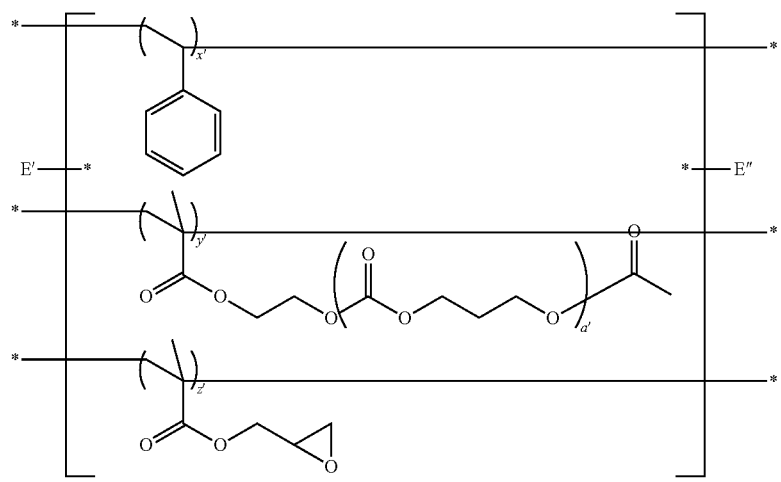

G1-1, x':(y'a'):z'=73:27:6 (S:TMC:GMA)

The quantity y'a' (i.e., y' multiplied by a') represents the total average number of repeat units derived from TMC in the random graft copolymer G1-1. In these calculations, $M_n$ was not adjusted for the mass of end groups E' and E" when determining the DP of each repeat unit.

Macroinitiator P-1 (0.2 g, Example 55), trimethylene carbonate (TMC, 0.060 g, 0.588 mmol) and dichloromethane (DCM, 0.2 g) were added to an oven dried 4 mL glass vial equipped with a magnetic stir bar. The reaction mixture was stirred until the macroinitiator and TMC were completely dissolved in DCM, upon which 1,8-diazabicyclo[5.4.0]undec-7-ene (DBU, ~10 mg) was added. The reaction mixture was stirred at room temperature (r.t.) for 1 hour in a glove box. The reaction was stopped by bringing the reaction vial out of the glove box and by adding DCM (0.5 ml), triethylamine (TEA, 0.27 g, 2.72 mmol) and acetyl chloride (~60 mg, 0.764 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol for two more times. The solids were collected in a frit funnel and dried under vacuum at 40° C. for two hours to obtain random graft copolymer G1-1, where the Styrene:TMC mole ratio x':y'a'=73:27 was determined by $^1$H NMR. The average value of a' was calculated as follows:

$x'/y'=50.5/3.5$ (DP ratio of the P-1 macroinitiator), $x'/(y'a')=73/27$ (Styrene:TMC mole ratio of G1-1 by $^1$H NMR), rearranging, $x'/y'=73a'/27$ substituting, $50.5/3.5=73a'/27$, and solving, $a'=5.33$.

Therefore, G1-1 has a side chain polycarbonate having an average number of carbonate repeat units a'=5.33, based on the $M_n$ of G1-1.

Examples 57-66

Synthesis of Series of TMC-Functional Random Graft Copolymers, G1-2 to G1-11

Along the general procedure of Example 56, these polymers were prepared using macroinitiator P-1 (Example 55) at various Styrene:TMC molar ratios. G1-2 to G1-11 differ from G1-1 by a', the average number of repeat units of TMC in the side chain. The results are summarized in Table 10.

TABLE 10

| Ex. | Random Graft Polymer Name | TMC (g) | DCM (g) | DBU (mg) | P-1 Initiator (g) | Temp | Time (hours) | GPC $M_n$ | $M_w$ | PDI | S:TMC Mole Ratio | a'[1] | Monomer % Conversion. |
|---|---|---|---|---|---|---|---|---|---|---|---|---|---|
| 56 | G1-1 | 0.06 | 0.2 | ~10 | 0.2 | r.t. | 1 | — | — | — | 73:27 | 5.3 | >99 |
| 57 | G1-2 | 0.1 | 0.32 | ~10 | 0.2 | r.t. | 1.5 | — | — | — | 60:40 | 9.6 | >99 |
| 58 | G1-3 | 0.46 | 1.50 | ~10 | 0.2 | r.t. | 2 | 23600 | 44000 | 1.87 | 24:76 | 45.7 | >99 |
| 59 | G1-4 | 0.035 | 0.52 | ~10 | 0.2 | r.t. | 0.45 | — | — | — | 88:12 | 2.0 | >99 |
| 60 | G1-5 | 0.06 | 0.37 | ~13 | 0.2 | r.t. | 1 | 9300 | 13500 | 1.44 | 73:27 | 5.3 | >99 |
| 61 | G1-6 | 0.1 | 0.45 | ~10 | 0.2 | r.t. | 1.5 | 11400 | 18000 | 1.57 | 59:41 | 10.0 | >99 |
| 62 | G1-7 | 0.06 | 0.72 | ~10 | 0.2 | r.t. | 1 | — | — | — | 73:27 | 5.3 | >99 |
| 63 | G1-8 | 0.1 | 0.9 | ~10 | 0.2 | r.t. | 1.4 | — | — | — | 66:34 | 7.4 | ~90 |
| 64 | G1-9 | 0.15 | 0.9 | ~16 | 0.2 | r.t. | 1 | 12100 | 15900 | 1.31 | 62:38 | 8.8 | ~50 |
| 65 | G1-10 | 0.15 | 0.9 | ~14 | 0.2 | r.t. | 0.75 | — | — | — | 62:38 | 8.8 | ~50 |
| 66 | G1-11 | 0.15 | 0.9 | ~14 | 0.2 | r.t. | 1.4 | — | — | — | 43:57 | 19.1 | ~65 |

[1] a' is based on $M_n$ of the random graft copolymer, without correcting for end groups Example 67

Synthesis of Random Copolymer P(S-r-MMA-r-GMA)

Polystyrene-co-methyl methacrylate-co-glycidyl methacrylate) random copolymer, P(S-r-MMA-r-GMA), referred to as N3, was prepared using the procedure of U.S. Pat. No. 8,623,458 by free-radical polymerization of styrene, methyl methacrylate, and glycidyl methacrylate in a molar feed ratio S:MMA:GMA 74:24:2. The isolated polymer composition as determined by $^{13}$C NMR was S:MMA:GMA 58:40:2 (mole ratio), $M_n$=12100, Examples 68-70

Synthesis of Other Random Copolymers of P(S-r-MMA-r-GMA)

Along the general procedure of Example 67, these polymers were prepared. . . . The results are summarized in Table 11.

TABLE 11

| Example | UL Name | Polymer $M_n$ | S:MMA:GMA Mole Ratio |
|---|---|---|---|
| 67 | N3 | 12100 | 58:40:2 |
| 68 | N6 | 9500 | 70:28:2 |
| 69 | N20 | | 48:50:2 |
| 70 | N21 | | 38:60:2 |

II. Self-Assembly of Block Copolymers with Surface-active Junction Groups and Relevant Materials
II-0. Preparation of UL-Modified Unpatterned Substrates Examples 71-77

Substrate Fabrication Using Random Graft Copolymers G1-2, G1-3, G1-7, G1-8 and G1-10

The following general procedure was used to prepare a thin film underlayer on a clean unpatterned silicon substrate. A solution was prepared by dissolving the random graft copolymer (95 parts by weight) and p-nitrobenzyl 4-methylbenzenesulphonate (p-NBT, 5 parts by weight) in propylene glycol monomethyl ether acetate (PGMEA, 10,000 parts by weight) to form a 1.0 wt % solution based on total dry solids. p-NBT is a thermal acid generator and was added to promote the grafting and partial crosslinking of a thin film of the random graft copolymer on the silicon wafer substrate when baked (annealed). The solutions were passed through a 0.2 mm polytetrafluoroethylene (PTFE) filter prior to spin coating the solution on a silicon wafer at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not cross-linked or grafted to the wafer surface. The final film thickness of the underlayer was 10 nm after the solvent rinse. Table 12 summarizes the underlayer films UL-1 to UL-7 prepared with the random copolymers having a "G1" prefix in the name.

TABLE 12

Substrate fabrication by series of the random graft copolymers

| | | | DP[1] | | |
|---|---|---|---|---|---|
| Example | Synthetic Example | S:TMC mole ratio | S (x') | HEMA (y') | TMC (a') |
| 71 | G1-3 | 24:76 | 50.5 | 3.5 | 45.7 |
| 72 | G1-2 | 60:40 | 50.5 | 3.5 | 9.6 |
| 73 | G1-10 | 62:38 | 50.5 | 3.5 | 8.8 |
| 74 | G1-8 | 66:34 | 50.5 | 3.5 | 7.4 |
| 75 | G1-7 | 73:27 | 50.5 | 3.5 | 5.3 |
| 76 | G1-11 | 43:57 | 50.5 | 3.5 | 8.8 |
| 77 | G1-4 | 88:12 | 50.5 | 3.5 | 19.1 |

[1]x', y', and a' are based on $M_n$ of the random graft copolymer

Examples 78-81

Substrate Fabrication Using N Series

Underlayer substrates using N series polymers (Examples 67-70) were formed using various P(S-MMA-GMA) random copolymers as shown below in Table 13. A coating solution was prepared by dissolving the solid P(S-MMA-GMA) material and p-NBT (para-nitrobenzyl 4-methylbenzylsulfonate) in 95/5 w/w ratio in PGMEA at 1.0 wt % solids. p-NBT is a thermal acid generator and was added to promote the grafting and partial crosslinking of the random copolymer on a silicon wafer substrate when baked in the form of thin film. The solutions were passed through a 0.2 micrometer PTFE filter. The resulting compositions were then spin coated on the silicon wafer at 3000 rpm spin rate. After the thin film was formed, the wafer was baked at 215° C. for 2 minutes and cooled to room temperature. A solvent rinse was then conducted by casting PGMEA on top of the baked wafer and letting it puddle for 30 seconds prior to spin drying at 3000 rpm for 30 seconds to form underlayers of Examples 78-81.

TABLE 13

UL fabrication by Nseries

| Example | Synthetic Example | S:MMA:GMA mole | UL Name |
|---|---|---|---|
| 78 | 67 | 58:40:2 | N3 |
| 79 | 68 | 70:28:2 | N6 |
| 80 | 69 | 48:50:2 | N20 |
| 81 | 70 | 38:60:2 | N21 |

Example 82

Substrate Fabrication Using P(S-r-MMA) Random Copolymer Underlayer Material (AZEMBLY NLD-328J)

A 20% PS-containing P(S-r-MMA) underlayer material was received from AZ Electronic Materials (Somerville N.J.) in the form of a PGMEA solution (solution code AZEMBLY NLD-328J). The solution was used as received. The polymer solution was spin coated at 1500 rpm on a silicon wafer then baked at 250° C. for 2 minutes prior to a solvent rinse to form the underlayer.

Examples 83-90

Substrate Fabrication Using Other Brush Materials

Except for Example 86a, the general procedure of Example 82 was applied to prepare substrates of other brush types of P(S-r-MMA) underlayers. For Example 86a, a cross-linking type of P(S-r-MMA) underlayer material (AZEMBLY NLD-175) was spin-coated and baked by the same conditions as Example 82 and used as baked. The data is summarized below in Table 14.

TABLE 14

Fabrication of underlayers using AZEMBLY NLD series

| Example | Underlayer Name | PS:PMMA |
|---|---|---|
| 82 | AZEMBLY NLD-328J | 20:80 |
| 83 | AZEMBLY NLD-320 | 30:70 |
| 84 | AZEMBLY NLD-321 | 40:60 |
| 85 | AZEMBLY NLD-322 | 47:53 |
| 86 | AZEMBLY NLD-208D | 60:40 |
| 86a | AZEMBLY NLD-175 | 60:40 |
| 87 | AZEMBLY NLD-307 | 72:28 |
| 88 | AZEMBLY NLD-308 | 80:20 |
| 89 | AZEMBLY NLD-169 | 100:0 |
| 90 | AZEMBLY NLD-303 | 0:100 |

Example 91

Substrate Fabrication Using Si-Containing Antireflective Coating Material (SiARC)

The silicon-containing antireflection layer was prepared by spin coating SiArc solution (Shin Etsu SHB A-940 L35) on a silicon wafer at 1500 rpm. The resulted film was then baked at 220° C. for one minute to let the material cross-linked. Final film of SiArc was 35 nm as measured by Nanospec Reflectometer.

nitride cantilever operated in a tapping mode. Scan size and speed were set at 2 μm×2 μm (μm=micrometer or micron) area and 1 Hz respectively.

Examples C8-35

Self-Assembly of Block Copolymers of Examples C4-C8 on ULs from Examples 71-90

Following general procedure of Example C7 was used to form composite film layers of block copolymers of Examples C4-C8 on underlayer substrates of Examples 71-90. The results are summarized below in Table 15.

TABLE 15

| | | | | | Annealing Conditions | | | |
|---|---|---|---|---|---|---|---|---|
| Example | UL Example | UL | BCP Example | BCP ($M_n$) | Spin Speed (rpm) | Spin time (sec) | Temperature (° C.), and time (min) | Thin Film Morphology |
| C7 | Example 76 | — | C3 | PS-b-PTMC (6.2k-8.4k) | 2000 | 30 | 140, 5 | I/H |
| C8 | Example 72 | — | | | | | | I/H |
| C9 | Example 74 | — | | | | | | I/H |
| C10 | Example 75 | — | | | | | | I/H |
| C11 | Example 90 | NLD-303 | | | | | | I/H |
| C12 | Example 83 | NLD-320 | | | | | | I/H |
| C13 | Example 84 | NLD-321 | | | | | | I/H |
| C14 | Example 85 | NLD-322 | | | | | | I/H |
| C15 | Example 86 | NLD-208D | | | | | | I/H |
| C16 | Example 87 | NLD-307 | | | | | | I/H |
| C17 | Example 89 | NLD-169 | | | | | | I/H |
| C18 | Example 75 | — | C4 | PS-b-PTMC (6.2k-2.9k) | | | | II cylinders |
| C19 | Example 77 | — | | | | | | II cylinders |
| C20 | Example 76 | — | C5 | PS-b-PLA (10k-11.4k) | 3000 | | 170, 5 | I/H |
| C21 | Example 72 | — | | | | | | I/H |
| C22 | Example 74 | — | | | | | | I/H |
| C23 | Example 75 | — | | | | | | I/H |
| C24 | Example 90 | NLD-303 | | | | | | Flat |
| C25 | Example 83 | NLD-320 | | | | | | Flat |
| C26 | Example 84 | NLD-321 | | | | | | Flat |
| C27 | Example 85 | NLD-322 | | | | | | I/H |
| C28 | Example 86 | NLD-208D | | | | | | I/H |
| C29 | Example 87 | NLD-307 | | | | | | I/H |
| C30 | Example 89 | NLD-169 | | | | | | I/H |
| C31 | Example 86a | NLD-175 | C6 | PS-b-PMMA (22k-b-22k) | — | 30 | 250, 2 | Lam |
| C32 | Example 86a | NLD-175 | C6 | | — | 30 | 250, 2 | Lam |
| C33 | Example 86a | NLD-175 | C6 | | — | 30 | 250, 2 | Lam |
| C34 | Example 86a | NLD-175 | C6 | | — | 30 | 250, 2 | Lam |
| C35 | Example 86a | NLD-175 | C6 | | — | 30 | 250, 2 | Dots. |

II-1. Self-Assembly of Block Copolymers without Surface-Active Junction Groups [Comparative Examples]

Example C7

Self-Assembly of Block Copolymer of Example C3 on UL of Example 76

BCP of Example C3 (PS block $M_n$ 6200, PTMC block $M_n$ 8400) has a TMC volume fraction of 0.52. This block copolymer represents a lamellae forming block copolymer. A solution was prepared by dissolving the BCP in PGMEA at a concentration of 1.2 wt % based on total weight of the solution. The solution was filtered using a 0.2 micrometer PTFE filter and was spin coated at 2000 rpm rate on each of the underlayer film of Example 76. The resulting composite film layer containing the BCP film layer on the was subsequently annealed at 140° C. for 5 minutes and immediately cooled to room temperature. The BCP film was characterized by atomic force microscopy (AFM) using a Digital Instruments 3100 AFM with a 1 N/m spring constant silicon Self-assembled block copolymers of Examples C3-05 have a single, highly preferential air-polymer interface, where the PS block always wets the air interface owing to its low interfacial energy to air. Hence, the air-polymer interface is non-neutral with respect to self-assembled block copolymers (i.e., the air interface is preferential to the PS block). This results in parallel orientation relative to the wafer surface of the lamellae or cylinder domains under each of the test conditions. Thin-films (Examples C31-C35) of PS-b-PMMA without surface active junction group of Example C6 are self-assembled on neutral underlayer Example 86a. In this set of examples, Example C31 has the thinnest self-assembled film (~24 nm=1 Lo) of perpendicular oriented domains whereas Example C35 has the thickest film (~60 nm=2.5 Lo). The film thickness of these self-assembled domains was controlled by spin-coating BCP solutions at different RPM. The results indicate that the PS-b-PMMA shows perpendicularly oriented domains only on thinner films. Once the thickness is above ~2 Lo, dot-like features (undesirable) are observed.

II-2. Self-Assembly of Lamellae-forming Block Copolymers with Surface-Active Junction Groups

Example 92a

Self-Assembly of PS-b-PTMC (Example 21) with Surface-Active Junction Group on Underlayer of Example 75

A solution of BCP of Example 21, PS-b-PTMC with $CH_2C_8F_{17}$ junction group, was prepared by dissolving the BCP in PGMEA at a concentration of 1.0 wt % based on total weight of the solution. The solution was filtered using a 0.2 micrometer PTFE filter and was spin coated at 1500 rpm rate on the underlayer film of Example 75. The resulting composite film layer containing the BCP film layer on the was subsequently annealed at 140° C. for 5 minutes and immediately cooled to room temperature. The BCP film was characterized by atomic force microscopy (AFM) using a Digital Instruments 3100 AFM with a 1 N/m spring constant silicon nitride cantilever operated in a tapping mode. Scan size and speed were set at 2 μm×2 μm (μm=micrometer or micron) area and 1 Hz respectively.

Examples 92b-104e

Self-Assembly of Various Block Copolymers with Surface-Active Junction Groups on Underlayers of Examples 71-91

Solutions of block copolymers were prepared using the general procedure outlined in Example 92a. These solutions were spin coated on underlayers of Examples 71-91 and were annealed at desired temperatures and characterized by AFM to study the BCP morphology. The results are summarized below in Table 16. "I/H" means islands/holes (not desirable). "Partially ⊥ lamellae" means about 20% to less than 70% of the regions of the film contained perpendicular lamellae (not desirable). "Mostly ⊥ lamellae" means 70% to less than 95% of the regions of the film contained perpendicular lamellae. "⊥ lamellae" means 95% to 100% of the regions of the film contained perpendicular lamellae (most desirable). "Flat" means there was no discernible structure in the film.

TABLE 16

| Example | UL Example | UL | BCP Example | BCP | BCP $M_n$ | Pendant Group | BCP Conc. In PGMEA (Wt %) | Spin Speed (rpm) | Spin time (sec) | Temp (° C.), time (min) | Thin Film Morphology | BCP Pitch (nm) |
|---|---|---|---|---|---|---|---|---|---|---|---|---|
| 92a | Example 75 | — | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92b | Example 72 | — | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92c | Example 76 | — | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92d | Example 81 | N21 | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92e | Example 80 | N20 | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92f | Example 78 | N3 | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92g | Example 79 | N6 | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92h | Example 89 | NLD-169 | 21 | PS-b-PTMC | 4.7k-b-5.3k | $R_3 = CH_2C_8F_{17}$ | 1 | 1500 | 30 | 140, 5 | ⊥ lamellae | ~17.0 |
| 92i | Example 90 | NLD-303 | 21 | PS-b-PTMC | 4.7k-b-5.3k | $R_3 = CH_2C_8F_{17}$ | 1 | 1500 | 30 | 140, 5 | ⊥ lamellae | |
| 92j | Example 91 | SiARC | 21 | PS-b-PTMC | 4.7k-b-5.3k | $R_3 = CH_2C_8F_{17}$ | 1 | 1500 | 30 | 140, 5 | ⊥ lamellae | ~17.0 |
| 93a | Example 75 | — | 23 | PS-b-PTMC | 9.5k-b-11.8k | $R_3 = CH_2C_8F_{17}$ | 1 | 1500 | 30 | 170, 5 | Mostly ⊥ lamellae | ~25.6 |
| 93b | Example 72 | — | 23 | PS-b-PTMC | 9.5k-b-11.8k | $R_3 = CH_2C_8F_{17}$ | 1 | 1500 | 30 | 170, 5 | Mostly ⊥ lamellae | |
| 93c | Example 76 | — | 23 | PS-b-PTMC | 9.5k-b-11.8k | $R_3 = CH_2C_8F_{17}$ | 1 | 1500 | 30 | 170, 5 | Mostly ⊥ lamellae | |
| 94a | Example 75 | — | 18 | PS-b-PTMC | 5.2k-b-6.6k | $R_2 = C_2H_4C_6F_{13}$ | 1 | 1500 | 30 | 170, 5 | ⊥ Lamellae | |
| 94b | Example 72 | — | 18 | PS-b-PTMC | 5.2k-b-6.6k | $R_2 = C_2H_4C_6F_{13}$ | 1 | 1500 | 30 | 170, 5 | ⊥ Lamellae | |
| 94c | Example 76 | — | 18 | PS-b-PTMC | 5.2k-b-6.6k | $R_2 = C_2H_4C_6F_{13}$ | 1 | 1500 | 30 | 170, 5 | ⊥ Lamellae | |
| 94d | Example 89 | NLD-169 | 18 | PS-b-PTMC | 5.2k-b-6.6k | $R_2 = C_2H_4C_6F_{13}$ | 1 | 1500 | 30 | 170, 5 | I/H | |
| 94e | Example 91 | SiARC | 18 | PS-b-PTMC | 5.2k-b-6.6k | $R_2 = C_2H_4C_6F_{13}$ | 1 | 1500 | 30 | 170, 5 | Mostly ⊥ lamellae | |
| 95a | Example 75 | — | 16 | PS-b-PTMC | 4.8k-b-5.8k | $R_1 = CH_2C_3F_7$ | 1 | 1500 | 30 | 140, 5 | Paritally ⊥ Lamellae | |
| 95b | Example 72 | — | 16 | PS-b-PTMC | 4.8k-b-5.8k | $R_1 = CH_2C_3F_7$ | 1 | 1500 | 30 | 140, 5 | Partially ⊥ Lamellae | |
| 95c | Example 76 | — | 16 | PS-b-PTMC | 4.8k-b-5.8k | $R_1 = CH_2C_3F_7$ | 1 | 1500 | 30 | 140, 5 | Partially ⊥ Lamellae | |
| 95d | Example 89 | NLD-169 | 16 | PS-b-PTMC | 4.8k-b-5.8k | $R_1 = CH_2C_3F_7$ | 1 | 1500 | 30 | 140, 5 | Flat | |

TABLE 16-continued

| Example | UL Example | UL | BCP Example | BCP | BCP $M_n$ | Pendant Group | BCP Conc. In PGMEA (Wt %) | Spin Speed (rpm) | Spin time (sec) | Temp (° C.), time (min) | Thin Film Morphology | BCP Pitch (nm) |
|---|---|---|---|---|---|---|---|---|---|---|---|---|
| 96a | Example 75 | — | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96b | Example 13 | — | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96c | Example 72 | — | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96d | Example 76 | — | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96e | Example 89 | NLD-169 | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96f | Example 90 | NLD-303 | 26 | PS-b-PTMC | 6.9k-b-8.3k | $R_4 = CH_2CF_2(OCF_2CF_2)_3C_2F_5$ | 1 | 1500 | 30 | 140, 5 | ⊥ Lamellae | ~19.0 |
| 96g | Exanoke 91 | SiARC | 26 | PS-b-PTMC | 6.9k-b-8.3k | $R_4 = CH_2CF_2(OCF_2CF_2)_3C_2F_5$ | 1 | 1500 | 30 | 140, 5 | Mostly ⊥ lamellae | |
| 97a | Example 90 | NLD-303 | 31 | PS-b-PLA | 9.5k-b-9.6k | $R_3 = CH_2C_8F_{17}$ | 1.2 | 3000 | 30 | 190, 5 | Mostly ⊥ lamellae | |
| 97b | Example 82 | NLD-328J | 31 | PS-b-PLA | 9.5k-b-9.6k | $R_3 = CH_2C_8F_{17}$ | 1.2 | 3000 | 30 | 190, 5 | ⊥ Lamellae | ~19.0 |
| 97c | Example 83 | NLD-320 | 31 | PS-b-PLA | 9.5k-b-9.6k | $R_3 = CH_2C_8F_{17}$ | 1.2 | 3000 | 30 | 190, 5 | ⊥ Lamellae | ~19.0 |
| 98a | Example 73 | — | 37 | PS-b-PMeCAR | 4.7k-b-6.2k | $R_3 = CH_2C_8F_{17}$ | 1.2 | 2000 | 30 | 140, 5 | ⊥ Lamellae | ~12.5 |
| 98b | Example 90 | NLD-303 | 37 | PS-b-PMeCAR | 4.7k-b-6.2k | $R_3 = CH_2C_8F_{17}$ | 1.2 | 2000 | 30 | 140, 5 | ⊥ Lamellae | ~12.5 |
| 98c | Example 90 | NLD-303 | 47 | PS-b-PMeCAR | 8.5k-b-10.2k | $R_3 = CH_2C_8F_{17}$ | 1.2 | 2000 | 30 | 200, 5 | ⊥ Lamellae | ~15.7 |
| 99 | Example 85 | NLD-322 | 46 | PS-b-PLA | 8.5k-b-9.2k | $R_3 = CH_2C_8F_{17}$ | 1.2 | 2000 | 30 | 170, 5 | ⊥ Lamellae | ~15.6 |
| 100a | Example 76 | — | 27 | PS-b-PTMC | 4.2k-b-5.0k | $R_5 = C_{18}H_{37}$ | 1 | 1500 | 30 | 140, 5 | Partially ⊥ Lamellae | — |
| 100b | Example 72 | — | 27 | PS-b-PTMC | 4.2k-b-5.0k | $R_5 = C_{18}H_{37}$ | 1 | 1500 | 30 | 140, 5 | Partially ⊥ Lamellae | — |
| 100c | Example 74 | — | 27 | PS-b-PTMC | 4.2k-b-5.0k | $R_5 = C_{18}H_{37}$ | 1 | 1500 | 30 | 140, 5 | Mostly ⊥ Lamellae | — |
| 100d | Example 75 | — | 27 | PS-b-PTMC | 4.2k-b-5.0k | $R_5 = C_{18}H_{37}$ | 1 | 1500 | 30 | 140, 5 | Partially ⊥ Lamellae | — |
| 100e | Example 89 | NLD-169 | 27 | PS-b-PTMC | 4.2k-b-5.0k | $R_5 = C_{18}H_{37}$ | 1 | 1500 | 30 | 140, 5 | Dots | — |
| 100f | Example 91 | SiARC | 27 | PS-b-PTMC | 4.2k-b-5.0k | $R_5 = C_{18}H_{37}$ | 1 | 1500 | 30 | 140, 5 | Dots | — |
| 101a | Example 83 | NLD-320 | 33 | PS-b-PLA | 15.6k-b-16.6k | $R_3 = CH_2C_8F_{17}$ | 1 | 3000 | 30 | 170, 5 | ⊥ Lamellae | ~25 |
| 101b | Example 84 | NLD-321 | 33 | PS-b-PLA | 15.6k-b-16.6k | $R_3 = CH_2C_8F_{17}$ | 1 | 3000 | 30 | 170, 5 | ⊥ Lamellae | ~25 |
| 102 | Example 90 | NLD-303 | 51 | PS-b-PTMC | 9.5k-b-11.6k | $C_3H_6C_8F_{17}$ | 1 | 2000 | 30 | 170, 5 | ⊥ Lamellae | ~24.8 |
| 103 | Example 90 | NLD-303 | 52 | PS-b-PLA | 9.4k-b-10.7k | $C_3H_6C_8F_{17}$ | 1 | 2000 | 30 | 170, 5 | ⊥ Lamellae | ~20 |
| 104a | Example 86a | NLD-175 | 53 | PS-b-PMMA | 18.6k-b-22k | $C_3H_6C_8F_{17}$ | | | 30 | 250, 2 | ⊥ Lamellae | ~24.0 |
| 104b | Example 86a | NLD-175 | 53 | PS-b-PMMA | 18.6k-b-22k | $C_3H_6C_8F_{17}$ | | | 30 | 250, 2 | ⊥ Lamellae | ~24.0 |
| 104c | Example 86a | NLD-175 | 53 | PS-b-PMMA | 18.6k-b-22k | $C_3H_6C_8F_{17}$ | | | 30 | 250, 2 | ⊥ Lamellae | ~24.0 |
| 104d | Example 86a | NLD-175 | 53 | PS-b-PMMA | 18.6k-b-22k | $C_3H_6C_8F_{17}$ | | | 30 | 250, 2 | ⊥ Lamellae | ~24.0 |

Self-assembled thin-films of Examples 92a-101 b demonstrate that having a surface-active junction group enables perpendicular orientation of lamellae for high-χ block copolymers on non-preferential and preferential underlayers. Compared to the block copolymers without a surface-active junction group where there PS block is always at the BCP-air interface (parallel lamellae, undesirable), the inventive examples show perpendicular morphologies (desirable) throughout the thickness of the film. Another unexpected result of the inventive examples is that the perpendicular orientation can be achieved on both preferential and non-preferential substrates. For PS-b-PTMC lamellae BCP (Example C3), the underlayer substrate of Example 72 is a non-preferential (neutral), whereas the underlayer substrate of Example 90 is preferential (non-neutral). Examples 92a and 92i demonstrate perpendicularly orientated BCP domains of PS-b-PTMC with surface-active junction group on both these underlayer substrates, indicating an unexpected result. Similarly, thin film of Example 104e (~60 nm, 2.5 Lo) for PS-b-PMMA with surface-active junction group shows perpendicularly oriented domains throughout the entire thickness of the film. In contrast, the thin film of PS-b-PMMA without surface-active junction group of the same film thickness and underlayer composition shows dot-like features (Example C35). This indicates that JBCPs enable perpendicular orientation of much thicker films.

II-3. Self-Assembly of Cylinder-forming Block Copolymers with Surface-Active Junction Groups Examples 105a-109h Self-Assembly of Cylinder-Forming Block Copolymers with Surface-Active Junction Groups Solutions of block copolymers were prepared using the general procedure outlined in Example 92a. These solutions were spin coated on underlayers of Examples 71-91 and were annealed at desired temperatures and characterized by AFM to study the BCP morphology. The results are summarized below in Table 17. "Mostly II Cylinders" means about 20% to less than 70% of the regions of the film contained perpendicular cylinders (not desirable). "Mostly ⊥ Cylinders" means 70% to less than 95% of the regions of the film contained perpendicular cylinders. "⊥ Cylinders" means 95% to 100% of the regions of the film contained perpendicular cylinders (most desirable).

TABLE 17

| Example | UL Example | UL | BCP Example | BCP | BCP $M_n$ | Pendant Group | BCP Conc. In PGMEA (Wt %) | Spin Speed (rpm) | Spin time (sec) | Annealing Conditions Temp (° C. and time (min)) | Thin Film Morphology | BCP Pitch (nm) |
|---|---|---|---|---|---|---|---|---|---|---|---|---|
| 105a | Example 76 | — | 20 | PS-b-PTMC | 4.7k-b-2.3k | $R_3 = CH_2C_8F_{17}$ | 1 | 1500 | 30 | 140, 5 | ⊥ Cylinders | ~11.0 |
| 105b | Example 72 | — | 20 | PS-b-PTMC | 4.7k-b-2.3k | $R_3 = CH_2C_8F_{17}$ | 1 | 1500 | 30 | 140, 5 | ⊥ Cylinders | ~11.0 |
| 105c | Example 74 | — | 20 | PS-b-PTMC | 4.7k-b-2.3k | $R_3 = CH_2C_8F_{17}$ | 1 | 1500 | 30 | 140, 5 | ⊥ Cylinders | ~11.0 |
| 105d | Example 75 | — | 20 | PS-b-PTMC | 4.7k-b-2.3k | $R_3 = CH_2C_8F_{17}$ | 1 | 1500 | 30 | 140, 5 | ⊥ Cylinders | ~11.0 |
| 105e | Example 89 | NLD-169 | 20 | PS-b-PTMC | 4.7k-b-2.3k | $R_3 = CH_2C_8F_{17}$ | 1 | 1500 | 30 | 140, 5 | ⊥ Cylinders | ~11.0 |
| 105f | Example 91 | SiARC | 20 | PS-b-PTMC | 4.7k-b-2.3k | $R_3 = CH_2C_8F_{17}$ | 1 | 1500 | 30 | 140, 5 | II Cylinders | — |
| 105g | Example 72 | — | 20 | PS-b-PTMC | 4.7k-b-2.3k | $R_3 = CH_2C_8F_{17}$ | 1.5 | 2000 | 30 | 140, 5 | ⊥ Cylinders | ~11.0 |
| 105h | Example 72 | — | 20 | PS-b-PTMC | 4.7k-b-2.3k | $R_3 = CH_2C_8F_{17}$ | 1.5 | 1500 | 30 | 140, 5 | ⊥ Cylinders | ~11.0 |
| 105i | Example 72 | — | 20 | PS-b-PTMC | 4.7k-b-2.3k | $R_3 = CH_2C_8F_{17}$ | 1.5 | 1200 | 30 | 140, 5 | ⊥ Cylinders | ~11.0 |
| 106a | Example 76 | — | 19 | PS-b-PTMC | 5.2k-b-2.5k | $R_2 = C_2H_4C_6F_{13}$ | 1 | 1500 | 30 | 170, 5 | ⊥ Cylinders | ~11.0 |
| 106b | Example 72 | — | 19 | PS-b-PTMC | 5.2k-b-2.5k | $R_2 = C_2H_4C_6F_{13}$ | 1 | 1500 | 30 | 170, 5 | ⊥ Cylinders | ~11.0 |
| 106c | Example 74 | — | 19 | PS-b-PTMC | 5.2k-b-2.5k | $R_2 = C_2H_4C_6F_{13}$ | 1 | 1500 | 30 | 170, 5 | ⊥ Cylinders | ~11.0 |
| 106d | Example 75 | — | 19 | PS-b-PTMC | 5.2k-b-2.5k | $R_2 = C_2H_4C_6F_{13}$ | 1 | 1500 | 30 | 170, 5 | ⊥ Cylinders | ~11.0 |
| 106e | Example 89 | NLD-169 | 19 | PS-b-PTMC | 5.2k-b-2.5k | $R_2 = C_2H_4C_6F_{13}$ | 1 | 1500 | 30 | 170, 5 | Mostly II Cylinders | — |
| 106f | Example 91 | SiARC | 19 | PS-b-PTMC | 5.2k-b-2.5k | $R_2 = C_2H_4C_6F_{13}$ | 1 | 1500 | 30 | 140, 5 | II Cylinders | — |
| 107a | Example 76 | — | 17 | PS-b-PTMC | 4.8k-b-5.8k | $R_1 = CH_2C_3F_7$ | 1 | 1500 | 30 | 140, 5 | Mostly ⊥ Cylinders | ~11.0 |
| 107b | Example 72 | — | 17 | PS-b-PTMC | 4.8k-b-2.4k | $R_1 = CH_2C_3F_7$ | 1 | 1500 | 30 | 140, 5 | Mostly ⊥ Cylinders | ~11.0 |
| 107c | Example 74 | — | 17 | PS-b-PTMC | 4.8k-b-2.4k | $R_1 = CH_2C_3F_7$ | 1 | 1500 | 30 | 140, 5 | Mostly ⊥ Cylinders | ~11.0 |
| 107d | Example 75 | — | 17 | PS-b-PTMC | 4.8k-b-2.4k | $R_1 = CH_2C_3F_7$ | 1 | 1500 | 30 | 140, 5 | Mostly ⊥ Cylinders | ~11.0 |
| 107e | Example 89 | NLD-169 | 17 | PS-b-PTMC | 4.8k-b-2.4k | $R_1 = CH_2C_3F_7$ | 1 | 1500 | 30 | 140, 5 | II Cylinders | — |
| 107f | Example 91 | SiARC | 17 | PS-b-PTMC | 4.8k-b-2.4k | $R_1 = CH_2C_3F_7$ | 1 | 1500 | 30 | 140, 5 | II Cylinders | — |
| 108a | Example 76 | — | 25 | PS-b-PTMC | 6.9k-b-3.2k | $R_4 = CH_2CF_2(OCF_2CF_2)_3C_2F_5$ | 1 | 1500 | 30 | 140, 5 | ⊥ Cylinders | ~13.0 |
| 108b | Example 73 | — | 25 | PS-b-PTMC | 6.9k-b-3.2k | $R_4 = CH_2CF_2(OCF_2CF_2)_3C_2F_5$ | 1 | 1500 | 30 | 140, 5 | ⊥ Cylinders | ~13.0 |
| 108c | Example 89 | NLD-169 | 25 | PS-b-PTMC | 6.9k-b-3.2k | $R_4 = CH_2CF_2(OCF_2CF_2)_3C_2F_5$ | 1 | 1500 | 30 | 140, 5 | ⊥ Cylinders | ~13.0 |
| 108d | Example 90 | NLD-303 | 25 | PS-b-PTMC | 6.9k-b-3.2k | $R_4 = CH_2CF_2(OCF_2CF_2)_3C_2F_5$ | 1 | 1500 | 30 | 140, 5 | ⊥ Cylinders | ~13.0 |
| 108e | Example 91 | SiARC | 25 | PS-b-PTMC | 6.9k-b-3.2k | $R_4 = CH_2CF_2(OCF_2CF_2)_3C_2F_5$ | 1 | 1500 | 30 | 140, 5 | Mostly ⊥ Cylinders | — |
| 109a | Example 76 | — | 24 | PS-b-PTMC | 9.5k-b-4.8k | $R_3 = CH_2C_8F_{17}$ | 1 | 1500 | 30 | 140, 5 | ⊥ Cylinders | ~19.0 |
| 109b | Example 72 | — | 24 | PS-b-PTMC | 9.5k-b-4.8k | $R_3 = CH_2C_8F_{17}$ | 1 | 1500 | 30 | 140, 5 | ⊥ Cylinders | ~19.0 |
| 109c | Example 74 | — | 24 | PS-b-PTMC | 9.5k-b-4.8k | $R_3 = CH_2C_8F_{17}$ | 1 | 1500 | 30 | 140, 5 | ⊥ Cylinders | ~19.0 |
| 109d | Example 75 | — | 24 | PS-b-PTMC | 9.5k-b-4.8k | $R_3 = CH_2C_8F_{17}$ | 1 | 1500 | 30 | 140, 5 | ⊥ Cylinders | ~19.0 |
| 109e | Example 89 | NLD-169 | 24 | PS-b-PTMC | 9.5k-b-4.8k | $R_3 = CH_2C_8F_{17}$ | 1 | 1500 | 30 | 140, 5 | Mostly ⊥ Cylinders | ~19.0 |
| 109f | Example 91 | SiARC | 24 | PS-b-PTMC | 9.5kb-4.8k | $R_3 = CH_2C_8F_{17}$ | 1 | 1500 | 30 | 140, 5 | ⊥ Cylinders | ~19.0 |
| 109g | Example 74 | — | 24 | PS-b-PTMC | 9.5k-b-4.8k | $R_3 = CH_2C_8F_{17}$ | 1 | 1500 | 30 | 170, 1 | ⊥ Cylinders | ~19.0 |
| 109h | Example 74 | — | 24 | PS-b-PTMC | 9.5k-b-4.8k | $R_3 = CH_2C_8F_{17}$ | 1 | 1500 | 30 | 190, 1 | ⊥ Cylinders | ~19.0 |
| 110a | Example 76 | — | 28 | PS-b-PTMC | 4.2k-b-2.9k | $R_5 = C_{18}H_{37}$ | 1 | 1500 | 30 | 140, 5 | II Cylinders | — |
| 110b | Example 72 | — | 28 | PS-b-PTMC | 4.2k-b-2.9k | $R_5 = C_{18}H_{37}$ | 1 | 1500 | 30 | 140, 5 | II Cylinders | — |
| 110c | Example 74 | — | 28 | PS-b-PTMC | 4.2k-b-2.9k | $R_5 = C_{18}H_{37}$ | 1 | 1500 | 30 | 140, 5 | II Cylinders | — |
| 110d | Example 75 | — | 28 | PS-b-PTMC | 4.2k-b-2.9k | $R_5 = C_{18}H_{37}$ | 1 | 1500 | 30 | 140, 5 | II Cylinders | — |
| 110e | Example 89 | NLD-169 | 28 | PS-b-PTMC | 4.2k-b-2.9k | $R_5 = C_{18}H_{37}$ | 1 | 1500 | 30 | 140, 5 | II Cylinders | — |
| 110f | Example 91 | SiARC | 28 | PS-b-PTMC | 4.2k-b-2.9k | $R_5 = C_{18}H_{37}$ | 1 | 1500 | 30 | 140, 5 | II Cylinders | — |

Self-assembled thin-films of Examples 105a-109h demonstrate that having a surface-active junction group enables perpendicular orientation of cylinders for high-$\chi$ block copolymers on non-preferential and preferential underlayers. Compared to the block copolymers without a surface-active junction group where there PS block is always at the BCP-air interface (parallel cylinders, undesirable), the inventive examples show perpendicular morphologies (desirable) throughout the thickness of the film. An unexpected result of the inventive examples is that the perpendicular orientation can be achieved on both preferential and non-preferential substrates. For PS-b-PTMC cylinder BCP (Example C4), the underlayer substrate of Example 72 is a preferential (non-neutral), whereas Example 105b demonstrates perpendicularly orientated BCP domains of PS-b-PTMC with surface-active junction group on this underlayer, indicating an unexpected result.

II-4. Self-assembly of Block Copolymer Blends—Binary Blends of Two Lamellae-Forming Block Copolymers with a Surface Active Junction Group Examples 111-113

Blends of JBCPs of Examples 21 and 23

Blending of two or more JBCPs is another method to achieve perpendicular morphologies. This method also allows fine-tuning the effective pitch of the BCP formulation for self-assembly and directed self-assembly applications. 1.5 wt % solutions of Examples 21 and 23 were made by dissolving the appropriate solid JBCP in PGMEA. The resulting solutions were passed through a 0.2 μm PTFE filter. Formulations of Examples 110-113 are summarized in below in Table 18.

TABLE 18

| Example | Example 21:Example 23 Blend Ratio (w/w) | PGMEA (g) | 1.5 wt % Example 21 solution (g) | 1.5 wt % Example 23 solution (g) | Overall wt % of dry solids in Blends |
|---|---|---|---|---|---|
| 111 | 30:70 | 0.33 | 0.020 | 0.046 | 1 |
| 112 | 50:50 | 0.33 | 0.033 | 0.033 | 1 |
| 113 | 70:30 | 0.33 | 0.046 | 0.020 | 1 |

Examples 114a-116d

Self-Assembly of Thin-Films of JBCP Blends on Various Underlayers

Solutions of JBCP blends were spin-coated on various underlayers and annealed at desired temperatures to form self-assembled thin-film layers. Top-down images of the thin-films were collected by SEM and these images were used to calculate the pitch of the thin-films using FFT. Results of the thin-films are summarized below in Table 19.

TABLE 19

| Example | UL Example | UL | Blend Example | Example 21: Example 23 Blend Ratio (w/w) | Pendant Group | Blend Conc. In PGMEA (Wt %) | Spin Speed (rpm) | Spin time (sec) | Annealing Conditions Temp (° C.) and time (min) | Thin Film Morphology | Blend Pitch (nm) |
|---|---|---|---|---|---|---|---|---|---|---|---|
| 114a | Example 72 | — | 110 | 30:70 | $R_3 = CH_2C_8F_{17}$ | 1 | 1500 | 30 | 170, 5 | ⊥ Lamellae | ~25 |
| 114b | Example 74 | — | 110 | 30:70 | $R_3 = CH_2C_8F_{17}$ | 1 | 1500 | 30 | 170, 5 | ⊥ Lamellae | |
| 114c | Example 75 | — | 110 | 30:70 | $R_3 = CH_2C_8F_{17}$ | 1 | 1500 | 30 | 170, 5 | ⊥ Lamellae | |
| 115a | Example 72 | SiARC | 111 | 50:50 | $R_3 = CH_2C_8F_{17}$ | 1 | 1500 | 30 | 170, 5 | ⊥ Lamellae | ~20 |
| 115b | Example 74 | — | 111 | 50:50 | $R_3 = CH_2C_8F_{17}$ | 1.5 | 1500 | 30 | 170, 5 | ⊥ Lamellae | |
| 115c | Example 75 | — | 111 | 50:50 | $R_3 = CH_2C_8F_{17}$ | 1.5 | 1500 | 30 | 170, 5 | ⊥ Lamellae | |
| 116a | Example 72 | — | 112 | 70:30 | $R_2 = C_2H_4C_6F_{13}$ | 1 | 1500 | 30 | 170, 5 | ⊥ Lamellae | ~19.3 |
| 116b | Example 74 | — | 112 | 70:30 | $R_2 = C_2H_4C_6F_{13}$ | 1 | 1500 | 30 | 170, 5 | ⊥ Lamellae | |
| 116c | Example 75 | — | 112 | 70:30 | $R_2 = C_2H_4C_6F_{13}$ | 1 | 1500 | 30 | 170, 5 | ⊥ Lamellae | |

II-5. Self-assembly of Block Copolymer Blends—Binary Blends of a Lamellae-Forming JBCP (BCP with a Surface Active Junction Group) and a Lamellae-Forming BCP (without Surface-Active Junction Group)

Example 117

Blend of JBCP of Example 22 and Comparative Example C8

In 0.132 g of PGMEA was dissolved 0.010 g of PS-b-PTMC of Example C8 (4.2 k-5.3 k, no surface-active junction group) This solution was added to a 0.067 g of 1.5% PGMEA solution of PS-b-PTMC of Example 22 (4.2 k-b-5.7 k, with surface-active junction group, $CH_2C_8F_{17}$). This solution was filtered through a 0.45 μm pore PTFE membrane filter to obtain a 1.0% PGMEA solution of a 50/50 (w/w) blend.

Example 118a-118f

Thin-Film Self-Assembly of Example 118 on Various Underlayers

Formulation of Example 117 was spin-coated on various underlayers and annealed to form phase-separated domains. Annealed thin-films were characterized by AFM. Results are summarized below in Table 20.

TABLE 20

| Example | UL Example | UL | Formulation Example | Example 22: Example C8 Blend Ratio (w/w) | Pendant Group of Example 22 | Blend Conc. In PGMEA (Wt %) | Annealing Conditions Spin Speed (rpm) | Spin time (sec) | Temp (° C. and time (min) | Thin Film Morphology | Blend Pitch (nm) |
|---|---|---|---|---|---|---|---|---|---|---|---|
| 118a | Example 76 | — | 117 | 50:50 | $R_3 = CH_2C_8F_{17}$ | 1 | 1500 | 30 | 170, 20 | Mostly II Lamellae | — |
| 118b | Example 72 | — | 117 | 50:50 | $R_3 = CH_2C_8F_{17}$ | 1 | 1500 | 30 | 170, 20 | ⊥ Lamellae | ~15.3 |
| 118c | Example 74 | — | 117 | 50:50 | $R_3 = CH_2C_8F_{17}$ | 1 | 1500 | 30 | 170, 20 | ⊥ Lamellae | ~15.3 |
| 118d | Example 75 | — | 117 | 50:50 | $R_3 = CH_2C_8F_{17}$ | 1 | 1500 | 30 | 170, 20 | Mostly II Lamellae | — |
| 118e | Example 89 | NLD-169 | 117 | 50:50 | $R_3 = CH_2C_8F_{17}$ | 1 | 1500 | 30 | 170, 20 | Flat | — |
| 118f | Example 91 | SiARC | 117 | 50:50 | $R_3 = CH_2C_8F_{17}$ | 1 | 1500 | 30 | 170, 20 | Flat | — |

III. Directed Self-assembly of Block Copolymers with Surface-Active Junction Groups III-1. Graphoepitaxy of Block Copolymers with Surface-Active Junction Groups The guiding prepatterns for graphoepitaxy comprise both topography and underlayer. The underlayer in the prepattern that is exposed to subsequent JBCP coating is used to support vertical orientation of JBCP domains. The topography in the guiding prepattern was used to confine at least the majority of JBCP in the recessed region. Typical height of the topography is at least larger than 0.5 Lo (Lo is the pitch of the domains of JBCP). The topography was generated by a variety lithography methods and pattern transfer methods. In general, the topographical prepattern were stable under the solvent and annealing condition employed for application of the JBCPs.

Graphoepitaxy of lamellae and cylinder-forming JBCPs with a pitch of Lo were carried out by coating and annealing a layer of JBCP on such topographical prepatterns comprising underlayer and topography. Typically in graphoepitaxy, the thickness of the JBCP film on the topographical prepattern was thinner than, or equal to than the height of the topography. The majority of JBCPs were laterally confined within the recessed region by the sidewall of the topography and therefore, after annealing, the spatial arrangement of the self-assembled, vertically oriented JBCP domains was mainly directed by the topography and the sidewall surface chemistry of the topography.

Preparation of Prepatterns

Graphoepitaxy was carried out on two types of topographical prepatterns, PR7210/G1-2 prepattern and/or PR3538/SiARC prepatterns, where various JBCPs were spin-coated and baked to generate aligned domains. The samples were cleaved and cross-sectionally exposed to $CF_4+H_2$ plasma to selectively remove PTMC or PLA domains from JBCPs used. Each prepattern was prepared as follows.

PR72101UL Prepattern:

A layer of Example 72 was coated on SiNx substrate then baked at 205° C. for 3 min followed by PGMEA rinse to generate the underlayer. On top of the G1-2/SiNx stack, a 60 nm-thick film of a ArF photoresist (JSR ArF AIM7210JN-8) was prepared and exposed with 193 nm interference lithography, then developed in the negative tone with an organic developer (2-heptanone) to produce trench pre-patterns comprising resist sidewalls and the underlayer-modified bottoms. The guiding prepattern was hard-baked at 200° C. for 3 min. PR 3538/SiARC prepattern: On an organic hardmask substrate was processed SiARC (Shin-Etsu SHB-A940 L35) at a standard condition. On top of the SiARC/hardmask stack, a 50 nm-thick film of a ArF photoresist (JSR ArF AX3538) was prepared and exposed with 193 nm immersion lithography, then developed in the positive tone with a standard aqueous alkaline developer (0.26N TMAH) to produce trench prepattern comprised of resist sidewalls and the SiARC bottoms. The developed resist prepattern was hardened by UV flood exposure with a total exposure dose of 60 mJ/cm² followed by post-exposure bake at 115° C. for 60 sec and 185° C. for 120 sec.

Processing of Directed Self-Assembly

Example 119a

Example 21 in PR72101UL Prepattern

A 0.8% PGMEA solution of Example 21 was spin-coated at 4000 rpm on a coupon of the PR7210/G1-2 substrate. The coated substrate was baked at 170° C. for 5 min to generate vertically oriented lamellae aligned in parallel to the trench sidewalls. FIGS. 9a-1 and 9a-2 show the plane-view and cross-section SEM images of the sample after a perpendicular etch.

Example 119b

Example 21 in PR3538/SiARC Prepattern

A 0.8% PGMEA solution of Example 21 was spin-coated at 2000 rpm on a coupon of the PR3538/SiARC substrate. The coated substrate was baked at 170° C. for 5 min to generate vertically oriented lamellae aligned in parallel to the trench sidewalls.

Example 120

Example 31 in PR7210/G1-2 Prepattern

A 0.8% PGMEA solution of Example 31 was spin-coated at 2000 rpm on a coupon of the PR7210/G1-2 substrate. The coated substrate was baked at 170° C. for 5 min to generate vertically oriented lamellae aligned in parallel to the trench sidewalls. FIGS. 9b-1 and 9b-2 shows the plane-view and cross-section SEM images of the sample after a perpendicular etch.

Example 121

Example 20 in PR7210/G1-2 Prepattern

A 0.8% PGMEA solution of Example 20 was spin-coated at 4000 rpm on a coupon of the PR7210/G1-2 substrate. The coated substrate was baked at 170° C. for 5 min to generate vertically oriented cylinders aligned in parallel to the trench sidewalls.

Example 122

Example 24 in PR3538/SiARC Prepattern

A 0.8% PGMEA solution of Example 24 was spin-coated at 4000 rpm on a coupon of the PR3538/SiARC substrate. The coated substrate was baked at 170° C. for 5 min to generate vertically oriented cylinders aligned in parallel to the trench sidewalls. FIGS. 9c-1 and 9c-2 shows the plane-view and cross-section SEM images of the sample after a perpendicular etch.

III-2. Overcoating of Block Copolymers with Surface-active Junction Groups on Topographical Substrate The guiding prepatterns for overcoating JBCPs comprise both topography and underlayer. The underlayer in the prepattern that was exposed to subsequent JBCP coating was used to support vertical orientation of JBCP domains. The topography in the guiding prepattern was used to confine at least some of JBCP in the recessed region. Typical height of the topography was at least larger than 0.7 Lo (Lo is the pitch of JBCP). The pitch of the guiding prepattern was n Lo (commensurate with the pitch of JBCP). Typical BCP coating thickness was significantly larger than the height of the topographical features on the guiding prepattern. In general, the topographical prepattern were stable under the solvent and annealing condition of JBCPs.

Preparation of Prepatterns

Topographical guiding prepattern for overcoating of JBCP was made by $O_2$ plasma treatment of the photoresist/ underlayer/SiARC pattern. A 60 nm-thick film of ArF photoresist (JSR ArF AIM7946JN-8) was coated on top of the underlayer (AZ Electronic materials AZEMBLY™ NLD-089)/SiARC A940 stack, patternwise exposed and then developed in the negative tone with an organic developer (2-heptanone) to produce resist trench pattern. Subsequently, the prepattern was treated by $O_2$ plasma for 15 sec to remove the NLD-089 layer that was not covered by the patterned resist and to oxidize the SiARC surface, which was followed by 200° C. bake for 3 min to harden the remaining trench walls comprising the resist and NLD-089 underneath. FIG. 10a shows the prepattern described above.

Processing of Directed Self-assembly

Directed self-assembly of lamellae-forming and cylinder-forming block copolymers with a pitch of Lo were carried out by coating and annealing a layer of BCP over the topographical prepatterns comprising the oxidized resist lines and oxidized SiARC substrate surface as shown in FIG. 10a. The height of the oxidized resist line is ~15 nm and the pitch of the organic line is 84 nm (~5 Lo). Typically, for overcoating, the thickness of the BCP film on the topographical prepattern was thicker than the height of the topography. Majority of JBCPs were coated over SiARC and topographical guiding lines and, after annealing, the spatial arrangement of the self-assembled, vertically-oriented BCP domains were directed by the topography and surface chemistry of the etched resist and underlayer. After coating and annealing thick BCP over the plasma treated organic line/ SiARC substrate, the overcoated samples were cleaved and cross-sectionally exposed to a $CF_4+H_2$ plasma to partially remove the PTMC domains or PLA domains from each BCP.

Example 123

Example 22 Over $O_2$-Plasma Treated Organic Lines/SiARC Prepattern

A 1% PGMEA solution of Example 22 was spin-coated at 800 rpm on a coupon of $O_2$-plasma treated organic lines/ SiARC prepattern. The coated substrate was baked at 170° C. for 10 min in the ambient atmosphere to form vertically-oriented lamellae aligned to the underlying organic lines. FIGS. 10b-1 and 10b-2 show the plane-view and cross-section SEM images of the sample after a perpendicular etch.

Example 124

Example 31 Over $O_2$-Plasma Treated Organic Lines/SiARC Prepattern

A 1% PGMEA solution of Example 31 was spin-coated at 800 rpm on a coupon of $O_2$-plasma treated organic lines/ SiARC prepattern. The coated substrate was baked at 170° C. for 10 min in the ambient atmosphere to form vertically-oriented lamellae aligned to the underlying organic lines. FIGS. 10c-1 and 10c-2 show the plane-view and cross-section SEM images of the sample after a perpendicular etch.

Example 125

Example 24 Over $O_2$-Plasma Treated Organic Lines/SiARC Prepattern

A 1% PGMEA solution of Example 24 was spin-coated at 1500 rpm on a coupon of $O_2$-plasma treated organic lines/ SiARC prepattern. The coated substrate was baked at 170° C. for 5 min in the ambient atmosphere to form vertically-oriented cylinder arrays where the close-packed rows align to the underlying organic lines. FIG. 10d shows the plane-view SEM image of the sample.

III-3. Chemoepitaxy of Block Copolymers with Surface-active Junction Groups on Chemical Prepatterns Chemoepitaxy requires a chemical prepattern to guide the self-assembly of JBCP. The chemical prepattern consists of two regions of different surface chemistry: "wetting and neutral". The wetting region is selectively wetted by one domain and the neutral region supports vertical orientation of both domains. The pitch of the chemical prepattern is defined by the distance of the one wetting region to the nearest wetting region and is an integer number times the pitch of the repeating distance of block copolymers. Both wetting region and neutral region are made from materials that compatible to solvent and process conditions of the DSA processes. For a JBCP with a pitch of Lo, the pitch of the chemical prepattern is nLo. The topography of the chemical epitaxy prepattern is minimized: the height difference between the neutral region and wetting region is less than 0.5 Lo. Typical thickness of JBCP coating is significantly larger than the height difference (topography) of the chemical prepattern. Films of JBCP are coated over the chemical prepattern and one of the JBCP domain preferentially wets the wetting region and creates a lateral ordering of JBCP domains.

Preparation of Prepatterns

Chemoepitaxy was carried out on two types of topographical prepatterns, HSQ/SMMA and/or xPS/SMMA prepatterns, where various JBCPs were spin-coated and baked to generate aligned domains. Each chemical prepattern was prepared as follows.

HSQ/SMMA Chemical Prepattern:

A solution of SMMA underlayer, NLD-208D (AZ Electronic materials AZEMBLY™ NLD-208D), was coated on top of silicon nitride and baked, followed by a PGMEA rinse to form a brush layer over silicon nitride. HSQ (diluted Dow Corning XR-1541 E-beam resist in methylisobutylketone) was coated and baked at 130° C./2 min to form a thin HSQ layer over SMMA brush. The HSQ pattern was written by electron beam lithography using Leica-Vistec VB6 and developed by 0.26N TMAH. These HSQ features serves as the wetting region and the exposed SMMA brush layer serves as the neutral region. The typical height of HSQ features after development is between 3 nm-7 nm which is less than 0.5 Lo of JBCP in the experiments and the pitches of HSQ features are around 2 Lo, 3 Lo and 4 Lo, commensurable to the pitch of JBCP. xPS/SMMA chemical prepattern (A): A fully cross-linkable polystyrene (xPS) solution (AZ Electronic Materials, AZEMBLY™ NLD-128) was spin coated on top of a SiN/amorphous carbon ($\alpha$-C) stack and baked at 315° C./5 min under a $N_2$ environment. An ArF immersion resist was then coated on the xPS/SiN/$\alpha$-C stack, exposed with a 193 scanner and developed with a standard developer, generating grating patterns with 84 nm pitch. The patterned resist on the xPS/SiN/$\alpha$-C stack was then etched by RIE to remove the xPS layer that was not covered by the resist. The remaining resist was subsequently removed by 0.26N TMAH. As a result, 8 nm-thick xPS gratings with 84 nm pitch were generated on top of the SiN/$\alpha$-C stack. On the pattern of the xPS gratings, a PMMA brush material (AZ Electronic Materials, AZEMBLY™ NLD-303) was coated and baked at 250° C./2 min followed by a PGMEA rinse, resulting in formation of alternate stripes of xPS and the brush material. The brush in this case selectively grafted on the open SiN surface so it did not interfere with the top and sidewall surfaces of the xPS gratings. In this prepattern, the xPS features serve as the wetting region and the exposed SMMA brush layer serves as the neutral region. The typical height of xPS/SMMA features is between 3 nm-5 nm which is less than 0.5 Lo of JBCP in the experiments and the pitch of xPS features is around 5 Lo, commensurable to the pitches of JBCPs. xPSISMMA chemical prepattern (B): A fully cross-linkable polystyrene (xPS) solution (AZ Electronic Materials, AZEMBLY™ NLD-128) was spin coated on top of a SiN/amorphous carbon ($\alpha$-C) stack and baked at 315° C./5 min under a $N_2$ environment. An ArF immersion resist was then coated on the xPS/SiN/$\alpha$-C stack, exposed with a 193 scanner and developed with a standard developer, generating grating patterns with 84 nm pitch. The patterned resist on the xPS/SiN/$\alpha$-C stack was then etched by RIE to remove the xPS layer that was not covered by the resist. The remaining resist was subsequently removed by 0.26N TMAH. As a result, 8 nm-thick xPS gratings with 118-120 nm pitch were generated on top of the SiN/$\alpha$-C stack. On the pattern of the xPS gratings, a SMMA brush material (AZ Electronic Materials, AZEMBLY™ NLD-127) was coated and baked at 250° C./2 min followed by a PGMEA rinse, resulting in formation of alternate stripes of xPS and the brush material. The brush in this case selectively grafted on the open SiN surface so it did not interfere with the top and sidewall surfaces of the xPS gratings. In this prepattern, the xPS features serve as the wetting region and the exposed SMMA brush layer serves as the neutral region. The typical height of xPS/SMMA features is less than 0.5 Lo of JBCP in the experiments and the pitch of xPS features is around 5 Lo, commensurable to the pitches of BCPs. xPSISMMA chemical prepattern (C): On a clean Si wafer crosslinkable polystyrene (xPS) solution (AZEMBLY™ NLD-128) spin-coated at 1500 rpm and baked at 315° C./5 min under a $N_2$ environment to yield a 8 nm thick xPS film. On top of the xPS surface, JSR EUV photoresist (VEUVJ2107JE) was then coated at 1500 rpm to form a 40 nm thick resist film. The resist film was exposed with an EUV lithography tool (SEMATECH Berkeley MET) and the exposed regions were developed with 0.26N TMAH to generate a grating prepattern with a pitch of 44 nm. The prepattern was then etched with O2 RIE to remove the xPS layer that was not covered by the resist gratings. The remaining resist was removed by immersing the etched prepattern to a standard TMAH solution, generating gratings of xPS. A solution of SMMA brush material (AZ Electronic Materials, AZEMBLY™ NLD-127) was subsequently coated at 1500 rpm on the prepattern and baked at 250° C. for 2 min, followed by a PGMEA rinse, resulting in formation of alternate stripes of xPS and the brush material. The brush in this case selectively grafted on the open SiN surface so it did not interfere with the top and sidewall surfaces of the xPS gratings. In this prepattern, the xPS features serve as the wetting region and the exposed SMMA brush layer serves as the neutral region. The typical height of xPS/SMMA features is between 2 nm-3 nm which is less than 0.5 Lo of JBCP in the experiments and the pitch of xPS features is around 3 Lo, commensurable to the pitch of JBCP.

Processing of Directed Self-Assembly

Example 126a

Example 21 Over HSQ/SMMA Chemical Prepattern (for 5× Frequency Multiplication)

A 1 wt % PGMEA solution of Example 21 is coated at 1500 rpm over the HSQ/SMMA chemical prepattern and annealed at 170° C. for 10 min to generate aligned PS and PTMC domains. DSA of lamellae-forming JBCPs with a pitch of Lo were carried out by coating and annealing a layer of JBCP over the chemical prepatterns comprising HSQ lines over SMMA brush layer. Typical thickness of the JBCP layer is around 1 Lo to 1.5 Lo. The PTMC domains of JBCP wets the HSQ lines and forms laterally aligned lamellae pattern over the chemical prepattern. FIG. 11a is the SEM plane view of aligned PS and PTMC domains from Example 21 to the HSQ lines from the HSQ/SMMA prepattern with a pitch of ~85 nm (~5 Lo) for 5× frequency multiplication.

Example 126b

Example 21 Over HSQ/SMMA Chemical Prepattern (for 6× Frequency Multiplication)

Along the same process conditions as Example 126a, a 1 wt % PGMEA solution of Example 21 was coated over the HSQ/SMMA chemical prepattern and annealed. FIG. 11b is the SEM plane view of aligned PS and PTMC domains from Example 21 to the HSQ lines from the HSQ/SMMA prepattern with a pitch of ~100 nm (~6 Lo) for 6× frequency multiplication.

Example 127a

Example 31 Over xPS/PMMA Chemical Prepattern (for 3× Frequency Multiplication)

A 1 wt % PGMEA solution of Example 31 was coated at 2000 rpm over the xPS/PMMA chemical prepattern (C) and annealed at 190° C. for 5 min followed by PGMEA rinse and recoating of the solution at 3000 rpm. The film was then annealed at 190° C. for 5 min to generate aligned PS and PLA domains. FIG. 11c is the SEM plane view of aligned PS and PLA domains from Example 31 to the xPS lines from the xPS/PMMA prepattern with a pitch of ~52 nm (~3 Lo) for 3× frequency multiplication.

Example 127b

Example 31 Over xPS/PMMA Chemical Prepattern (for 5× Frequency Multiplication)

Along the same process conditions as Example 127a, a 1 wt % PGMEA solution of Example 31 was coated at 2000 rpm over the xPS/PMMA chemical prepattern (A), annealed at 190° C. for 5 min followed by PGMEA rinse followed by recoating of the solution. The film was then annealed again at 190° C. for 5 min to generate aligned PS and PLA domains. FIG. 11d is the SEM plane view of aligned PS and PLA domains from Example 31 to the xPS lines from the xPS/PMMA prepattern with a pitch of ~85 nm (~5 Lo) for 5× frequency multiplication.

Example 128

Example 46 Over xPS/SMMA Chemical Prepattern

A 1.2% w/w filtered solution of Example 46 was coated over the xPS/SMMA chemical prepattern (C) at 3000 rpm and the sample was baked at 200° C. for 5 min and cooled down to room temperature. Figure 11e showed that PS-b-PLA formed vertically oriented lamellae that aligned parallel to the prepattern direction, creating a pitch multiplication of 3×.

Example 129

Example 47 Over xPS/SMMA Chemical Prepattern

A 1.2% w/w solution of Example 47 was coated over the xPS/SMMA chemical prepattern (C) at 3000 rpm and the sample was baked at 200° C. for 5 min. FIG. 11f showed that the PS-b-PMeCAR formed vertically oriented lamellae that aligned parallel to the prepattern direction, creating a pitch multiplication of 3×.

Example 130a

Example 53 Over xPS/SMMA Chemical Prepattern

A 1% w/w PGMEA solution of Example 53 was coated over the xPS/SMMA chemical prepattern (B) at 3000 rpm and baked at 250° C. for 5 min under $N_2$. After PMMA removal and pattern transfer into substrate by dry etching, LER/LWR/SWR was measured by SEM.

Example 130b

Example C6 Over xPSISMMA Chemical Prepattern

By the same process conditions, A thin film of Example C6 was prepared over the xPS/SMMA chemical prepattern (B) and treated by the same dry etch technique for the measurement of LER/LWR/SWR. The performance of directed self-assembly of Example 53 and Example C6 were summarized in Table 21.

TABLE 21

Comparison of LER/LWR/SWR between Example C6 and Example 53

| Measurement mode | Example C6 | | Example 53 | |
|---|---|---|---|---|
| | Normal | Compressive | Normal | Compressive |
| LER L & R | L: 3.22 nm R: 3.22 nm | L: 3.87 nm R: 3.84 nm | L: 2.67 nm R: 2.64 nm | L: 2.9 nm R: 2.98 nm |
| LWR | 2.55 nm | 2.18 nm | 2.0 nm | 1.82 nm |
| SWR | 2.79 nm | 2.40 nm | 2.38 nm | 2.24 nm |

Materials used to prepare the prepatterns tested are summarized below in Table 22.

TABLE 22

Materials used for prepatterns

| Materials | Use | Details. |
|---|---|---|
| G1-2 | Underlayer for DSA | Example 57 |
| PR 3538 | Guiding topography | JSR ArF resist |
| PR 7210 | Guiding topography | JSR ArF esist |
| PR 7946 | Guiding topography | JSR ArF sist |
| HSQ | Chemical prepattern | Dow Corning XR-1541 resist |
| SiARC | Substrate for graphoepitaxy | Shin-Etsu SHB-A940 L35 |
| NLD Series, N3 | Underlayer for DSA | Underlayers of Examples 82-90 and Examples 67-70 |
| NLD-128 | x-linkable polystyrene for DSA | Random copolymer of styrene and VBCB |

Block copolymers tested for directed self-assembly are summarized below in Table 23.

TABLE 23

Block Copolymers used for Directed Self-Assembly

| BCP | | Morphology | Pitch |
|---|---|---|---|
| Example 21 | PS-$CH_2C_8F_{17}$-PTMC | Lamellae | 17 nm |
| Example 22 | PS-$CH_2C_8F_{17}$-PTMC | Lamellae | 15.5 nm |
| Example 20 | PS-$CH_2C_8F_{17}$-PTMC | Cylinders | 9.5 nm |
| Example 24 | PS-$CH_2C_8F_{17}$-PTMC | Cylinders | 16 nm |
| Example 31 | PS-$CH_2C_8F_{17}$-PLA | Lamellae | 17.5 nm |
| Example 46 | PS-$CH_2C_8F_{17}$-PLA | Lamellae | 15.7 nm |
| Example 31 | PS-$CH_2C_8F_{17}$-PLA | Lamellae | 17 nm |
| Example 47 | PS-$CH_2C_8F_{17}$-PMeCAR | Lamellae | 15.6 nm |
| Example 53 | PS-DPE-$CH_2C_8F_{17}$-PMMA | Lamellae | 24 nm |
| Example C6 | PS-DPE-PMMA | Lamellae | 24 nm |

The invention claimed is:

1. A block copolymer with a junction group having structure (1),

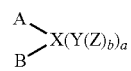

(1)

wherein,

A is a block polymer chain,

B is a block polymer chain, wherein A and B are chemically different covalently connected polymer chains which are phase separable;

moiety $X(Y(Z)_b)_a$ is a junction group which comprises a surface active pendant moiety $Y(Z)_b$, wherein:

a is an integer from 1 to 4, b is an integer from 1 to 5;

X is a linking group between the A polymer block, the B polymer block and the moiety Y, wherein X is selected from the group consisting of a $C_5$-$C_{30}$oxyalkyleneoxycarbonylalkylene moiety, a $C_2$-$C_{30}$ alkyleneoxyalkylene moiety, an aryl substituted $C_8$-$C_{42}$ alkyleneoxy moiety, an aryl substituted $C_8$-$C_{42}$alkyleneoxyalkylene moiety, a $C_8$-$C_{42}$ aryl substituted alkylene moiety, or a $C_7$-$C_{30}$alkylenearylene moiety;

Y is a linking group or a direct valence bond between X and Z, and Y is selected from the group consisting of a direct valence bond, oxy (—O—), carbonyl (—C(=O)—), carbonyloxy (—C(=O)—O—), oxycarbonyl (—O—C(=O)—), carbonate (—O—C(=O)—O—), carbonyloxyakylene (—C(=O)—O—akylene-), a $C_1$-$C_{20}$ carbonyloxyfluoroakylene (—C(=O)—O—fluoroakylene-), alkylene-fluoroalkylene, a $C_6$-$C_{20}$ arylene, a $C_6$-$C_{20}$oxyarylene, a $C_7$-$C_{20}$ alkylenearylene, a $C_1$-$C_{20}$ linear alkylene, a $C_3$-$C_{20}$ branched alkylene, a $C_6$-$C_{20}$ cyclic alkylene, a $C_1$-$C_{20}$ linear fluoroalkylene, a $C_3$-$C_{20}$branched fluoroalkylene, and a $C_6$-$C_{20}$ cyclic fluoroalkylene; and Z is a moiety independently selected from the group consisting of a fluorine group, a linear hydrocarbon group containing fluorine, a fluorine containing branched hydrocarbon group, a fluorine containing cyclic hydrocarbon group, a fluorine containing linear alkyl ether group, a fluorine containing branched alkyl ether group, a fluorine containing cyclic alkyl ether group and a mixture thereof, and further wherein the junction group $X(Y(Z)_b)_a$ has a surface energy less than that of block A and less than that of the block B.

2. The block copolymer of claim 1 wherein,
(i) the polymer chain of block A comprises units derived from ethylenically unsaturated polymerizable monomers, or units derived from ring-opening polymerization (ROP) of cyclic monomers, and
(ii) the polymer chain in block B comprises units derived from ethylenically unsaturated polymerizable monomers, or units derived from ring-opening polymerization (ROP) of cyclic monomers, and further wherein polymeric block A and B are chemically different and are phase separable.

3. The block copolymer of claim 1 wherein Z, the fluorocarbon containing moiety, is a fluorine containing hydrocarbon group which is chosen from a linear $C_1$-$C_{10}$ fluoroalkyl groups, a $C_3$-$C_{10}$ branched fluoroalkyl groups, a $C_4$-$C_{10}$ cyclic fluoroalkyl groups, a alkylenefluoroalkyl groups (—$(CH_2)_q(CF_2)_r$—$CF_3$), CFH containing alkylene-fluoroalkyl groups —$(CH_2)_q(CHF)_{q2}(CF_2)_r$—$CF_3$), alkylenefluoroether-fluoroalkyl groups —$(CH_2)_q$(—$CF_2$—$O$—)$_s$(—$CF_2CF_2$—$O$—)$_t$($CF_2)_u CF_3$, —CHF containing alkylenefluoroether-fluoroalkyl groups (—$CH_2$—)$_q$(CHF)$_{q2}$(—$CF_2$—$O$—)$_s$(—$CF_2CF_2$—$O$—)$_t$($CF_2)_u CF_3$, or a moiety having structure (2)

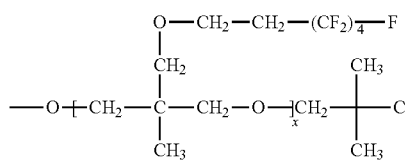

(2)

wherein q is an integer from 0 to 10, q2 is an integer from 1 to 10, r is an integer from 1 to 10, s is an integer from 0-10, t is an integer from 1 to 10, u is an integer between 0 and 10, x is 1 to 5, y is 1 to 5, P is hydrogen, a $C_1$ to $C_4$ alkyl, or a —$CH_2$—$CH_2$—$(CF_2)_4$F moiety.

4. The block copolymer of claim 1 wherein the surface active pendant moiety —$Y(Z)_b$ is chosen from the group consisting of: —C(=O)—O—(—$CH_2$—)$_q$(—$CF_2$—)$_r$—$CF_3$, —C(=O)—O—(—$CH_2$—)$_q$(—$CF_2$—O—)$_s$(—$CF_2CF_2$—O)$_t$($CF_2)_u CF_3$, a moiety having structure (3)

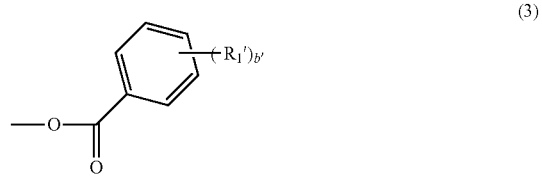

(3)

and a moiety having structure (4)

(4)

wherein —$R_{1'}$ and —$R_{1''}$ are independently selected from —(—$CH_2$—)$_q$(—$CF_2$—)$_r$—$CF_3$, —O—(—$CH_2$—)$_q$(—$CF_2$—)$_r$—$CF_3$, —C(=O)—(—$CH_2$—)$_q$(—$CF_2$—)$_r$—$CF_3$, —O—C(=O)—(—$CH_2$—)$_q$(—$CF_2$—)$_r$—$CF_3$, —(—$CH_2$—)$_q$(—$CF_2$—O—)$_s$(—$CF_2CF_2$—O)$_t$($CF_2)_u CF_3$, —O—(—$CH_2$—)$_q$(—$CF_2$—O)$_s$(—$CF_2CF_2$-O)$_t$($CF_2)_u CF_3$, —O—C(=O)—O—(—$CH_2$—)$_q$(—$CF_2$—O—)$_s$(—$CF_2CF_2$—O)$_t$($CF_2)_u$ $CF_3$ and —C(=O)—O—(—$CH_2$—)$_q$(—$CF_2$—O—)$_s$(—$CF_2CF_2$—O)$_t$($CF_2)_u CF_3$ and further wherein b' and b"are integers from 1 to 5, q is an integer from 0 to 10, r is an integer from 1 to 10, s is an integer from 0 to 10, t is an integer from 1 to 10, u is an integer between 0and 10.

5. The block copolymer of claim 1 wherein the block copolymer with a junction group has structure (12),

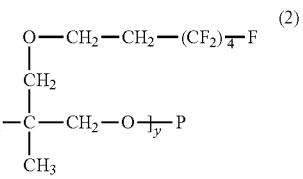

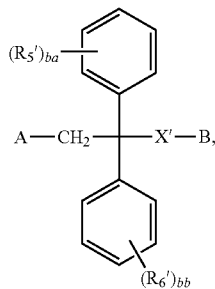

(12)

wherein X' is a direct valence bond or a moiety (13)

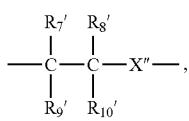

(13)

where $R_{5'}$ is '—$(-CH_2-)_q(-CF_2-)_r$—$CF_3$, —O—(—$CH_2-)_q(-CF_2-)_r CF_3$, —C(=O)—(—$CH_2-)_q(-CF_2-)_r$—$CF_3$, —O—C(=O)—(—$CH_2-)_q(-CF_2-)_r$—$CF_3$, —(—$CH_2)_q(-CF_2-O-)_s(-CF_2CF_2-O)_t(CF_2)_u CF_3$, —O—(—$CH_2)_q(-CF_2-O-)_s(-CF_2CF_2-O)_t(CF_2)_u CF_3$, —O—C(=O)—O—(—$CH_2-)_q(-CF_2-O-)_s(-CF_2CF_2-O)_t(CF_2)_u CF_3$ or —C(=O)—O—(—$CH_2-)_q(-CF_2-O-)_s(-CF_2CF_2-O)_t(CF_2)_u CF_3$, and $R_{6'}$ is —(—$CH_2-)_q(-CF_2-)_r$—$CF_3$, —O—(—$CH_2-)_q(-CF_2-)_r$—$CF_3$, —C(=O)—(—$CH_2-)_q(-CF_2-)_r$—$CF_3$, —O—C(=O)—(—$CH_2-)_q(-CF_2-)_r$—$CF_3$, —(—$CH_2-)_q(-CF_2-O-)_s(-CF_2CF_2-O)_t(CF_2)_u CF_3$, —O—(—$CH_2-)_q(-CF_2-O-)_s(-CF_2CF_2-O)_t(CF_2)_u CF_3$, —O—C(=O)—O—(—$CH_2-)_q(-CF_2-O-)_s(-CF_2CF_2-O)_t(CF_2)_u CF_3$, —C(=O)—O—(—$CH_2-)_q(-CF_2-O-)_s(-CF_2CF_2-O)_t(CF_2)_u CF_3$ or hydrogen, $R_{7'}$ and $R_{9'}$ are independently hydrogen, and a $C_1$-$C_4$ alkyl, $R_{8'}$ and $R_{10'}$ are independently selected from hydrogen, a $C_1$-$C_4$ alkyl, or a $C_2$-$C_6$ alkyleneoxyalkyl moiety, X" is —O— or —S—, and wherein ba and bb are integers from 1 to 5, q is an integer from 0 to 10, r is an integer from 1 to 10, s is an integer from 0 to 10, t is an integer from 1 to 10, u is an integer between 0 and 10, and b' and b" are independently integers from 1 to 5 and further wherein block A is derived vinyl aryl, and block B is derived from a lactone, lactam, epoxide or cyclic carbonate or when X' is a direct valence bond an ethylenically unsaturated monomer, and further wherein block A and B are phase separable.

6. The block copolymer of claim 1 wherein the block copolymer has structure (20)

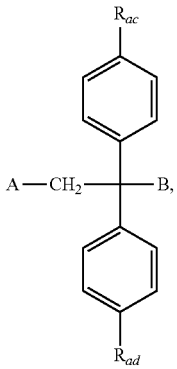

(14)

where $R_{ac'}$ is '—O—(—$CH_2-)_q(-CF_2-)_r$—$CF_3$, and $R_{ad}$ is '—(—$CH_2-)_q(-CF_2-)_r$—$CF_3$, or hydrogen, and further wherein q is an integer from 0 to 10, and r is an integer from 1 to 10 and further wherein block A is derived from a vinyl aryl, and block B is derived from a lactone, lactam, epoxide, cyclic carbonate or ethylenically unsaturated monomer and further wherein block A and B are phase separable.

7. The block copolymer of claim 1 wherein the block copolymer with a junction group has structure (20),

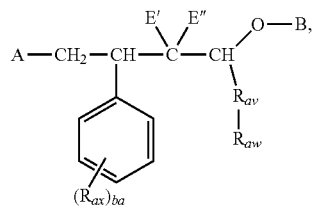

wherein E' and E" are independently selected from hydrogen or methyl, $R_{ax}$ is hydrogen, a $C_1$-$C_3$ alkyl group, a $C_3$-$C_{20}$ trialkylsilyl group, a $C_3$-$C_{20}$ trialkylgermanium group, a $C_3$-$C_{20}$ trialkyltin group, a $C_3$-$C_{20}$ trialkyltitanium group, a $C_2$-$C_{20}$ alkylcarbonyl, a $C_2$-$C_{20}$ alkylcarbonyloxy, a $C_1$-$C_{20}$ alkoxy or a $C_9$-$C_{36}$ tris(trialkylsilyl)silyl group, $R_{av}$ is a $C_1$-$C_4$ alkylene spacer moiety and $R_{aw}$ is '—(—$CH_2-)_q(-CF_2-)_r$—$CF_3$, —O—(—$CH_2-)_q(-CF_2-)_r$—$CF_3$, —C(=O)—(—$CH_2-)_q(-CF_2-)_r$—$CF_3$, —O—C(=O)—(—$CH_2-)_q(-CF_2-)_r$—$CF_3$, —(—$CH_2-)_q(-CF_2-O-)_s(-CF_2CF_2-O)_t(CF_2)_u CF_3$, —O—(—$CH_2-)_q(-CF_2-O-)_s(-CF_2CF_2-O)_t(CF_2)_u CF_3$, —O—C(=O)—O—(—$CH_2-)_q(-CF_2-O-)_s(-CF_2CF_2-O)_t(CF_2)_u CF_3$ or —C(=O)—O—(—$CH_2-)_q(-CF_2-O-)_s(-CF_2CF_2-O)_t(CF_2)_u CF_3$ and further wherein q is an integer from 0 to 10, r is an integer from 1 to 10, s is an integer from 0 to 10, t is an integer from 1 to 10, u is an integer between 0 and 10 and ba is an integer from 1 to 5 and further where block A is derived from a vinyl aryl and block B is derived from a lactone, lactam, epoxide or cyclic carbonate and further wherein block A and B are phase separable.

8. The block copolymer of claim 1 wherein the block copolymer mixture of block polymers having structure (21a) and (21b)

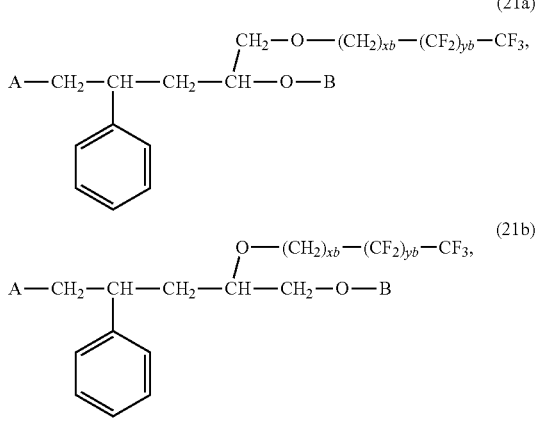

wherein xb is an integer from 1 to 6 and yb is an integer from 4 to 20 and further where block A is derived from a vinyl aryl, and block B is derived from a lactone, lactam, epoxide or cyclic carbonate and further wherein block A and B are chemically distinct and are phase separable.

9. The block copolymer of claim 1 wherein the junction moiety $X(Y(Z)_b)_a$ has a surface energy less than about 30 mN m$^{-1}$.

10. A composition comprising the block copolymer of claim 1 and a solvent.

11. The composition of claim 10 further comprising another block copolymer.

12. The composition of claim 10 further comprising a homopolymer.

* * * * *